(12) United States Patent
Nguyen et al.

(10) Patent No.: US 9,449,794 B2
(45) Date of Patent: Sep. 20, 2016

(54) SYMMETRICAL INDUCTIVELY COUPLED PLASMA SOURCE WITH SIDE RF FEEDS AND SPIRAL COIL ANTENNA

(71) Applicant: APPLIED MATERIALS, INC., Santa Clara, CA (US)

(72) Inventors: Andrew Nguyen, San Jose, CA (US); Kartik Ramaswamy, San Jose, CA (US); Jason A. Kenney, Sunnyvale, CA (US); Shahid Rauf, Pleasanton, CA (US); Kenneth S. Collins, San Jose, CA (US); Yang Yang, Sunnyvale, CA (US); Steven Lane, Porterville, CA (US); Yogananda Sarode Vishwanath, Karnataka (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 151 days.

(21) Appl. No.: 14/270,578

(22) Filed: May 6, 2014

(65) Prior Publication Data

US 2014/0232263 A1    Aug. 21, 2014

Related U.S. Application Data

(63) Continuation-in-part of application No. 13/966,614, filed on Aug. 14, 2013, now Pat. No. 9,082,590, which is a continuation-in-part of application No. 13/897,592, filed on May 20, 2013, which is a
(Continued)

(51) Int. Cl.
*H01J 7/24* (2006.01)
*H01J 37/32* (2006.01)
*C23C 16/455* (2006.01)
*C23C 16/509* (2006.01)
*H05H 1/46* (2006.01)

(52) U.S. Cl.
CPC ...... *H01J 37/3211* (2013.01); *C23C 16/45563* (2013.01); *C23C 16/509* (2013.01); *H01J 37/32174* (2013.01); *H05H 1/46* (2013.01); *H05H 2001/4667* (2013.01)

(58) Field of Classification Search
USPC .................................. 315/111.01–111.91
See application file for complete search history.

(56) References Cited

U.S. PATENT DOCUMENTS

| | | |
|---|---|---|
| 5,571,366 A | 11/1996 | Ishii et al. |
| 5,620,523 A | 4/1997 | Maeda et al. |
| 5,897,713 A | 4/1999 | Tomioka et al. |

(Continued)

FOREIGN PATENT DOCUMENTS

| | | |
|---|---|---|
| JP | 2004-200429 A | 7/2004 |
| KR | 10-2004-0102330 A | 12/2004 |

(Continued)

OTHER PUBLICATIONS

U.S. Appl. No. 14/294,431, filed Jun. 3, 2014, Kenney et al.
(Continued)

*Primary Examiner* — Brandon S Cole
(74) *Attorney, Agent, or Firm* — Robert M. Wallace

(57) ABSTRACT

A plasma reactor has an overhead multiple coil antennas including a parallel spiral coil antenna and symmetric and radial RF feeds and cylindrical RF shielding around the symmetric and radial RF feeds. The radial RF feeds are symmetrically fed to the plasma source.

15 Claims, 42 Drawing Sheets

Related U.S. Application Data continuation-in-part of application No. 13/666,224, filed on Nov. 1, 2012, said application No. 13/966,614 is a continuation-in-part of application No. 13/897,585, filed on May 20, 2013, which is a continuation-in-part of application No. 13/666,224.

(60) Provisional application No. 61/673,937, filed on Jul. 20, 2012.

(56) References Cited

U.S. PATENT DOCUMENTS

| | | |
|---|---|---|
| 5,948,704 A | 9/1999 | Benjamin et al. |
| 6,024,826 A | 2/2000 | Collins et al. |
| 6,051,073 A | 4/2000 | Chu et al. |
| 6,083,344 A | 7/2000 | Hanawa et al. |
| 6,089,182 A | 7/2000 | Hama |
| 6,200,412 B1 | 3/2001 | Kilgore et al. |
| 6,326,597 B1 | 12/2001 | Lubomirsky et al. |
| 6,367,410 B1 | 4/2002 | Leahey et al. |
| 6,414,648 B1 * | 7/2002 | Holland ............... H01J 37/321 118/723 I |
| 6,450,117 B1 | 9/2002 | Murugesh et al. |
| 6,451,161 B1 | 9/2002 | Jeng et al. |
| 6,518,190 B1 | 2/2003 | Lill et al. |
| 6,527,911 B1 | 3/2003 | Yen et al. |
| 6,899,787 B2 | 5/2005 | Nakano et al. |
| 8,858,754 B2 | 10/2014 | Horiguchi et al. |
| 8,933,628 B2 | 1/2015 | Banna et al. |
| 2001/0019048 A1 | 9/2001 | Ose et al. |
| 2002/0038791 A1 * | 4/2002 | Okumura ............ C23C 16/4412 216/71 |
| 2002/0121345 A1 | 9/2002 | Chen et al. |
| 2003/0213434 A1 | 11/2003 | Gondhalekar et al. |
| 2004/0083971 A1 | 5/2004 | Holland et al. |
| 2005/0257743 A1 * | 11/2005 | Koshiishi ......... H01J 37/32082 118/723 E |
| 2007/0023145 A1 | 2/2007 | Bera et al. |
| 2009/0159425 A1 | 6/2009 | Liu et al. |
| 2009/0250169 A1 | 10/2009 | Carduci et al. |
| 2009/0294065 A1 | 12/2009 | Lai et al. |
| 2011/0094996 A1 | 4/2011 | Yamazawa et al. |
| 2012/0073756 A1 | 3/2012 | Yamazawa et al. |
| 2012/0090990 A1 * | 4/2012 | Cox ....................... C23C 14/34 204/298.04 |
| 2012/0248066 A1 | 10/2012 | Yamazawa |
| 2013/0087286 A1 | 4/2013 | Carducci et al. |
| 2013/0256271 A1 | 10/2013 | Panagopoulos et al. |
| 2013/0278141 A1 | 10/2013 | Dorf et al. |
| 2013/0278142 A1 | 10/2013 | Dorf et al. |
| 2013/0284370 A1 | 10/2013 | Collins et al. |
| 2014/0020835 A1 | 1/2014 | Nguyen et al. |
| 2014/0020836 A1 | 1/2014 | Nguyen et al. |
| 2014/0020837 A1 | 1/2014 | Nguyen et al. |
| 2014/0020838 A1 | 1/2014 | Kenney et al. |
| 2014/0020839 A1 * | 1/2014 | Kenney ................ H01J 37/04 156/345.48 |
| 2014/0021861 A1 * | 1/2014 | Carducci ............... H05H 1/46 315/111.51 |
| 2015/0068682 A1 | 3/2015 | Banna et al. |
| 2015/0087157 A1 | 3/2015 | Aubuchon et al. |

FOREIGN PATENT DOCUMENTS

| | | |
|---|---|---|
| KR | 10-2009-0102257 A | 9/2009 |
| WO | WO-2008/088110 A1 | 7/2008 |

OTHER PUBLICATIONS

U.S. Appl. No. 14/319,089, filed Jun. 30, 2014, Carducci et al.
Official Action Dated Feb. 10, 2016 Issued in Co-Pending U.S. Appl. No. 13/897,592.
Official Action Dated Feb. 10, 2016 Issued in Co-Pending U.S. Appl. No. 13/666,224.
Official Action Dated Apr. 27, 2015 issued in Co-pending U.S. Appl. No. 13/666,614.

* cited by examiner

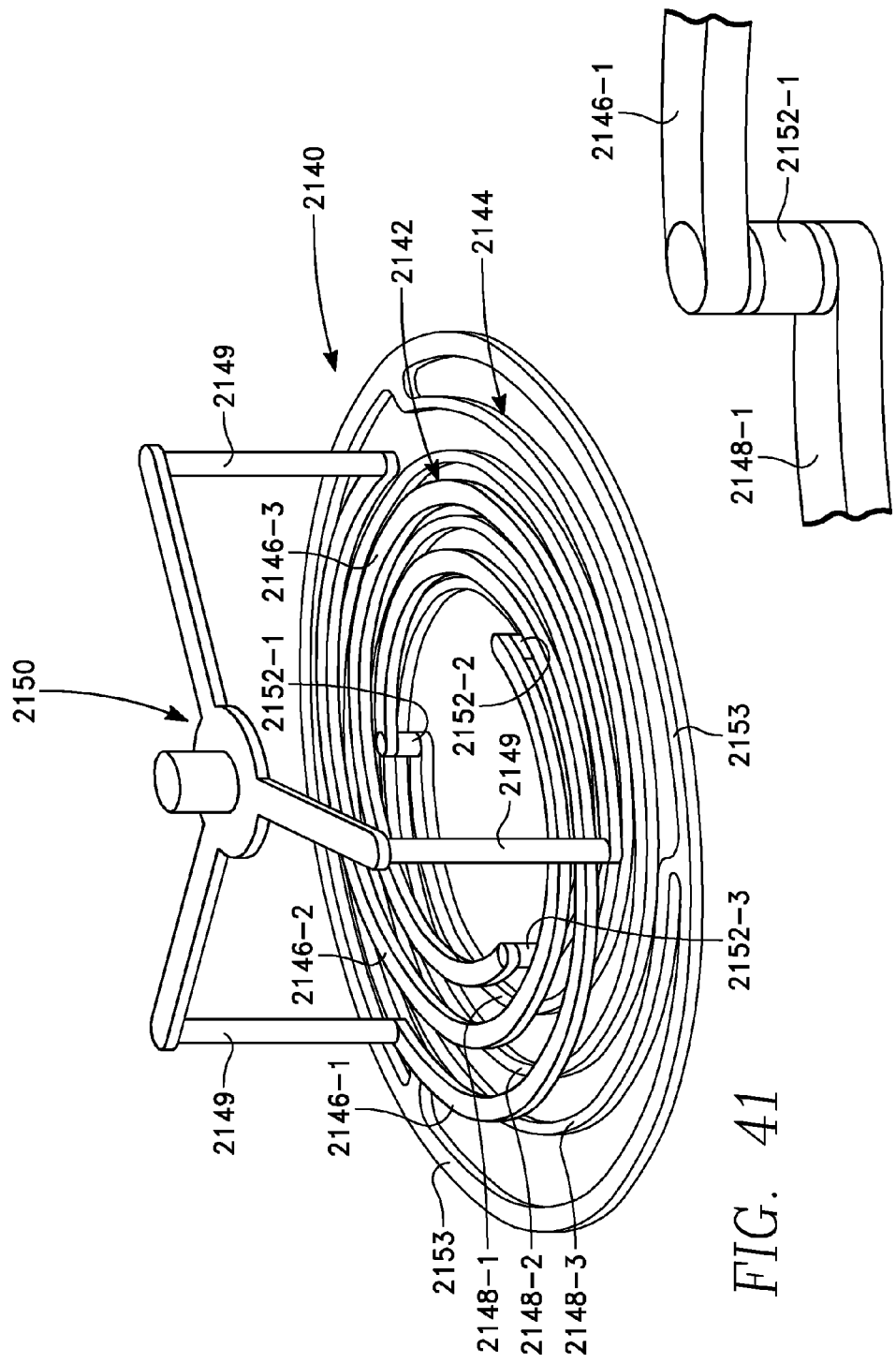

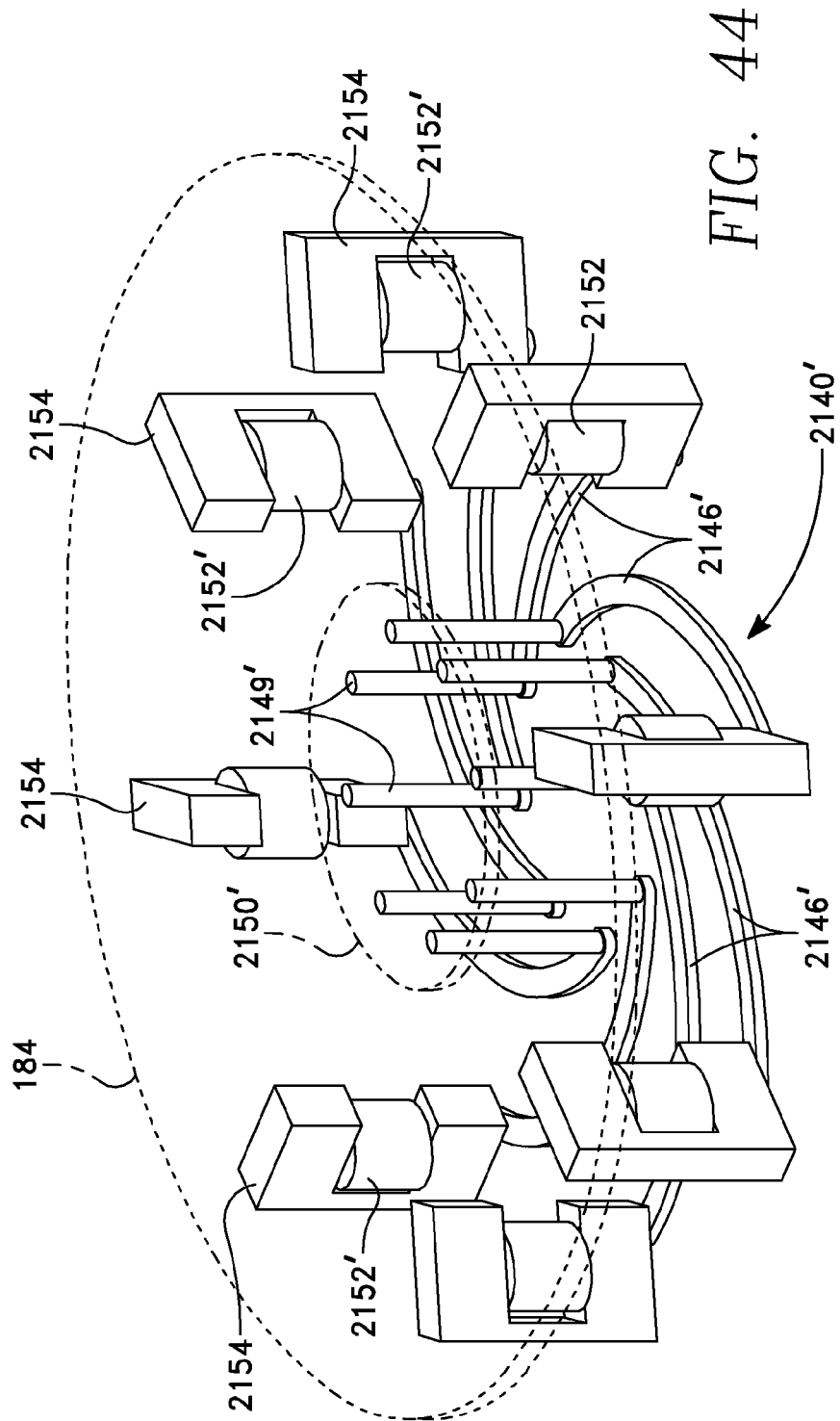

SYMMETRICAL INDUCTIVELY COUPLED PLASMA SOURCE WITH SIDE RF FEEDS AND SPIRAL COIL ANTENNA

CROSS-REFERENCE TO RELATED APPLICATIONS

This application is a continuation-in-part of U.S. patent application Ser. No. 13/966,614 filed Aug. 14, 2013 entitled SYMMETRICAL INDUCTIVELY COUPLED PLASMA SOURCE WITH SIDE RF FEEDS AND RF DISTRIBUTION PLATES by James D. Carducci, et al., which is a continuation-in-part of U.S. patent application Ser. No. 13/897,592 filed May 20, 2013 entitled INDUCTIVELY COUPLED PLASMA SOURCE WITH SYMMETRICAL RF FEED by Jason A. Kenney, et al., and U.S. patent application Ser. No. 13/897,585 filed May 20, 2013 entitled SYMMETRICAL INDUCTIVELY COUPLED PLASMA SOURCE WITH COAXIAL RF FEED AND COAXIAL SHIELDING by Jason A. Kenney, et al., both applications of which are continuation-in-parts of U.S. patent application Ser. No. 13/666,224 filed Nov. 1, 2012 entitled SYMMETRICAL INDUCTIVELY COUPLED PLASMA SOURCE WITH SYMMETRICAL FLOW CHAMBER by Andrew Nguyen, et al.; U.S. patent application Ser. No. 13/666,245 filed Nov. 1, 2012 entitled INDUCTIVELY COUPLED PLASMA SOURCE WITH PLURAL TOP COILS OVER A CEILING AND AN INDEPENDENT SIDE COIL, by Andrew Nguyen, et al.; and U.S. patent application Ser. No. 13/666,280 filed Nov. 1, 2012 entitled INDUCTIVELY COUPLED PLASMA SOURCE WITH MULTIPLE DIELECTRIC WINDOWS AND WINDOW-SUPPORTING STRUCTURE by Andrew Nguyen, et al., all applications of which claim the benefit of U.S. Provisional Application Ser. No. 61/673,937 filed Jul. 20, 2012 entitled SYMMETRICAL MULTIPLE COAXIAL ICP SOURCE AND SYMMETRICAL FLOW CHAMBER, by Andrew Nguyen et al., and assigned to the present assignee. All of the above applications are hereby incorporated by reference in their entirety.

BACKGROUND

1. Technical Field

Embodiments of the present invention are generally concerned with a plasma processing reactor chamber for processing workpieces, in which plasma is generated by inductive coupling of RF power to process gases inside the chamber.

2. Description of Related Art

Electronic devices such as integrated circuits, flat panel displays and the like, are fabricated by a series of processes, in which thin film layers are deposited on substrates and etched into desired patterns. The process steps may include plasma-enhanced reactive ion etching (RIE), plasma-enhanced chemical vapor deposition (CVD), plasma-enhanced physical vapor deposition (PVD).

Uniform distribution of etch rate or deposition rate across the entire surface of the substrate is essential for successful fabrication. Such uniformity is becoming more difficult to achieve, as substrate size is increasing and device geometry is shrinking. In particular, inductively coupled plasma sources can have two concentrically arranged coil antennas over the chamber ceiling, so that uniformity of etch rate distribution can be optimized by adjusting the different RF power levels delivered to the different coil antennas. As workpiece diameter and chamber diameter increase, we have found this approach is not adequate, as the larger size increases the difficultly of attaining the requisite process uniformity. Various sources of process non-uniformity, such as chamber design asymmetries, temperature distribution non-uniformities and gas distribution control become more important.

SUMMARY

A plasma reactor comprises a window assembly, first and second coil antennas adjacent the window assembly, the first coil antenna comprising a first layer of parallel spiral conductors, each of the parallel spiral conductors comprising first and second ends. The plasma reactor further comprises a first current distributor coupled to the first ends of the parallel spiral conductors of the first layer, respective capacitors coupled to respective ones of the second ends of the parallel spiral conductors of the first layer, a conductive ground plate in a plane overlying the first current distributor, and a first radial conductive feed rod lying in a plane above the conductive ground plate and having an inner end coupled to the first current distributor and an outer end comprising a first RF feed terminal.

In one embodiment, the first coil antenna further comprises a second layer of parallel spiral conductors, each of the parallel spiral conductors of the second layer comprising first and second ends, and the respective capacitors are coupled between respective ones of the second ends of the first layer and the second ends of the second layer.

In one embodiment, the first ends of the second layer are coupled to an RF return potential.

In accordance with an embodiment having only a single layer of spiral coil conductors, the respective capacitors are coupled between the second ends of the first layer and the ground return plate.

In a related embodiment, the first current distributor comprises a first conductive spider lying in a plane above the first and second coil antennas, and a plurality of axial posts connected between a peripheral annular zone of the first conductive spider and the first ends of first layer of parallel spiral conductors.

One embodiment further comprises a current distribution ring coupled to the second coil antenna, a conductive plate lying in a plane above the first current distributor, and a second RF feed terminal connected to a center of the conductive plate, and a plurality of axial rods connected between a peripheral annular zone of the conductive plate and the current distribution ring. This embodiment may further comprise a current distributor coupled to the second coil antenna, and a second radial conductive feed rod lying in a plane above the conductive ground plate and having an inner end coupled to the current distributor and an outer end comprising a second RF feed terminal.

A related embodiment further comprises a first axial center rod connected between the inner end of the first radial conductive feed rod and the first conductive plate, and a second axial center rod connected between the inner end of the second radial conductive feed rod and the current distributor. In accordance with one embodiment, an axial center shield may surround the first and second axial center rods. Further, a first radial cylindrical shield may surround the first radial conductive feed rod. Also, a second radial cylindrical shield may surround the second radial conductive feed rod.

In a related embodiment, a first plurality of axial cylindrical shields surround respective ones of the plurality of axial rods. The first plurality of axial cylindrical shields may be grounded to the conductive ground plate. In a further related embodiment, an inner coil shield may surround the second coil antenna and lie between the first and second coil antennas. In one embodiment, the inner coil shield is grounded and the first and second coil antennas comprise ground return ends connected to the inner coil shield.

In accordance with another embodiment, a plasma reactor comprises a window assembly, a coil antenna adjacent the window assembly, the coil antenna comprising a first layer of parallel spiral conductors, each of the parallel spiral conductors comprising first and second ends, a first current distributor coupled to the first ends of the parallel spiral conductors of the first layer, and respective capacitors coupled to respective ones of the second ends of the parallel spiral conductors of the first layer.

The plasma reactor may further comprise a conductive ground plate in a plane overlying the first current distributor, and a first radial conductive feed rod lying in a plane above the conductive ground plate and having an inner end coupled to the first current distributor and an outer end comprising a first RF feed terminal.

In one embodiment, the first coil antenna further comprises a second layer of parallel spiral conductors, each of the parallel spiral conductors of the second layer comprising first and second ends, wherein the respective capacitors are coupled between respective ones of the second ends of the first layer and the second ends of the second layer. In one embodiment, the first ends of the second layer are coupled to an RF return potential. In one embodiment, the respective capacitors are coupled between the second ends of the first layer and the ground return plate.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIG. 24A is a cross-sectional view along lines 24A-24A of FIG. 24.

FIG. 41 illustrates a dual layer spiral coil antenna in the embodiment of FIG. 40.

FIG. 42 is an enlarged view corresponding to FIG. 41.

FIG. 44 illustrates a modification of the embodiment of FIG. 41 having a single layer of parallel spiral conductors.

Figure 1:
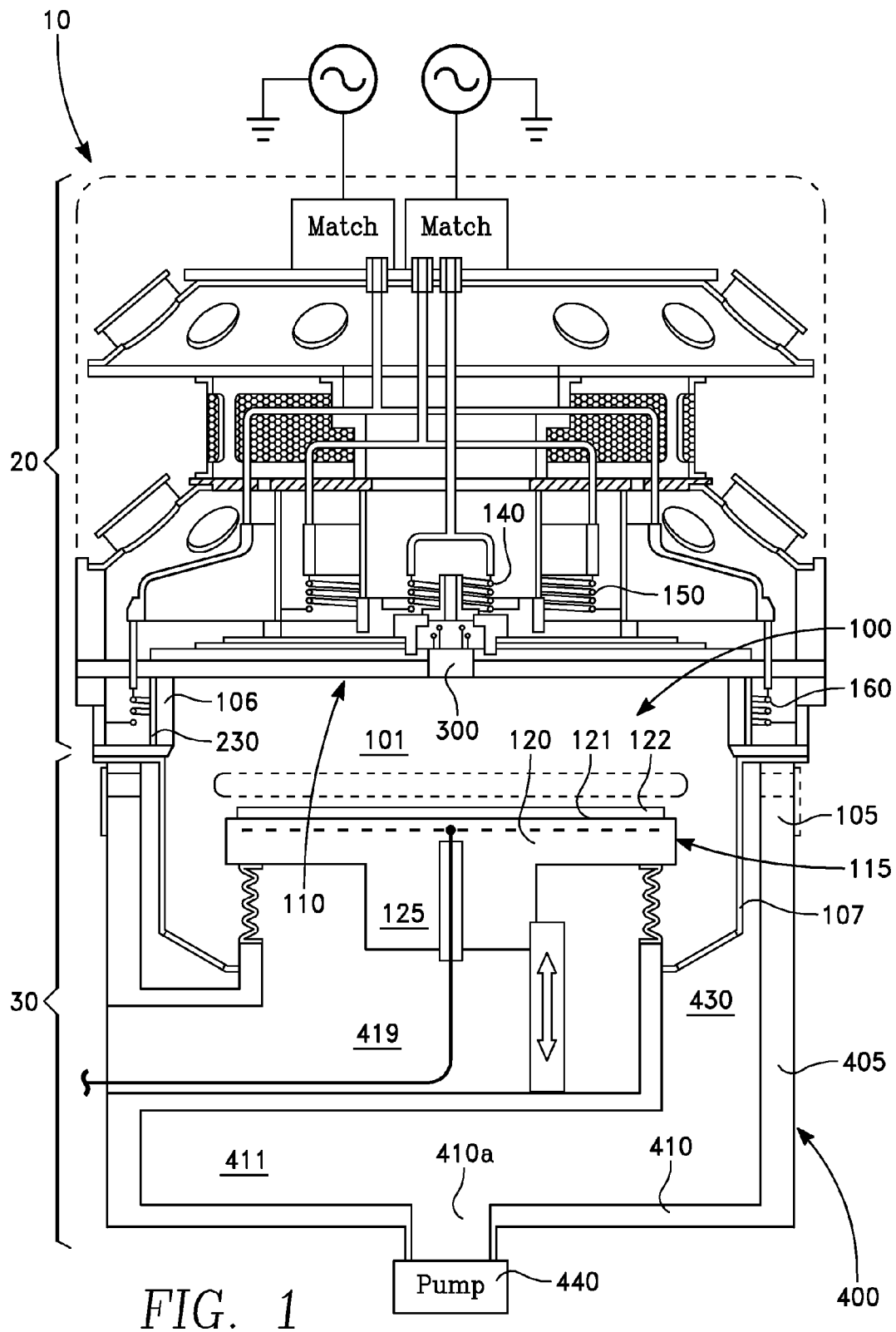
FIG. 1 is a cut-away view of a plasma reactor of an embodiment the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1A:
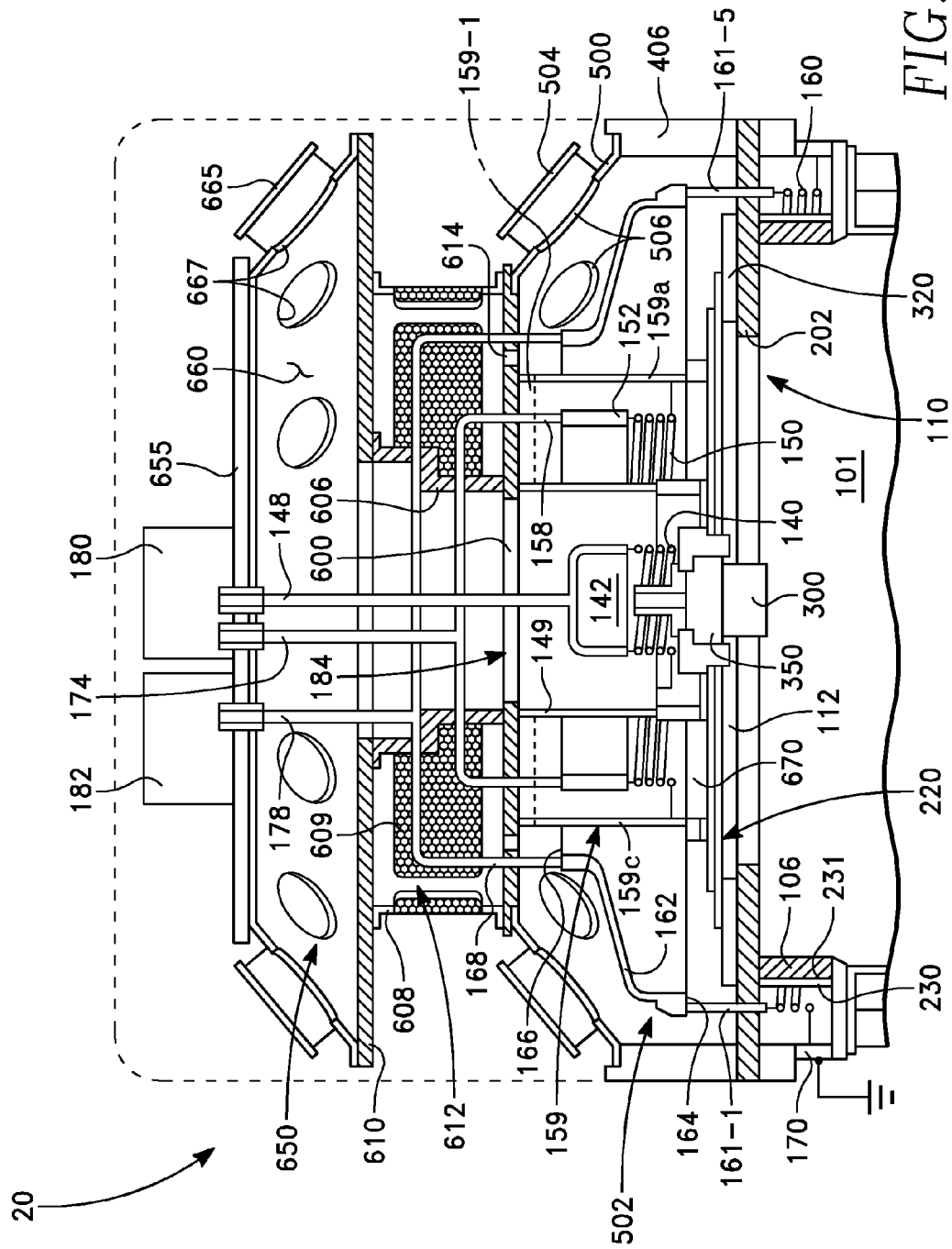
FIG. 1A is an enlarged view of an upper section of the reactor of FIG. 1.
Figure 1B:
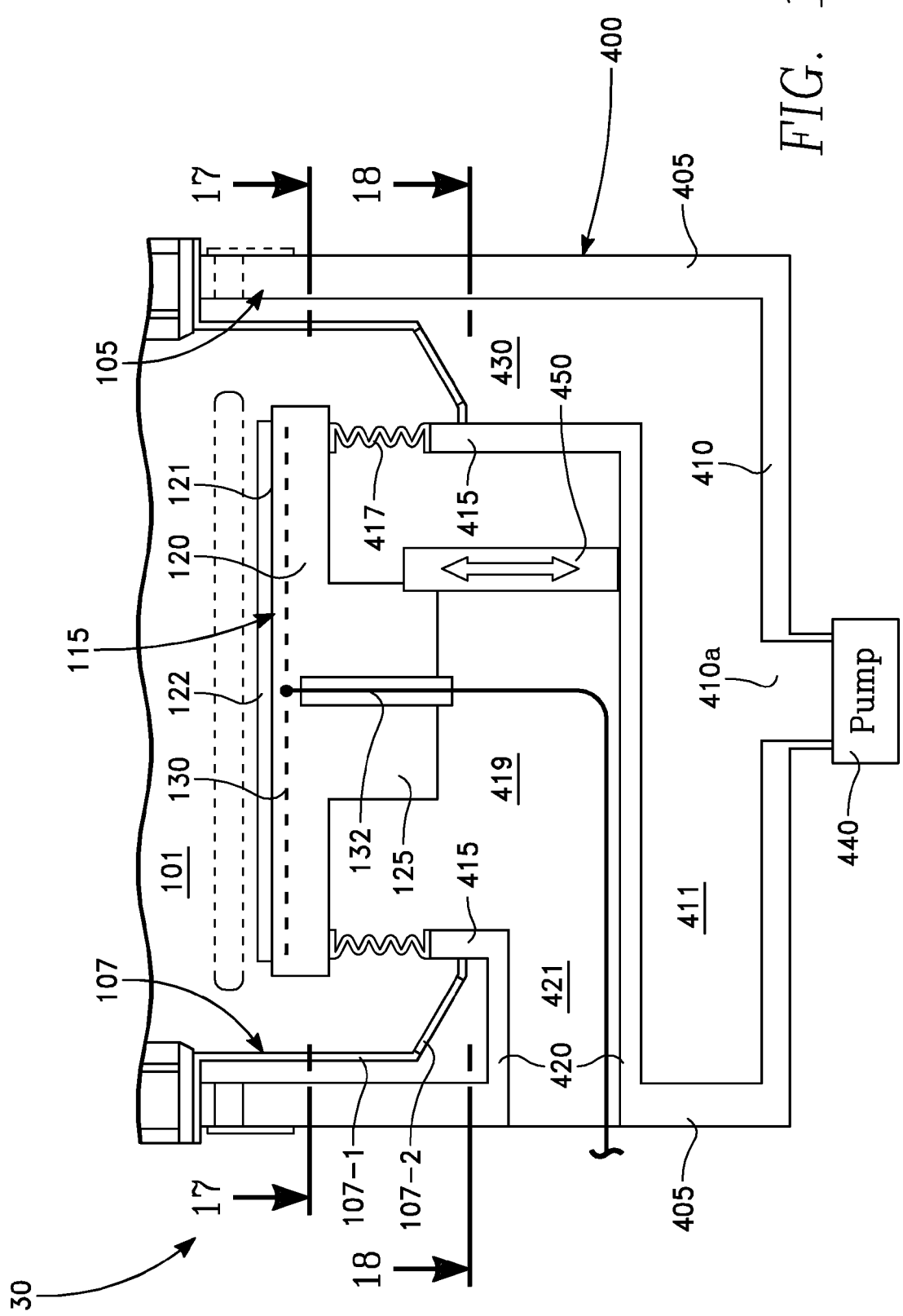
FIG. 1B is an enlarged view of a lower section of the reactor of FIG. 1.

A plasma reactor 10 depicted in FIG. 1 includes an upper portion 20 depicted in the enlarged view of FIG. 1A and a lower portion 30 depicted in the enlarged view of FIG. 1B. Referring to FIGS. 1, 1A and 1B, the plasma reactor 10 includes a plasma processing chamber 100 having a side wall 105 and a lid assembly 110. The side wall 105 has an axially symmetrical shape, such as a cylinder. The side wall 105 includes an axially symmetrical (e.g., cylindrical) dielectric side window 106 and a chamber liner 107, which may be formed of metal. A workpiece support 115 inside the chamber 100 includes a pedestal 120 having a workpiece support surface 121 facing the lid assembly 110 for holding a workpiece 122, and a post 125 supporting the pedestal 120. A processing region 101 of the chamber 100 is confined by the lid assembly 110, the pedestal 120 and the side wall 105. The pedestal 120 may include an insulated internal electrode 130. Optionally, an electrostatic chucking (ESC) voltage and/or RF plasma bias power may be supplied to the internal electrode 130 via a cable 132 extending through the post 125. The cable 132 may be coupled to an RF bias power source (such as an RF impedance matching network and/or an RF power generator) as an RF bias feed to the electrode 130. The cable 132 may be provided as a coaxial transmission line, which may be rigid (or flexible), or as a flexible coaxial cable.

Plasma source power is inductively coupled into the processing region 101 by a set of coil antennas, including an inner coil antenna 140, a middle coil antenna 150 and an outer or side coil antenna 160, all of which are concentrically disposed with respect to each other and are coaxial with the axis of symmetry of the side wall 105. The lid assembly 110 includes a disk-shaped dielectric window 112 through which the inner and middle coil antennas 140 and 150 inductively couple RF plasma source power into the processing region 101. The disk-shaped dielectric window 112 is coaxial with the side wall 105 and has a disk-plane parallel with the plane of the workpiece support surface 121. The side coil antenna 160 inductively couples RF plasma source power into the processing region 101 through the cylindrical dielectric side window 106. The dielectric windows 106 and 112 may be referred to collectively as a window assembly.

Figure 2:
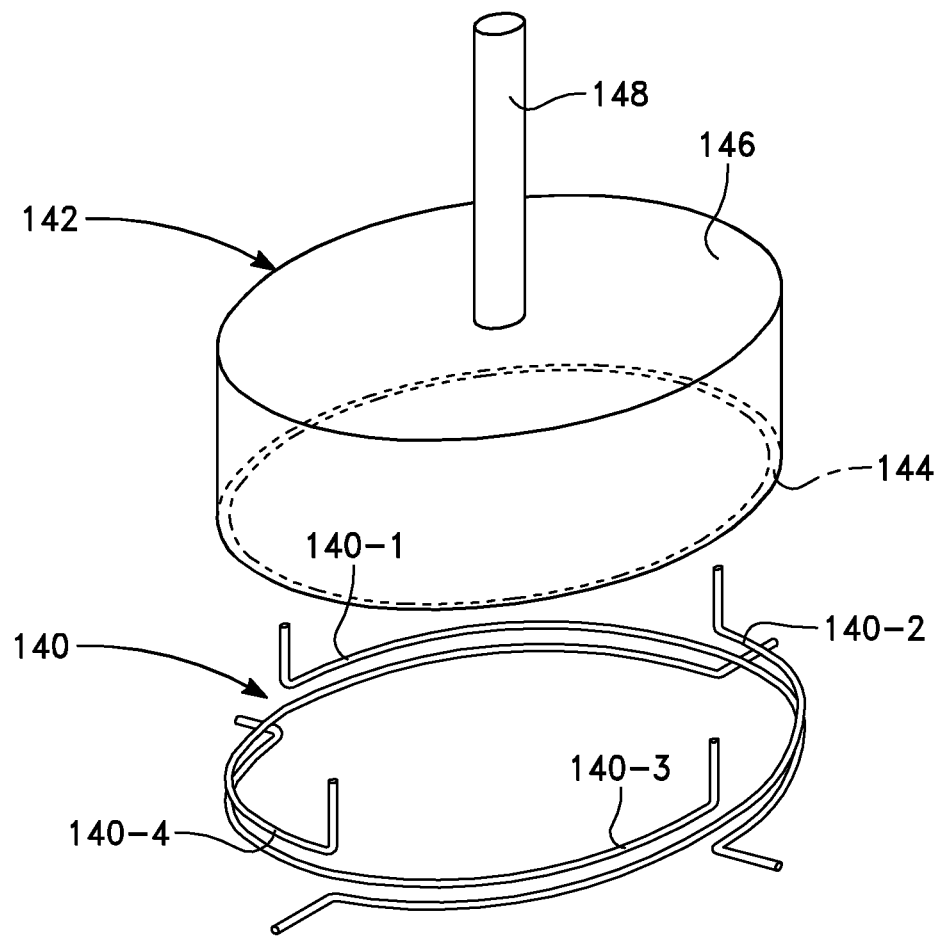
FIG. 2 illustrates an inner zone inductive RF power applicator of the reactor of FIG. 1.

Referring to FIGS. 1A and 2, in one embodiment, the inner coil antenna 140 includes four wire conductors 140-1 through 140-4, each one helically wound about a constant radius along an arc length of 180 degrees, their ends being staggered (i.e., offset along a circumferential direction) at uniformly spaced 90 degree intervals, as depicted in FIG. 2. Uniform and symmetrical distribution of RF power to the wire conductors 140-1 through 140-4 is provided by an RF current distributor 142 in the form of an inverted metal bowl having a circular bottom edge 144 contacting the top ends of each of the wire conductors 140-1 through 140-4, and a lid 146 connected to an inner RF feed rod 148. The bottom ends of the four wire conductors 140-1 through 140-4 are grounded by connection to an inner ground shield 149 (FIG. 1A) in the form of a cylindrical metal sleeve coaxial with the inner coil antenna 140 and lying between the inner and middle coil antennas 140 and 150. The inner ground shield 149 provides a uniform and symmetrical distribution of ground current from the four wire conductors 140-1 through 140-4, and further provides RF shielding or isolation between the inner and middle coil antennas 140 and 150, by suppressing mutual inductance between them. This enhances independent control of the inner and middle coil antennas 140, 150.

Figure 3:
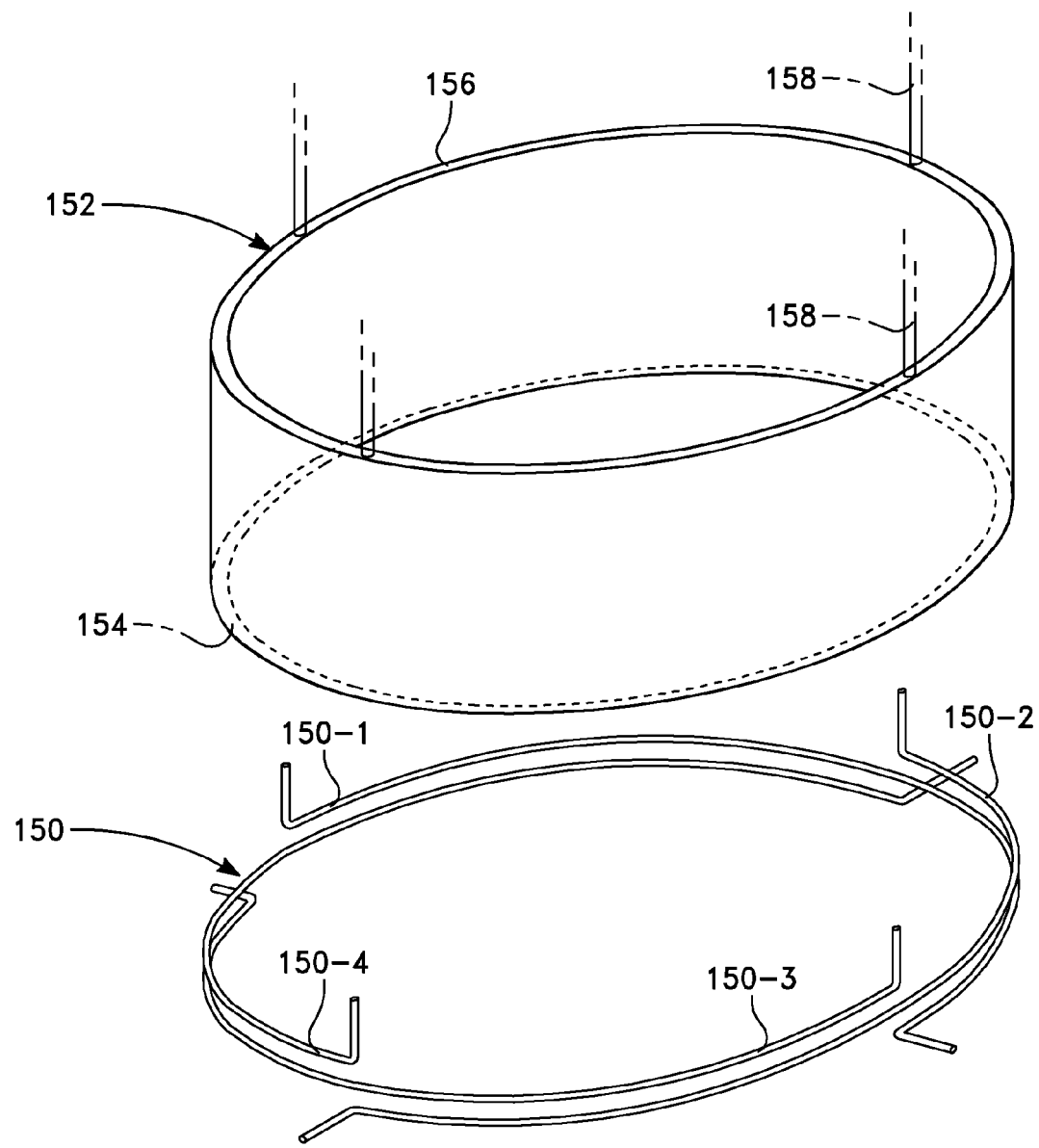
FIG. 3 illustrates an intermediate or middle zone inductive RF power applicator of the reactor of FIG. 1.

Referring to FIGS. 1A and 3, in one embodiment, the middle coil antenna 150 includes four wire conductors 150-1 through 150-4, each one helically wound about a constant radius along an arc length of 180 degrees, their ends being staggered at uniformly spaced 90 degree intervals, as depicted in FIG. 3. Uniform and symmetrical distribution of RF power to the wire conductors 150-1 through 150-4 is provided by an RF current distributor 152 in the form of a cylindrical metal sleeve having a circular bottom edge 154 contacting the top ends of each of the wire conductors 150-1 through 150-4, and a circular top edge 156 connected to a circular array of four axial RF feed rods 158. RF power is fed to the RF feed rods 158 by a conductor structure depicted in FIG. 5, which is described later in this specification.

Referring again to FIG. 1A, the bottom ends of the four wire conductors 150-1 through 150-4 are grounded by connection to a middle ground shield 159. The middle ground shield 159 may be in the form of a cylinder. However, in one embodiment depicted in dashed line in FIG. 1A, the top of the middle ground shield 159 is a metal ring 159-1 coaxial with the coil antenna 150. Four conductive legs 159a through 159d (of which only the legs 159a and 159c can be seen in the view of FIG. 1A) extend axially downward from the ring 159-1 and have bottom ends contacting the bottom ends of the four conductors 150-1 through 150-4. The middle ground shield 159 provides a uniform and symmetrical of ground current from the four wire conductors 150-1 through 150-4.

Figure 4:
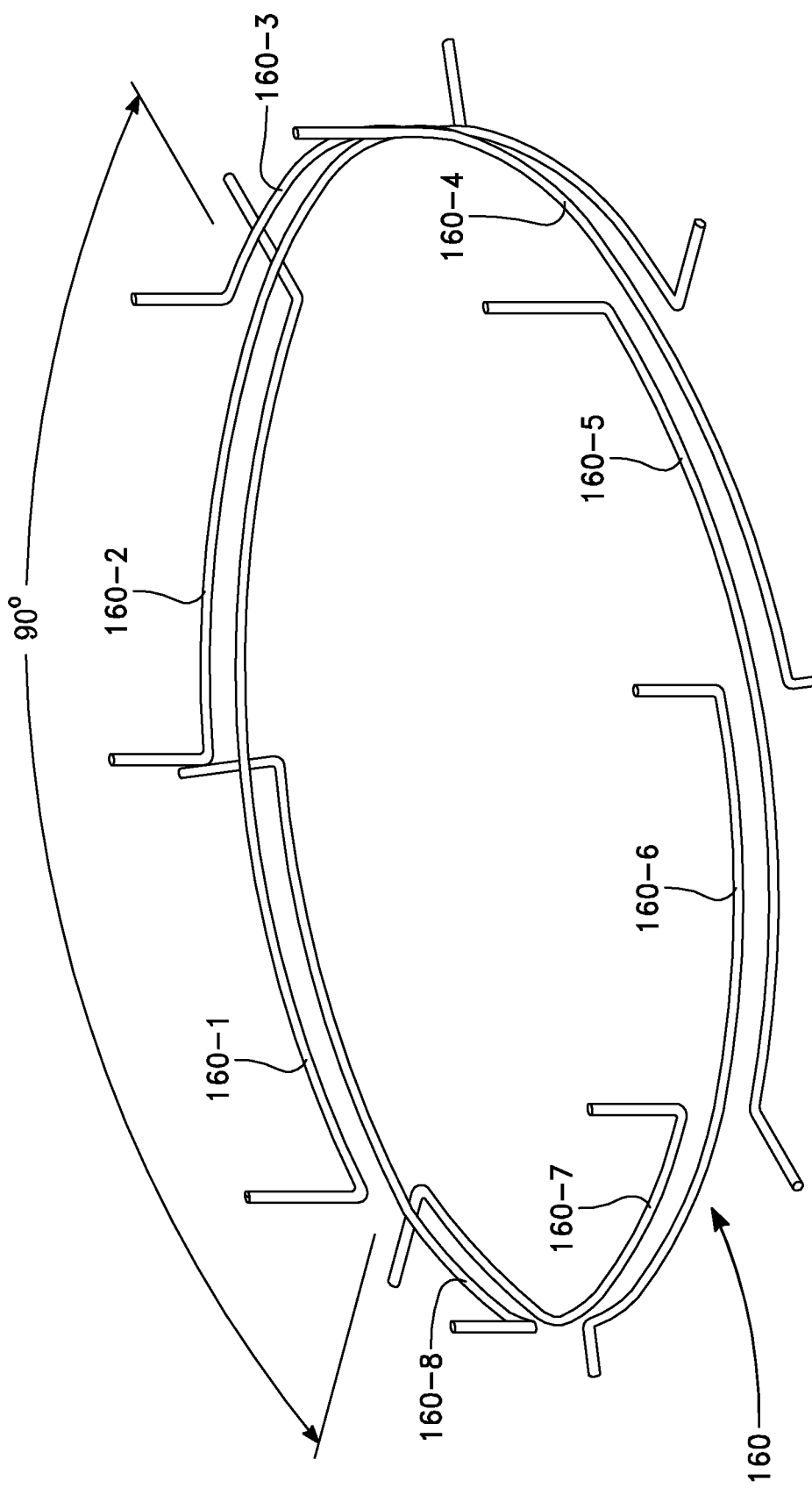
FIG. 4 illustrates an outer zone inductive RF power applicator of the reactor of FIG. 1.

Referring to FIGS. 1A and 4, the side coil antenna 160 is disposed below the plane of the disk shaped dielectric window 112 and surrounds the cylindrical dielectric side window 106. In one embodiment, the side coil antenna 160 includes eight wire conductors 160-1 through 160-8, each one helically wound about a constant radius along an arc length of 90 degrees, their ends being staggered at uniformly spaced 45 degree intervals, as depicted in FIG. 4. Uniform and symmetrical distribution of RF power to the wire conductors 160-1 through 160-8 is provided by an RF current distributor 162 in the form of an inverted metal bowl (FIG. 1A) having a circular bottom edge 164 attached to respective axial conductors 161-1 through 161-8 (of which only the axial conductors 161-1 and 161-5 are visible in the view of FIG. 1A) contacting the top ends of the wire conductors 160-1 through 160-8 respectively. The RF current distributor 162 further has a circular top edge 166 connected to a circular array of eight uniformly spaced axial RF feed rods 168. A cylindrical outer chamber wall 170 surrounds the side coil antenna 160 and is grounded. The bottom ends of the eight wire conductors 160-1 through 160-8 are grounded by connection to the outer chamber wall 170. While the described embodiments include direct connection to ground of the coil antennas 140, 150 and 160 by the ground shields 149 and 159 and the outer chamber wall 170, respectively, the connection to ground may not need to be a direct connection, and instead the connection to ground may be through elements such as capacitors, for example.

Figure 5:
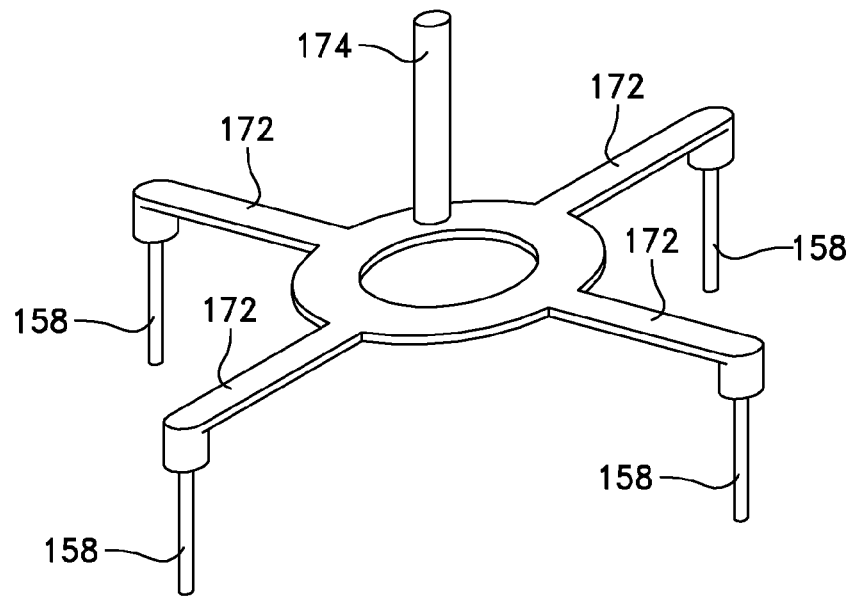
FIG. 5 illustrates a conductive RF power feeder for the RF power applicator of FIG. 3.
Figure 6:
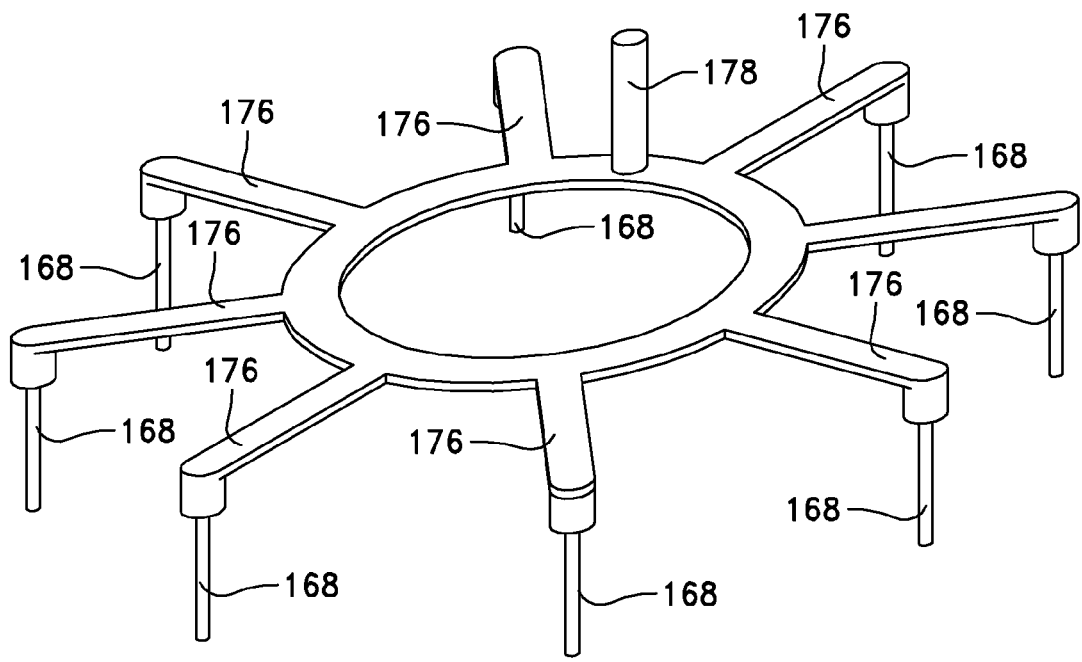
FIG. 6 illustrates a conductive RF power feeder for the RF power applicator of FIG. 4.

Referring to FIG. 5, the four axial RF feed rods 158 associated with the middle coil antenna 150 extend to four radial RF feed rods 172 connected to a common axial feed rod 174. Referring to FIG. 6, the eight axial RF feed rods 168 associated with the side coil antenna 160 extend to eight radial RF feed rods 176 connected to a common axial feed rod 178. The axial RF feed rod 148, the common axial feed rod 174 and the common axial feed rod 178 couple RF power to the respective coil antennas 140, 150 and 160. The power may be supplied from a common RF source or from different RF sources such as RF matches (RF impedance matching networks) 180 and 182. As will be described below with reference to FIG. 20B, an RF impedance matching network may be employed having dual outputs in order to drive two of the coil antennas with a first RF generator, while a second RF generator and a second RF impedance matching network drives the third coil antenna. Alternatively, as will be described below with reference to FIG. 20A, three RF generators may separately drive the three coil antennas through three respective RF impedance matching networks. In yet another embodiment, a single RF power generator may drive all three coil antennas through an RF impedance matching network having three outputs. In some implementations of the foregoing embodiments, the RF power levels applied to the different coil antennas may be separately adjusted in order to control radial distribution of plasma ion density. While described embodiments include the three coil antennas 140, 150 and 160, other embodiments may include only one or two of the three described coil antennas 140, 150 and 160.

Only the axial RF feed rod 148 is symmetrically located at the axis of symmetry of the side wall 105, while the axial feed rods 174 and 178 are located off-center, as depicted in FIGS. 1A, 5 and 6. This feature is asymmetrical. The axial RF feed rods 148, 158 and 168 are arrayed symmetrically relative to the axis of symmetry of the side wall 105. A generally disk-shaped conductive ground plate 184 generally parallel with the workpiece support surface 121 contains openings through which the axial RF feed rods 148, 158 and 168 extend. The ground plate 184 provides separation between an upper region containing the non-symmetrically arranged axial feed rods 174 and 178 (and an upper portion of the RF feed rod 148 which is symmetrically located), and a lower region containing only symmetrical features such as the axial RF feed rods 148, 158 and 168. The RF feed rods 148, 158 and 168 are electrically insulated from the ground plate 184. The ground plate 184 electromagnetically shields the processing region 101 from the effects of the asymmetric features above the ground plate 184 and also prevents skew effects in plasma processing of the workpiece 122.

Figure 7:
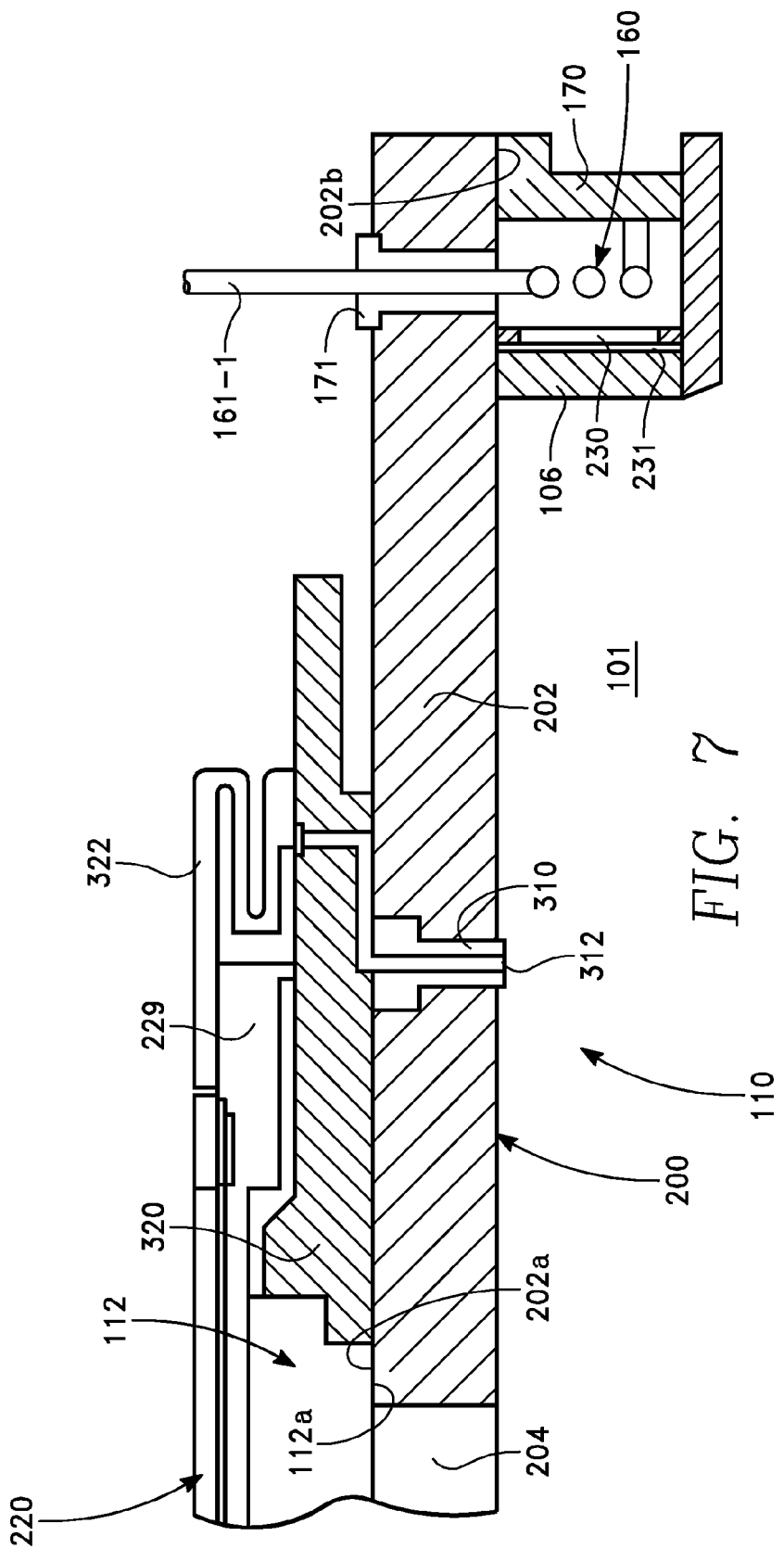
FIG. 7 is a cut-away cross-sectional view of a portion of a lid assembly of the reactor of FIG. 1.

Referring to FIGS. 1 and 7, the disk-shaped dielectric window 112 has a diameter less than the diameter of the outer chamber wall 170. The window 112 is supported at its periphery by an annular top gas plate 200 (described later in this specification) that spans the gap between the outer chamber wall 170 and the window 112, while maintaining the space below the window 112 free of structure that would otherwise inhibit inductive coupling of RF power into the processing region 101. The chamber diameter is therefore not limited by the diameter of the disk-shaped dielectric window 112. The inner and middle coil antennas 140 and 150 (coextensive with the disk-shaped dielectric window 112) may control plasma ion density distribution within an intermediate zone of a diameter smaller than that of the workpiece or wafer 122. Plasma density in an outer zone is governed by the side coil antenna 160 through the cylindrical dielectric side window 106. This affords control of plasma ion density distribution across the entire wafer without requiring a concomitant increase in diameter of the disk-shaped dielectric window 112.

As referred to above, the annular top gas plate 200 supports the disk-shaped dielectric window 112 and spans the gap or distance between the outer chamber wall 170 and the periphery of the disk-shaped dielectric window 112. The top gas plate 200 includes an annulus 202 surrounding an opening 204. A top inner edge 202a of the annulus 202 underlies and supports an outer edge 112a of the dielectric window 112 and surrounds the opening 204. A bottom outer edge 202b of the annulus 202 rests on the outer chamber wall 170. The opening 204 faces the disk-shaped dielectric window 112. The axial conductors 161-1 through 161-8 (of the outer coil antenna 160) extend through respective insulators 171 in the top gas plate 200.

Figure 8:
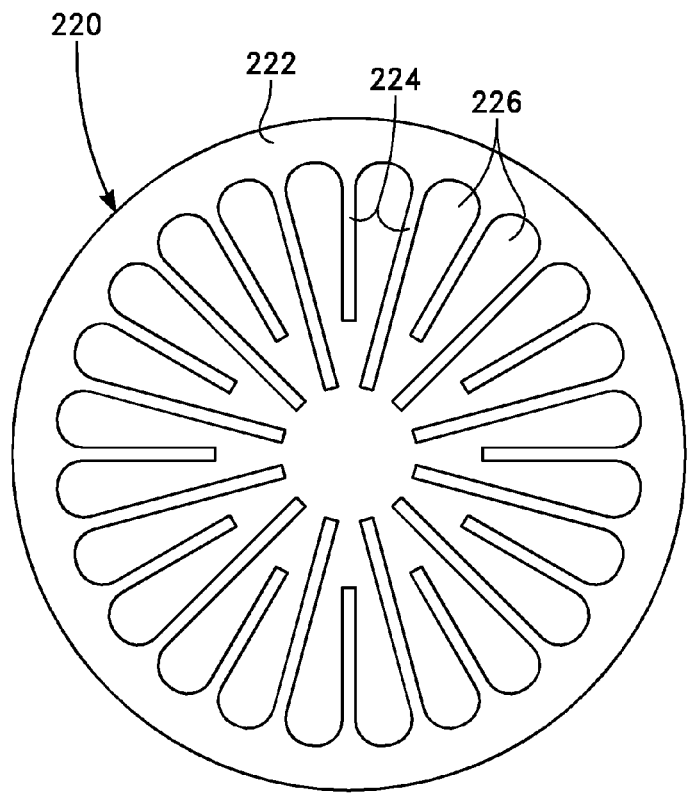
FIG. 8 is a plan view of a heater layer covering a disk-shaped dielectric window of the lid assembly of FIG. 7.

The disk-shaped dielectric window 112 and the cylindrical dielectric side window 106 are heated and have their respective temperatures controlled independently of one another. They are heated and cooled independently, by cooling from a fan system described later in this specification and by independent heater elements now described. A flat heater layer 220 depicted in FIGS. 1A, 7 and 8 overlies the disk-shaped dielectric window 112. The heater layer 220 is in the form of a disk-shaped Faraday shield, having an outer annulus 222 and plural radial fingers 224 extending radially inwardly from the outer annulus 222, the radial fingers 224 being separated from one another by evenly spaced apertures 226. The spacing of the radial fingers 224 (defining the width of the apertures 226) is sufficient to permit inductive coupling of RF power through the heater layer 220. The heater layer 220 is symmetrical with respect to the axis of the side wall 105. In the illustrated example, there are 24 radial fingers 224, although any suitable number of fingers may be employed. The heater layer 220 is heated electrically by an internal electrically resistive element 229 (FIG. 7) within the heater layer 220.

Figure 9:
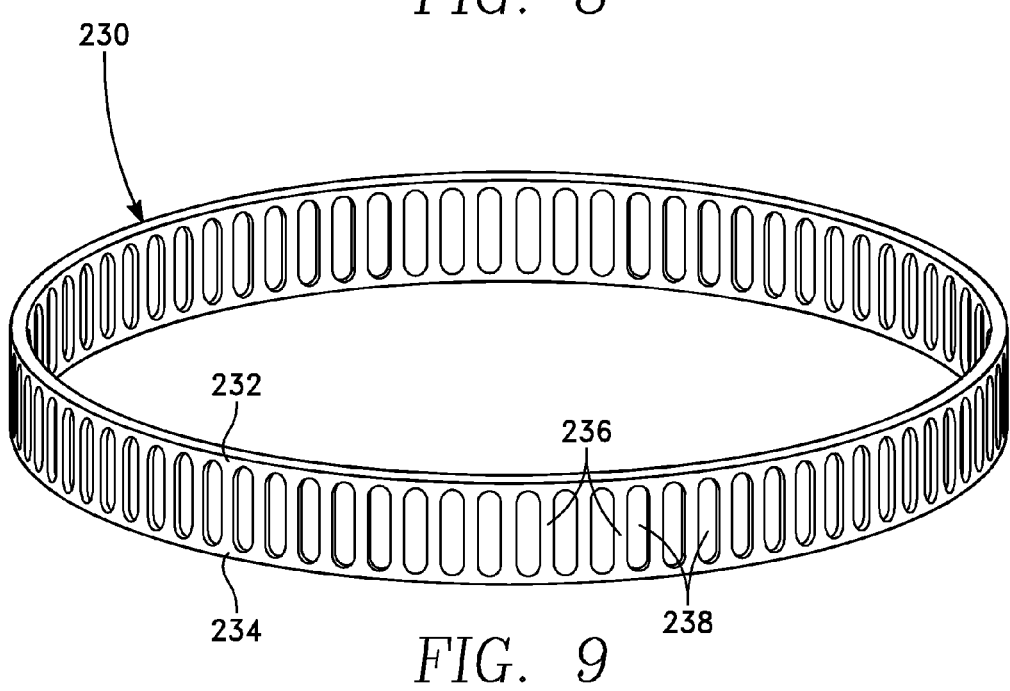
FIG. 9 is an orthographic projection of a heater layer covering a cylindrical dielectric window depicted with the lid assembly of FIG. 7.

A cylindrical Faraday shield layer 230 depicted in FIGS. 1A and 9 is disposed between the cylindrical dielectric window 106 and the outer coil antenna 160, and surrounds the cylindrical dielectric side window 106. The cylindrical Faraday shield layer 230 has upper and lower cylindrical rings 232, 234, and plural axial legs 236 extending axially between the upper and lower cylindrical rings 232, 234 and being separated by evenly spaced gaps 238. The cylindrical Faraday shield layer 230 may be heated electrically by an internal element (such as a heater layer 231 shown in FIGS. 1A and 7) within or contacting with the Faraday shield layer 230.

Process gas is injected into the processing region 101 by a central dual-zone ceiling gas injector 300 (FIG. 1A) and a circular array of peripheral (side) gas injectors 310 (FIG. 7). The ceiling gas injector 300 is located at the center of the disk-shaped dielectric window 112. The peripheral gas injectors 310 are supported on the top gas plate 200 near the cylindrical dielectric side window 106.

Figure 10:
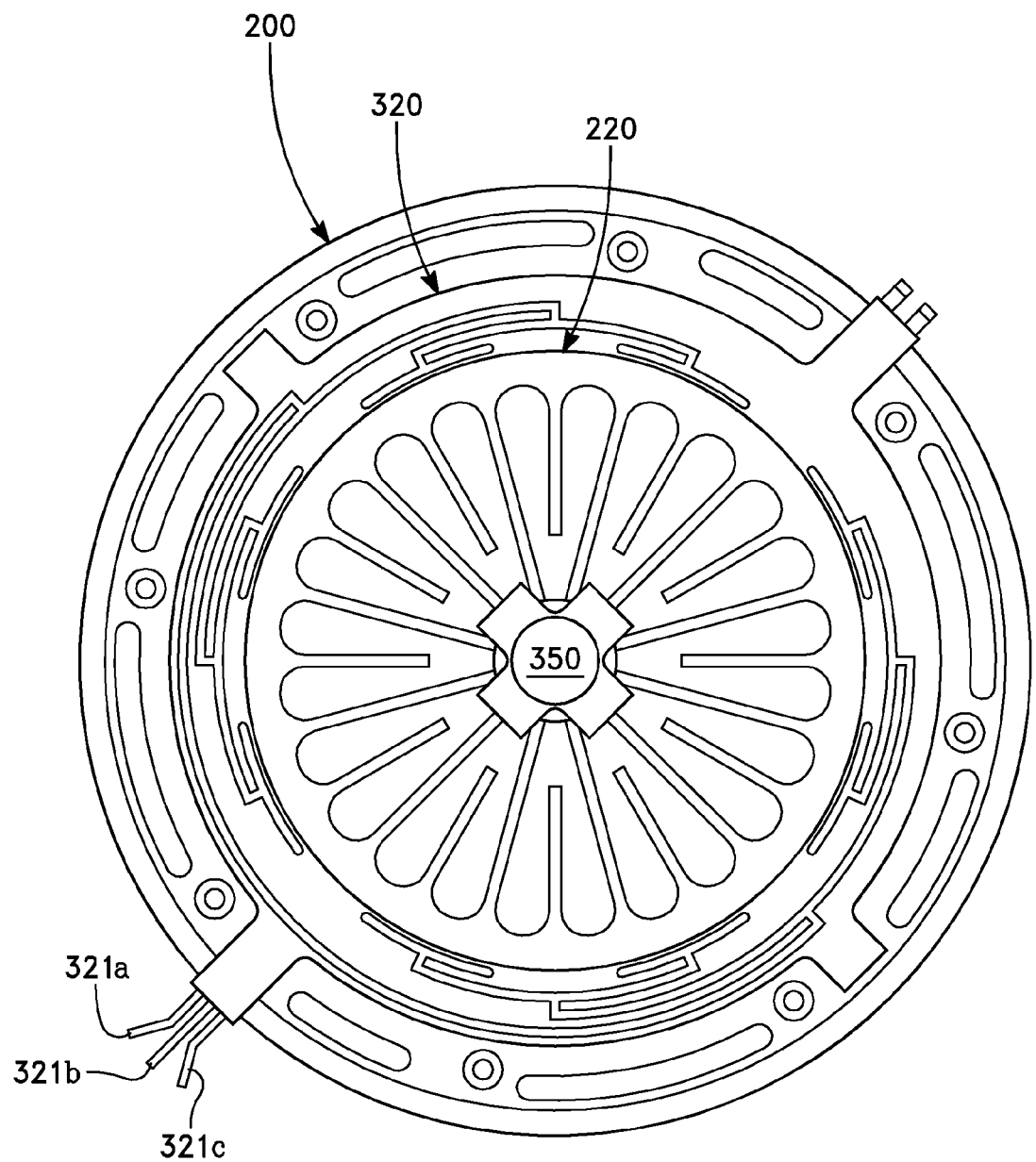
FIG. 10 is a plan view of the lid assembly of FIG. 7.
Figure 11A:
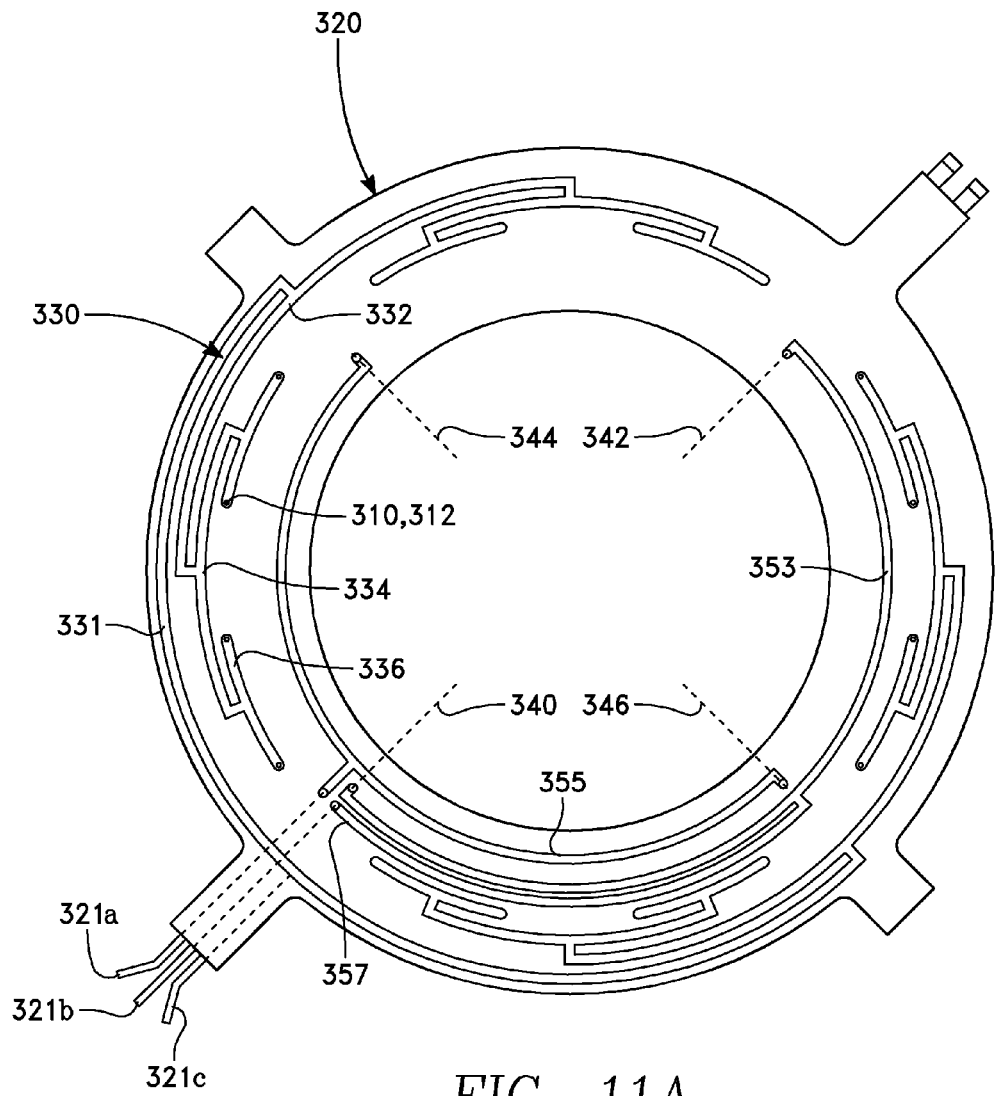
FIG. 11A is a plan view corresponding to FIG. 10 depicting gas flow passages in a gas flow plate of the lid assembly.

Referring to FIGS. 7, 10 and 11A, the lid assembly 110 includes an annular gas flow plate 320. The Faraday shield or heater layer 220 is held on the gas flow plate 320 by a spring plate 322 as shown in FIG. 7. The gas flow plate 320 has three gas input ports 321a, 321b, 321c (FIG. 10). The gas flow plate 320 provides recursive gas flow paths from the input port 321a to a first zone of the dual zone ceiling gas injector 300, recursive gas flow paths from the input port 321b to the other zone of the dual zone gas injector 300, and recursive gas flow paths from the gas input port 321c to the side gas injectors 310. The side gas injectors 310 are fed through respective gas ports 312 in the bottom surface of the gas flow plate 320 visible in the bottom view of FIG. 11B. The recursive gas flow paths provide uniformly distributed gas flow path lengths to different gas injection zones. Uniformity control of the gas distribution can also be enhanced by the recursive gas flow paths.

Referring to FIG. 11A, a first set or hierarchy of recursive gas flow paths 330 in the gas flow plate 320 feeds gas to the side gas injectors 310 through the gas ports 312. The first set of recursive gas flow paths 330 includes a half-circular channel or gas flow path. The gas injection port 321c is coupled to the midpoint of the half-circular gas flow channel 331. The gas flow path 331 extends around half a circle and feeds at its ends the midpoints of a pair of arcuate gas flow paths 332 each extending a quarter circle, which in turn feed at their respective ends the midpoints of four arcuate gas flow paths 334 each extending around an eighth circle. The four arcuate gas flow paths 334 feed at their ends the midpoints of eight arcuate gas flow paths 336 each extending around a sixteenth of a circle. The ends of the gas flow paths 336 feed the gas ports 312 for gas flow to the side gas injectors 310.

Figure 12:
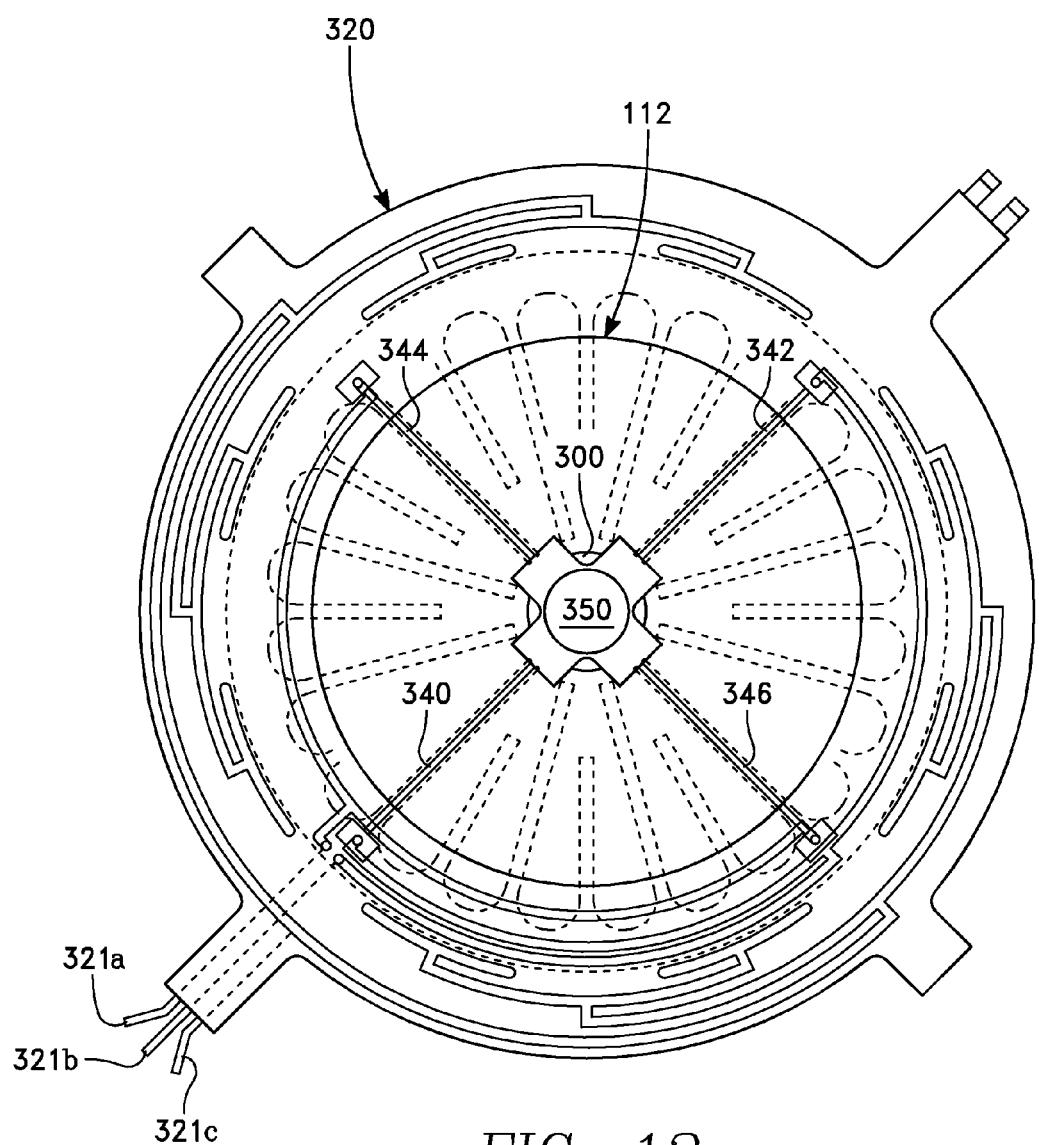
FIG. 12 is a plan view corresponding to FIG. 10 and depicting gas flow paths to a center hub.

Referring to FIG. 12, gas flow to one zone of the dual zone gas injector 300 is carried in a pair of opposing radial gas flow lines 340, 342 overlying the disk-shaped dielectric window 112. Gas flow to the other zone of the dual zone gas injector 300 is carried in a second pair of opposing radial gas flow lines 344, 346 overlying the disk-shaped dielectric window 112 and disposed at right angles to the first pair of radial gas flow lines 340, 342. Connection from the four radial gas flow lines 340, 342, 344, 346 to the dual zone gas injector 300 is provided by a gas flow hub 350 axially coupled to the dual zone gas injector 300.

Referring again to FIG. 11A, a half-circular gas flow channel 353 provides uniform distribution of gas flow from the gas input port 321b to the outer ends of the first pair of radial gas flow lines 340, 342. A quarter-circular gas flow channel 357 provides gas flow from the input port 321b to the midpoint of the half-circular gas flow channel 353. A half-circular gas flow channel 355 provides uniform gas flow from the gas input port 321a to the outer ends of the second pair of radial gas flow lines 344, 346.

Figure 12A:
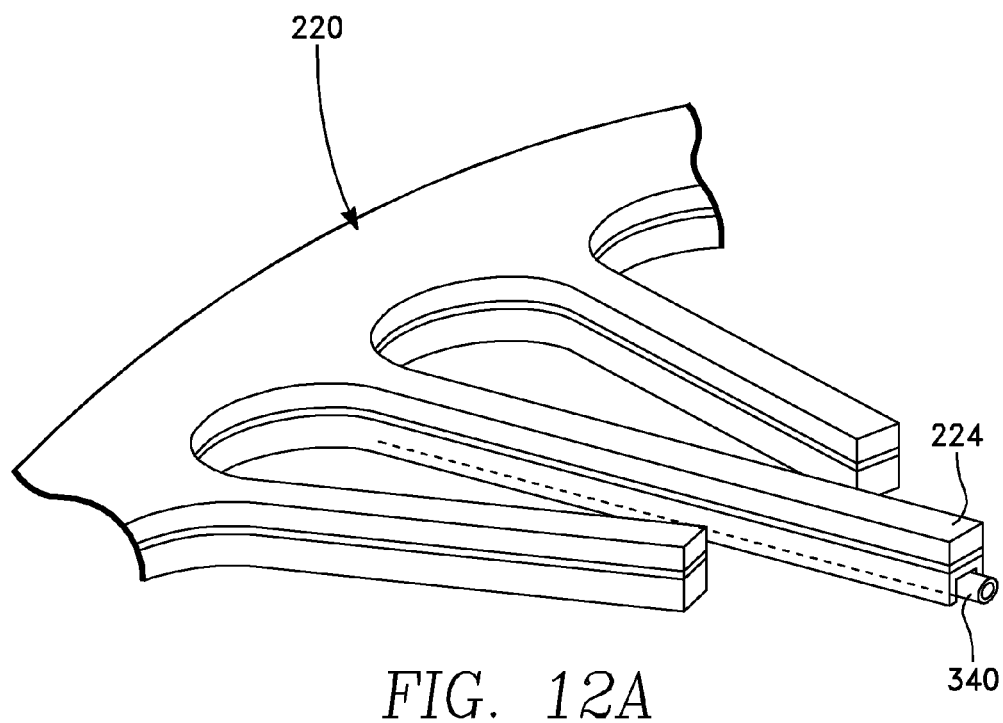
FIG. 12A is an orthographic projection corresponding to a portion of FIG. 12 depicting encasement of a gas flow conduit in a portion of the heater layer of FIG. 8.
Figure 12B:
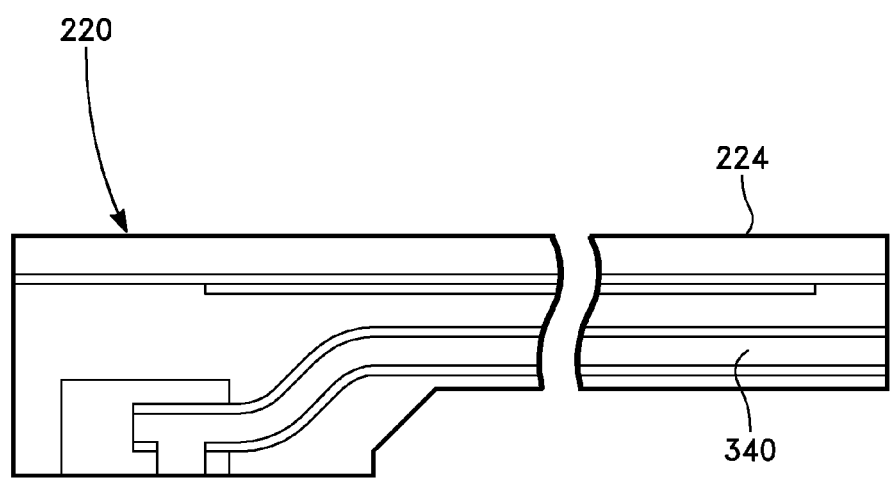
FIG. 12B is a cut-away elevational view corresponding to FIG. 12A.

As depicted in FIGS. 12, 12A and 12B, each of the four radial gas flow lines 340, 342, 344, 346 overlying the disk-shaped dielectric window 112 may be enclosed in a respective one of the radial fingers 224 of the heater layer 220.

Figure 13:
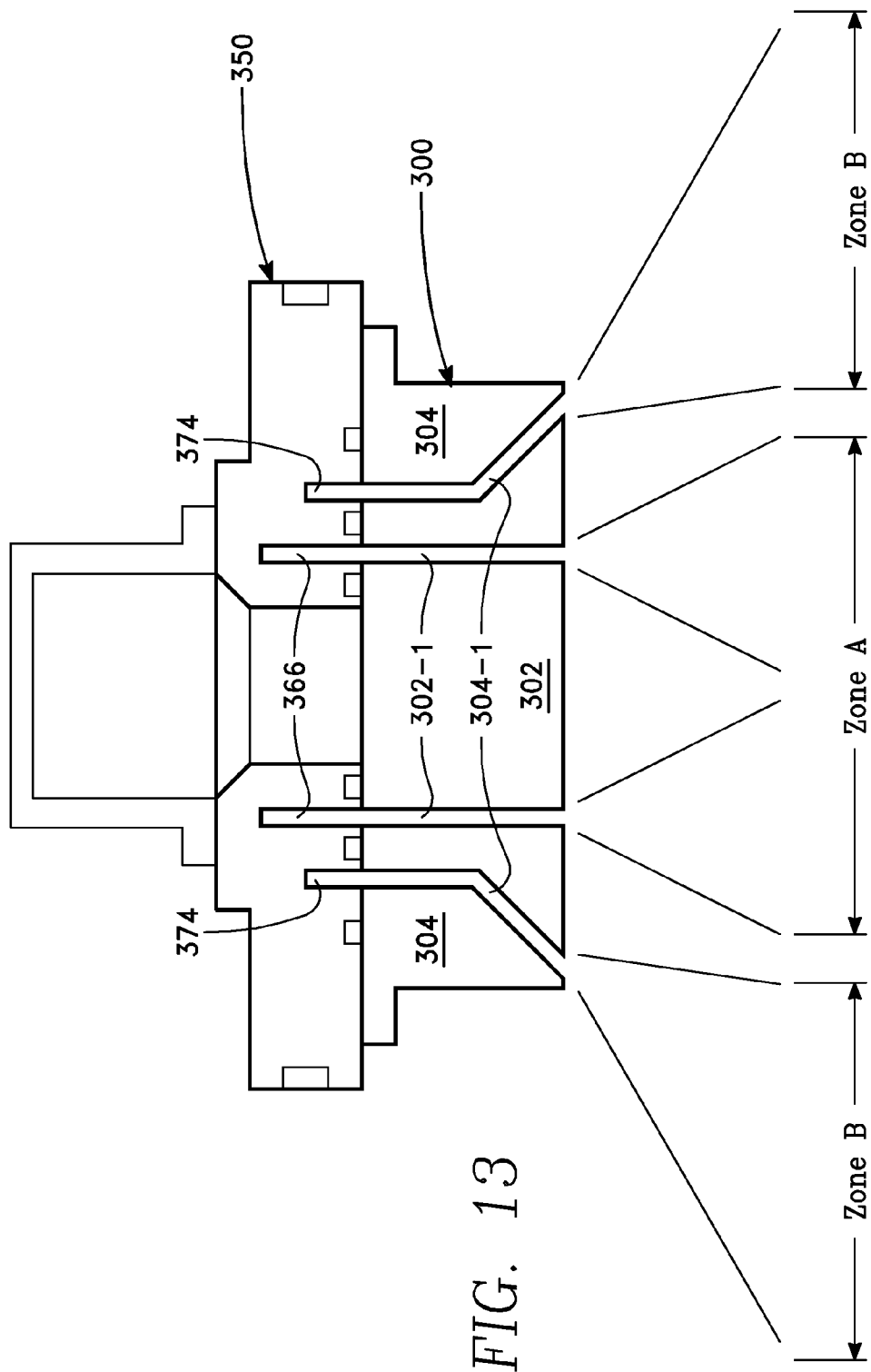
FIG. 13 is an enlarged cut-away view of a center gas disperser of the reactor of FIG. 1.
Figure 14:
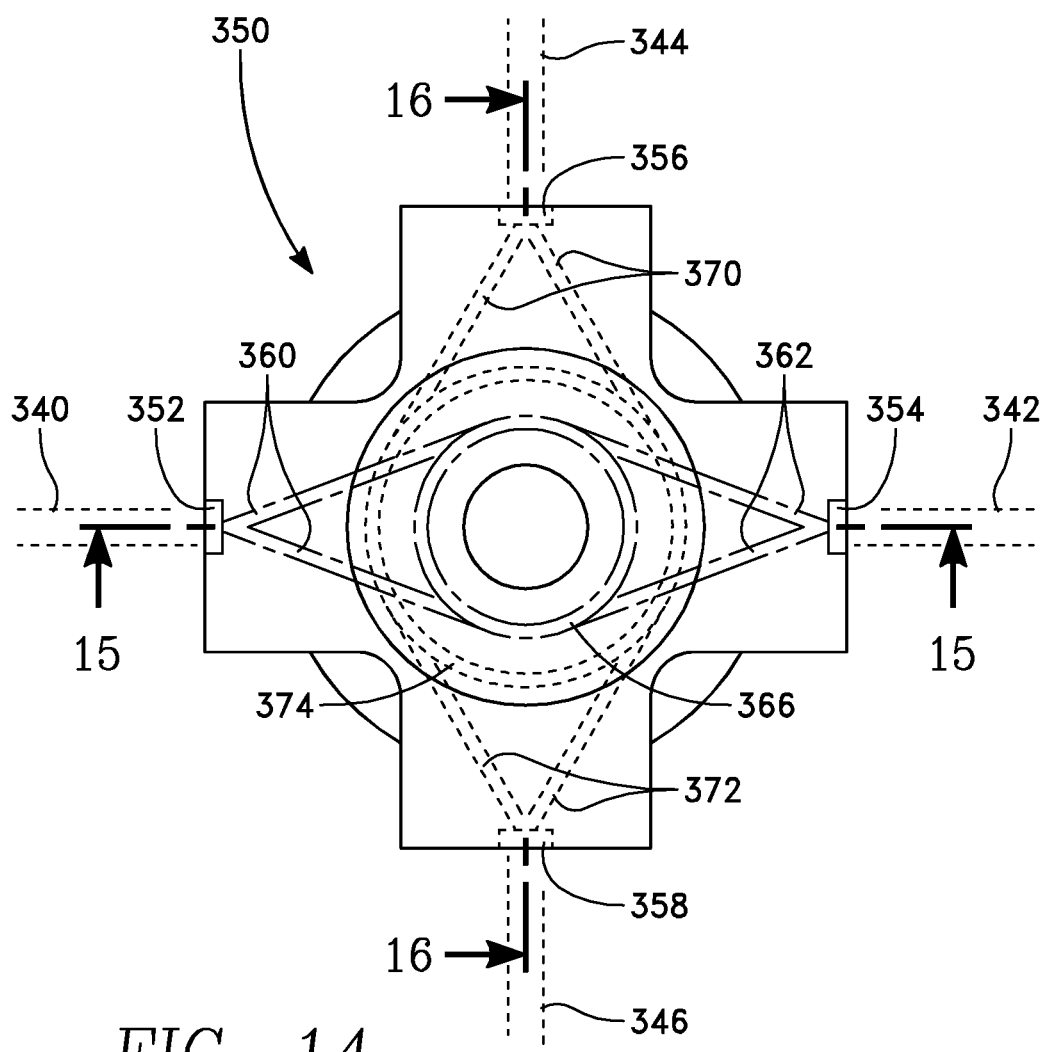
FIG. 14 is a plan view of the center gas disperser of FIG. 13.
Figure 15:
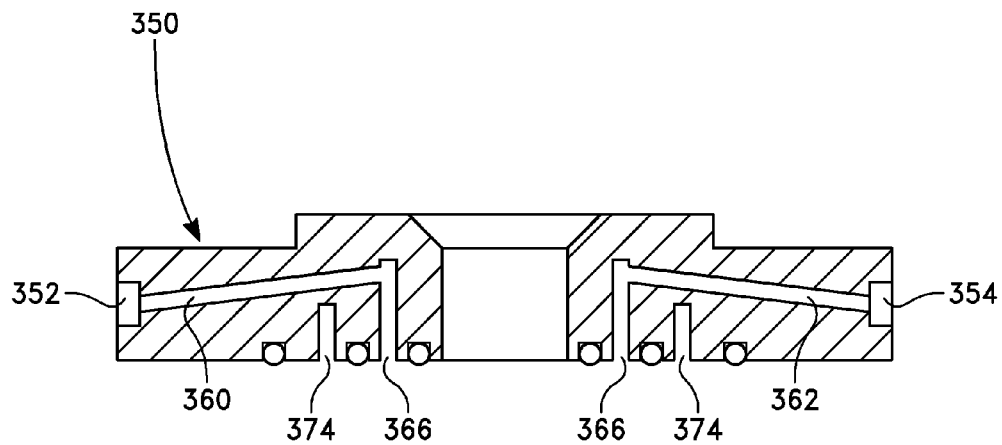
FIG. 15 is a cross-sectional view taken along lines 15-15 of FIG. 14.
Figure 16:
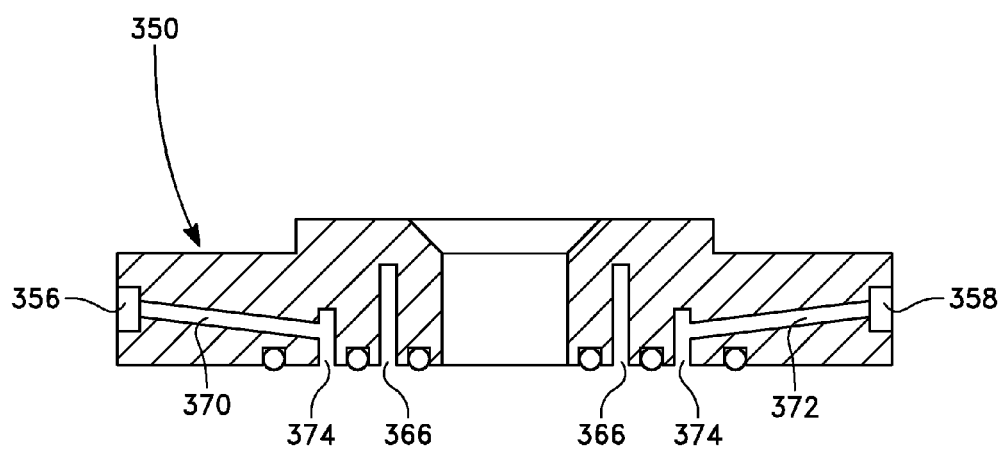
FIG. 16 is a cross-sectional view taken along lines 16-16 of FIG. 14.

As previously described with reference to FIGS. 1 and 12, the gas flow hub 350 provides coupling between the four radial gas flow lines 340, 342, 344, 346 and the dual zone gas injector 300. One example of the dual zone gas injector 300 is depicted in FIG. 13. The dual zone gas injector 300 of FIG. 13 includes a center gas disperser 302 having an axial inner annular channel 302-1 extending axially and dispersing gas to a radially inner zone A, and a middle gas disperser 304 having a slanted middle annular channel 304-1 dispersing gas to a radially outer zone B. The gas flow hub 350 is now described with reference to FIGS. 13, 14, 15 and 16. The hub 350 has four gas inlet ports 352, 354, 356 and 358 oriented at right angles to one another and connectable to the four radial gas flow lines 340, 342, 344, 346 as indicated in dashed line. The gas inlet ports 352 and 354 feed respective pairs of split gas distribution lines 360, 362, respectively, that terminate at four equally spaced points along a circular inner distribution channel 366 that is in registration with the axial inner annular channel 302-1 of the dual zone gas injector 300. The gas inlet ports 356 and 358 feed respective pairs of split gas distribution lines 370, 372, respectively, that terminate at four equally spaced points along a circular middle distribution channel 374 that is in registration with the axial middle annular channel 304-1 of the dual zone gas injector 300.

Figure 11B:
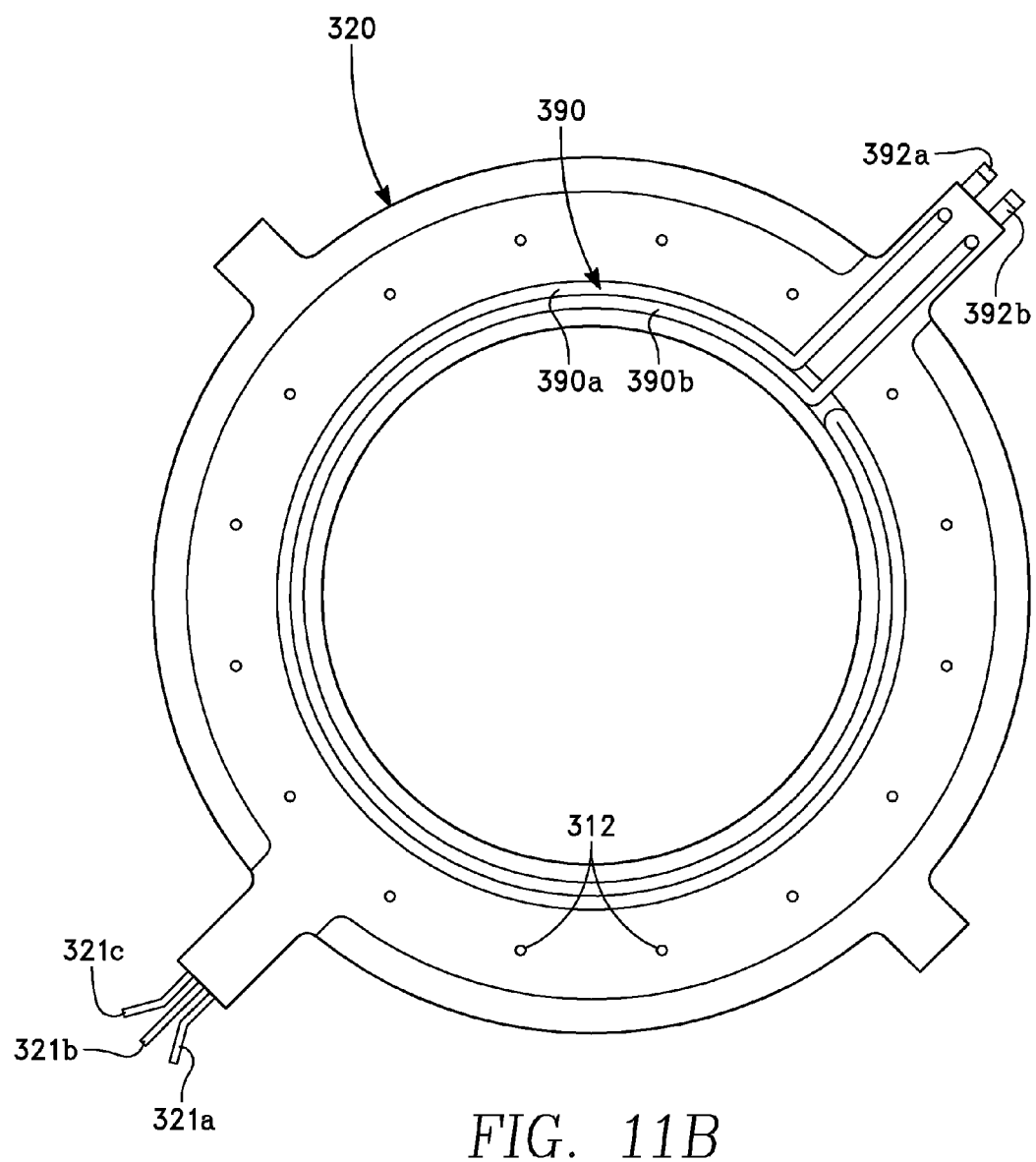
FIG. 11B is a view of an opposite side of the gas flow plate of FIGS. 7 and 11A.

Referring again to the bottom view of FIG. 11B, in one embodiment, optional cooling passages 390 may be provided in the gas flow plate 320, in the form of a circular supply passage 390a and a circular return passage 390b forming a continuous path. External coolant ports 392a and 392b provided connection of the supply and return passages 390a, 390b to an external coolant source (not illustrated in FIG. 11B). Optionally, internal coolant passages may be provided in the outer chamber wall 170 and fed through a coolant input port.

Figure 17:
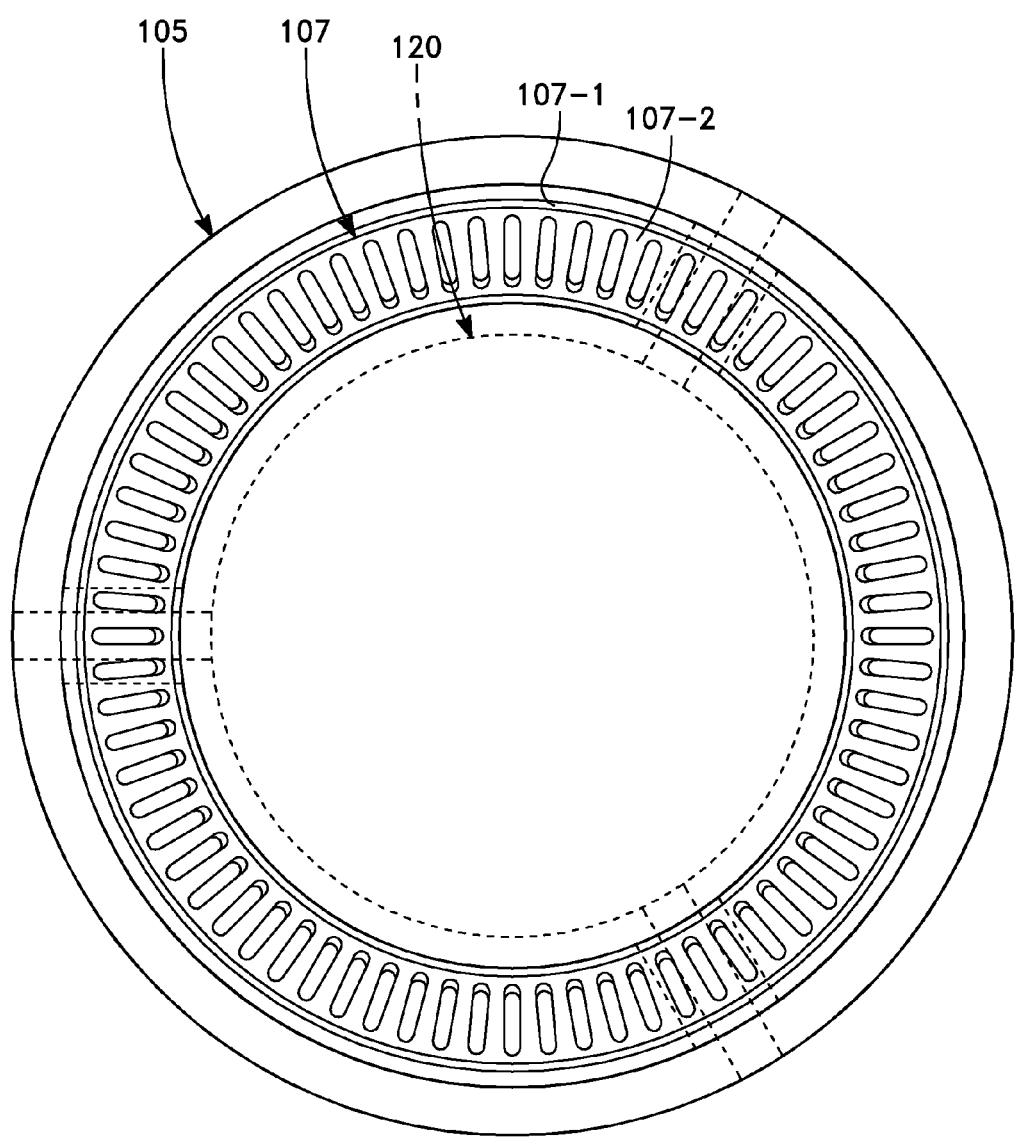
FIG. 17 is a cross-sectional view taken along lines 17-17 of FIG. 1B.
Figure 18:
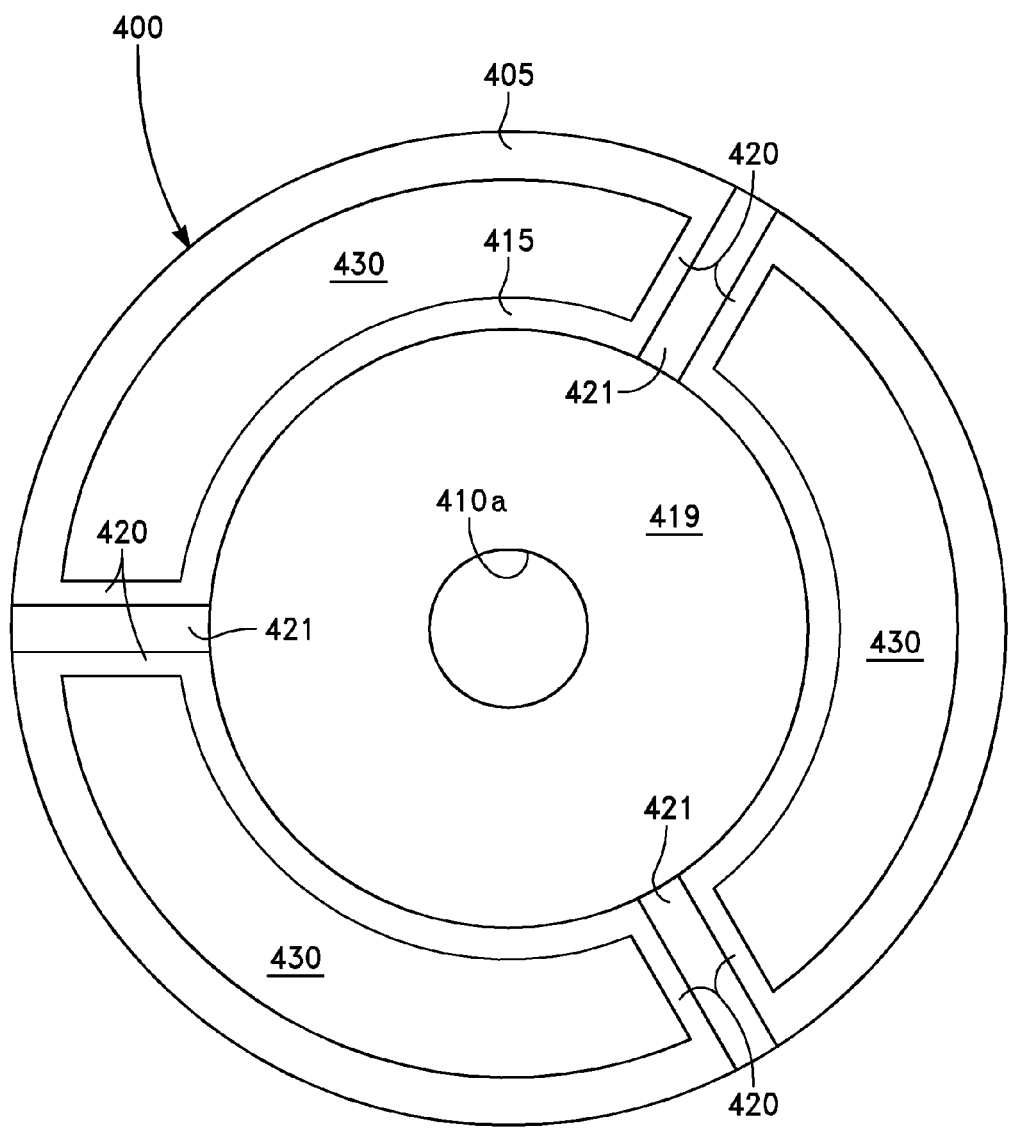
FIG. 18 is a cross-sectional view taken along lines 18-18 of FIG. 1B.

Referring to FIGS. 1 and 1B, the chamber liner 107 is enclosed within a lower chamber body 400 including a cylindrical lower chamber body side wall 405 and a lower chamber body floor 410. The lower chamber body side wall 405 and the lower chamber body floor 410 enclose an evacuation region 411. The chamber liner 107 includes an upper cylindrical section 107-1 and a lower annular grid 107-2 in the form of an inverted truncated cone. A vacuum pump 440 is disposed in a vacuum pump opening 410a in the floor 410 and is centered relative to the axis of symmetry of the side wall 105. A containment wall 415 coaxial with the workpiece support 115 and a flexible bellows 417 extending between the pedestal 120 and the containment wall 415 enclose the workpiece support 115 in an internal central space 419. The central space 419 is isolated from the volume evacuated by the vacuum pump 440, including the evacuation region 411 and the processing region 101. Referring to FIGS. 1B, 17 and 18, there are three hollow radial struts 420 defining radial access passages 421 spaced at 120 degree intervals extending through the chamber body side wall 405 and providing access to the central space 419. Three axial exhaust passages 430 are defined between the three radial struts 420. Different utilities may be provided through different ones of the radial access passages 421, including the RF power cable 132 connected to the electrode 130, heater voltage supply lines connected to heater elements in the workpiece support 115, an electrostatic chucking voltage supply line connected to the electrode 130, coolant supply lines and helium supply lines for backside helium gas channels in the workpiece support surface 121, for example. A workpiece support lift actuator 450 is fixed with respect to the chamber body and moves the workpiece support 115 axially. The workpiece support lift actuator 450 may be used to vary the distance between the workpiece 122 and the lid assembly 110. Varying this distance varies the distribution of plasma ion density. Movement of the lift actuator may be used to improve uniformity of distribution of process (e.g., etch) rate across the surface of the workpiece 122. The lift actuator 450 may be controlled by the user through a programmable controller, for example.

The axially centered exhaust assembly including the vacuum pump opening 410a and the axial exhaust passages 430 avoids asymmetries or skew in processing distribution across the workpiece 122. The annular grid 107-2 masks the processing region 101 from the discontinuities or effects of the radial struts 420. The combination of the axially centered exhaust assembly with the symmetrical distribution of RF current flow below the ground plate 184 minimize skew effects throughout the processing region 101, and enhance process uniformity in the processing region 101.

Figure 19:
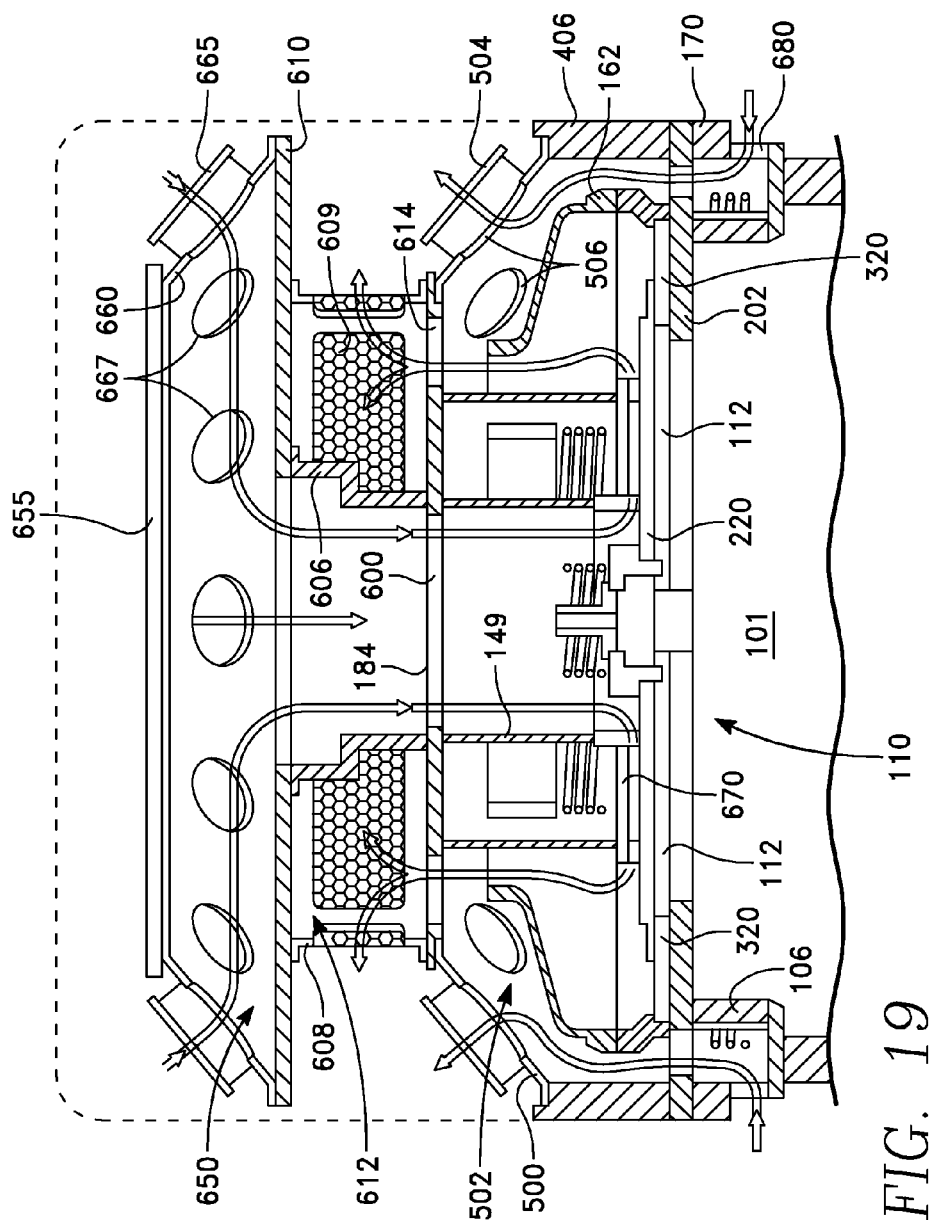
FIG. 19 is a view corresponding to FIG. 1A and depicting cooling air flow paths.

FIG. 19 depicts cooling air flow through the upper section 20 of FIG. 1A. Referring to FIGS. 1A and 19, a chamber body side wall 406 surrounds the lid assembly 110. A lower plenum wall 500 in the form of a truncated cone, for example, is mounted between the top edge of the chamber body side wall 406 and the peripheral edge of the ground plate 184, to enclose a lower plenum 502. A circular array of exhaust fans 504 are mounted in respective openings 506 in the lower plenum wall 500.

The ground plate 184 has a center opening 600 that is co-extensive with the inner ground shield 149. A cylindrical plenum center wall 606 is coextensive with the center opening 600. A plenum plate 610 overlies the plenum center wall 606. A return chamber 612 is enclosed between a return chamber side wall 608, the plenum plate 610, the ground plate 184 and the center wall 606. The return chamber side wall 608 includes air flow screen sections 609. Openings 614 through the ground plate 184 permit air flow between the lower plenum 502 and the return chamber 612.

An upper plenum 650 is enclosed between a top plate 655 and the plenum plate 610 by an upper plenum side wall 660 in the form of a truncated cone. Plural intake fans 665 are mounted at respective openings 667 in the upper plenum side wall 660.

The intake fans 665 draw air into the upper plenum 650 which flows down through the central opening formed by the center wall 606, the ground plate opening 600 and the inner ground shield 149. An annular air flow plate 670 overlying the disk-shaped dielectric window 112 confines the air flow between the plate 670 and the window 112. This air may flow through the apertures 226 of the Faraday shield or heater layer 220 of FIG. 8, for example. Alternatively (or in addition), the air may be confined in a gap between the air flow plate 670 and the window 112. Downward air flow through the inner ground shield 149 enters the space within each aperture 226 through a central opening of the plate 670 and flows radially outwardly over the disk-shaped dielectric window 112 and enters the lower plenum 502. From the lower plenum 502, the air escapes into the return chamber 612, from which it may exit through the screen sections 609 of the return chamber side wall 608. Thus, the intake fans 665 provide cooling for the disk-shaped dielectric window 112.

The exhaust fans 504 provide cooling for the cylindrical dielectric side window 106. The exhaust fans 504 draw air through intake ports 680 in the outer chamber wall 170 and past the cylindrical dielectric side window 106. By operating the intake fans 665 independently from the exhaust fans 504, the different heat loads on the different dielectric windows 106 and 112 may be compensated independently, for accurate temperature control of each window.

Figure 20A:
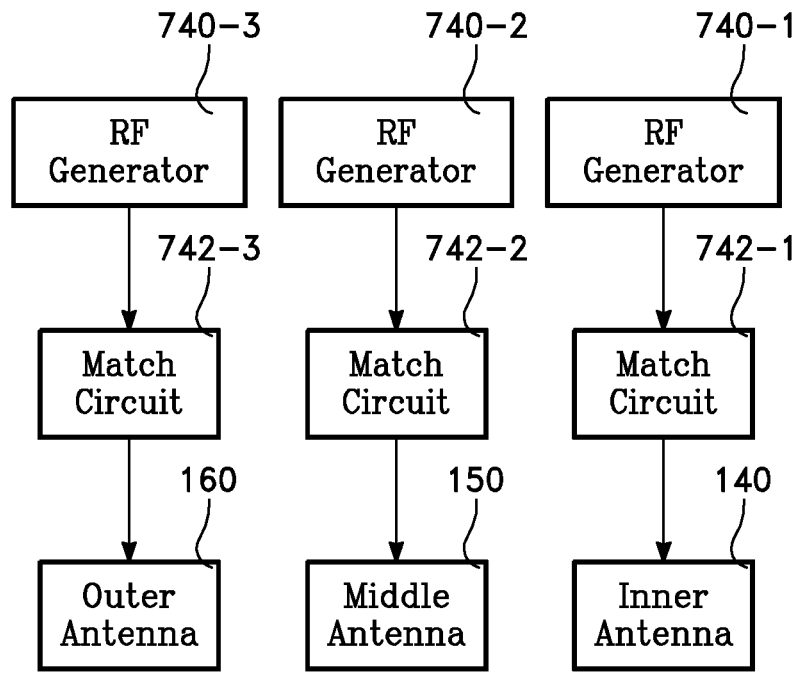
FIGS. 20A and 20B are block diagrams of alternative embodiments of RF power sources for the RF power applicators of FIG. 1A.
Figure 20B:
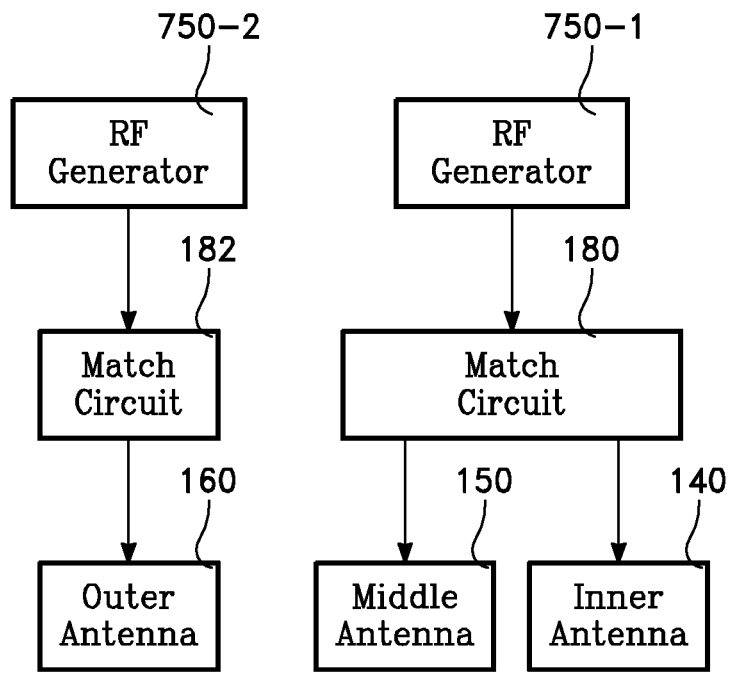

FIG. 20A depicts one embodiment of an RF source for the three coil antennas 140, 150, 160, the RF source having independent RF generators 740-1, 740-2, 740-3, and RF impedance matching networks 742-1, 742-1, 742-3 for the respective coil antennas 140, 150, 160. FIG. 20B depicts an embodiment in which the inner and middle coil antennas 140, 150 are driven from a single RF generator 750-1 through an RF impedance matching network 180 having dual outputs. The dual output RF impedance matching network 180 may facilitate differential control of the power levels applied to the inner and middle coil antennas 140, 150. The outer coil antenna 160 is driven by an RF generator 750-2 through an RF impedance matching network 182. The dual output RF impedance matching network 180 functions as two separate RF power sources, so that there are a total of three RF power sources in the system. In each of the foregoing embodiments, the RF impedance matching networks may be disposed on the top plate 655 as depicted in FIG. 1A.

Figure 21:
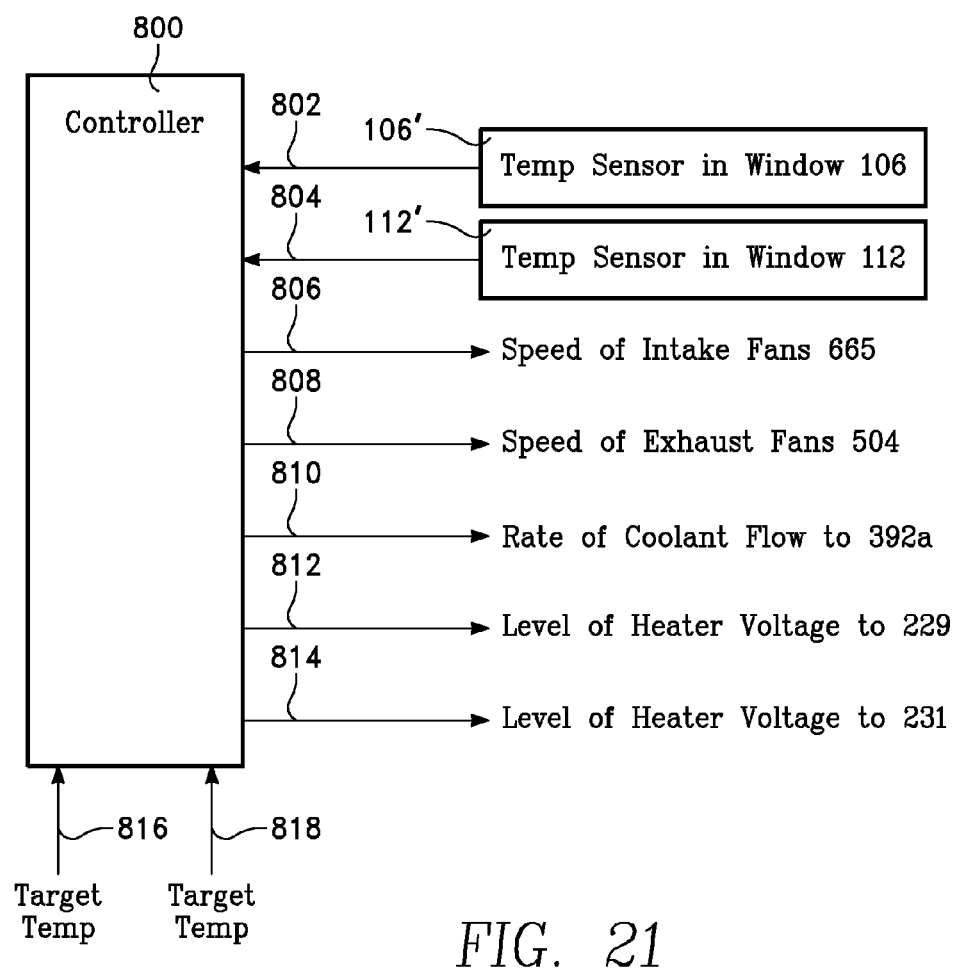
FIG. 21 is a block diagram of a control system controlling the reactor of FIG. 1.

FIG. 21 depicts a control system for controlling the plasma reactor of FIG. 1. The control system is responsive to temperature sensors at different locations within the plasma reactor, such as a temperature sensor 106' at or in the cylindrical dielectric side window 106, and a temperature sensor 112' at or in the disk-shaped dielectric window 112. The control system includes a programmable controller 800 which may be implemented as a microprocessor, for example. The controller 800 has an input 802 for receiving the output of the temperature sensor 106' and an input 804 for receiving the output of the temperature sensor 112'. The controller 800 has independent command outputs, including an output 806 governing the speed of the intake fans 665, an output 808 governing the speed of the exhaust fans 504, an output 810 governing the flow rate of coolant to the coolant port 392a in the gas flow plate 320, an output 812 governing the power level to the electric heater or electrically resistive element 229 near the dielectric window 112, and an output 814 governing the power level to the electric heater 231 at the cylindrical dielectric side window 106.

The controller 800 in one embodiment is programmed to govern the outputs 808-814 in response to the inputs 802, 804 to maintain the windows 106, 112 at respective target temperatures that may be furnished by a user to controller inputs 816 and 818. The controller 800 may be programmed to operate in the manner of a feedback control loop to minimize the difference between the controller input 816 and the sensor input 802, and to minimize the difference between the controller input 818 and the sensor input 804.

As described above, some of the advantageous effects of various ones of the foregoing embodiments include symmetrical distribution of RF power to the coil antennas for enhanced plasma distribution symmetry. Shielding of the coils from asymmetrical RF current feed structures reduces skew effects in plasma distribution. Shielding of the coil antenna feeds from one another enhances independent control of the coil antennas, for superior control of plasma density distribution. Symmetrical chamber exhaust in combination with the symmetrical coil antennas provides a high density plasma source with symmetrical plasma distribution. Separate dielectric windows for different RF coils enables independent thermal control of the different dielectric windows. Separately supporting the different dielectric windows at or over the processing region enables the chamber diameter to be increased beyond the diameter of each individual dielectric window, facilitating a large increase in chamber diameter. The moveable workpiece support electrode in combination with symmetrical coil antenna(s) allows superior control over center-to-edge plasma density distribution with a minimized asymmetrical non-uniformity component. The moveable workpiece support electrode in combination with symmetrical coil antenna(s) and in further combination with the symmetrical chamber exhaust allows even better control over center-to-edge plasma density distribution with minimized asymmetrical non-uniform component.

FIGS. 22-27 depicts an RF feed structure which can have triangular symmetry, in one embodiment. The embodiment of FIGS. 22-27 is a modification of the embodiment of FIG. 1A and includes elements described above with reference to FIG. 1A, for which identical reference numerals are used. The embodiment of FIGS. 22-27 includes a ceiling plate 900 overlying a cylindrical side wall 902 above the top plate 655. Three RF power terminals 904a, 904b, 904c are provided at the ceiling plate 900, and may be housed in a connection module 904 held in the ceiling plate 900. A center RF connection rod 906 is connected between the RF power terminal 904a and the RF current distributor 142 for the inner coil 140.

RF power for the middle coil 150 is distributed to the four axial RF feed rods 158 by a middle RF distribution ring 908 having four radial arms 910a-910d (FIG. 26) connected to the tops of the respective RF feed rods 158. The middle RF distribution ring 908 is disposed above and spaced from the conductive ground plate 184. A middle RF connection rod 912 is connected between the RF power terminal 904b and the middle RF distribution ring 908.

The ground plate 184 has a center opening 600. In one embodiment, the center opening 600 may be covered by a conductive grill 970 that permits air flow through the center opening 600.

RF power for the outer coil 160 is distributed to the eight axial RF feed rods 168 by an outer distribution cylinder 914. In one embodiment, the outer distribution cylinder 914 is coaxial with the axis of symmetry of the coil antennas 140, 150 and 160. The outer distribution cylinder 914 has a top portion 914a (FIG. 25) above the top plate 655 and a bottom portion 914b below the plenum plate 610. Eight radial arms 915a-915h (FIG. 25) extend from the bottom 914b of the outer distribution cylinder 914 to respective ones of the eight axial RF feed rods 168. An outer RF connection rod 916 (FIGS. 24 and 25) is connected between the top 914a of the outer distribution cylinder 914 and the RF power terminal 904c. The outer distribution cylinder 914 is hollow in one embodiment and surrounds the center RF connection rod 906 and the middle RF connection rod 912. The outer distribution cylinder 914 extends through openings 610a, 655a in the grounded plates 610 and 655 respectively. The diameters of the openings 610a and 655a are sufficient to provide gaps 611, 656, respectively, between the grounded plates 610, 655 and the outer distribution cylinder 914. In one embodiment, the gaps 611 and 656 are sufficiently wide to prevent electrical discharge or breakdown at operating (e.g., atmospheric) pressure, given the RF voltage supplied at the RF power terminal 904c.

The bottom 914b of the outer distribution cylinder 914 is at an axial location above the middle RF distribution ring 908. In one embodiment, the outer distribution cylinder 914 and the middle RF distribution ring 908 are coaxial and axially separated from one another, and may be of the same diameter. In one embodiment, the middle RF distribution ring 908 fits between the bottom 914b of the outer distribution cylinder 914 and the grounded plate 184. The middle RF distribution ring 908 is separated from the bottom 914b of the outer distribution cylinder 914 and from the ground plate 184. In one embodiment, the axial length of the middle RF distribution ring 908 is less than the axial distance between the bottom 914b of the outer cylinder 914 and the ground plate 184.

Figure 24:
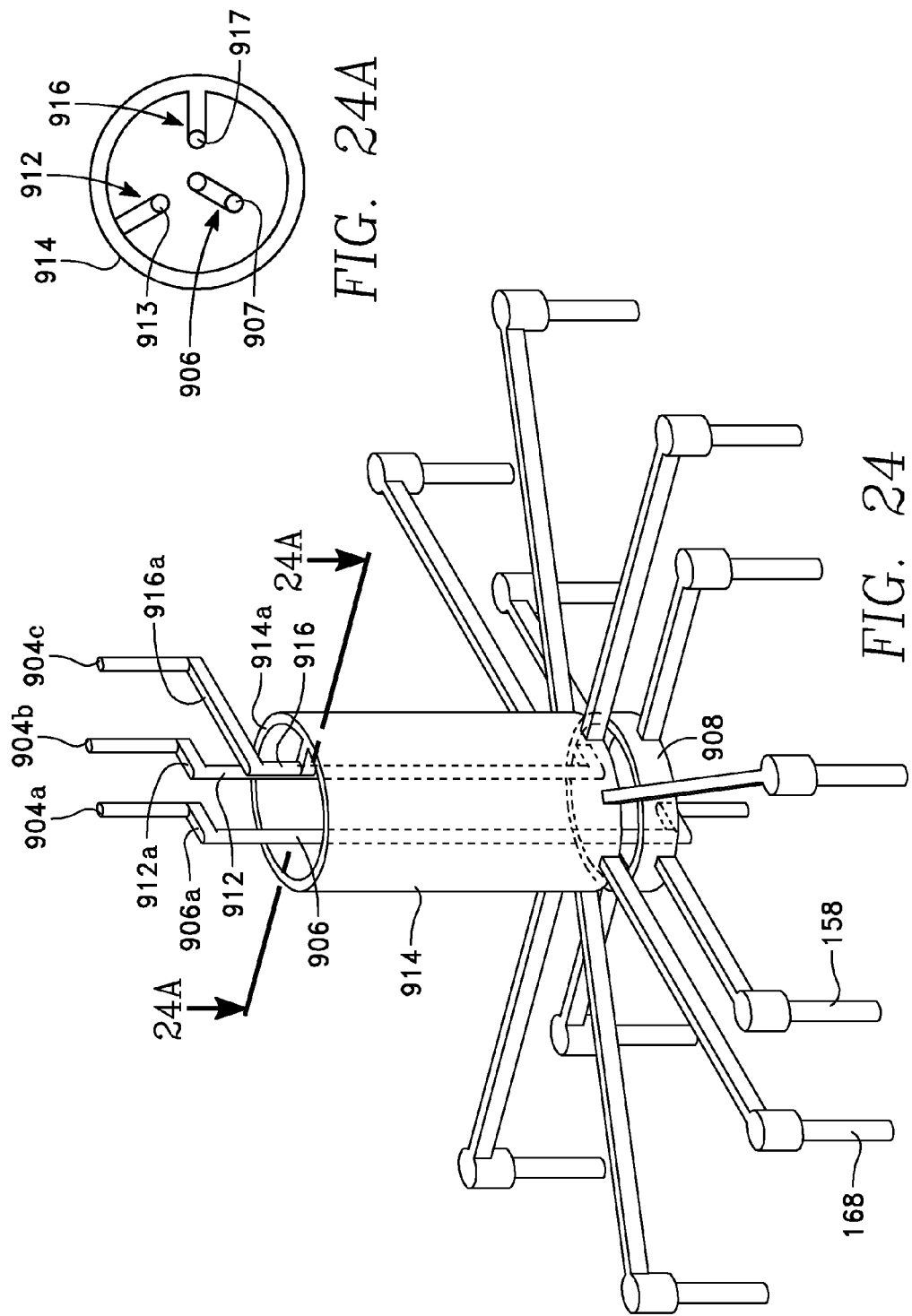
FIG. 24 depicts an assembly including a middle coil RF feed and an outer coil RF feed of FIG. 22
Figure 25:
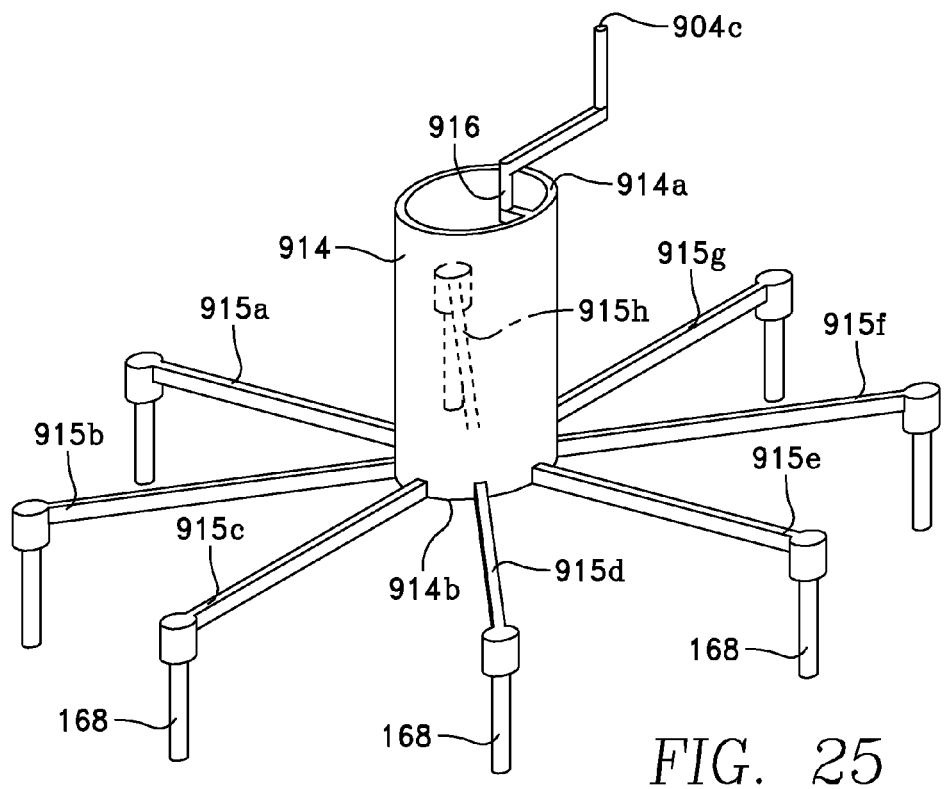
FIG. 25 depicts the outer coil RF feed of FIG. 22.
Figure 26:
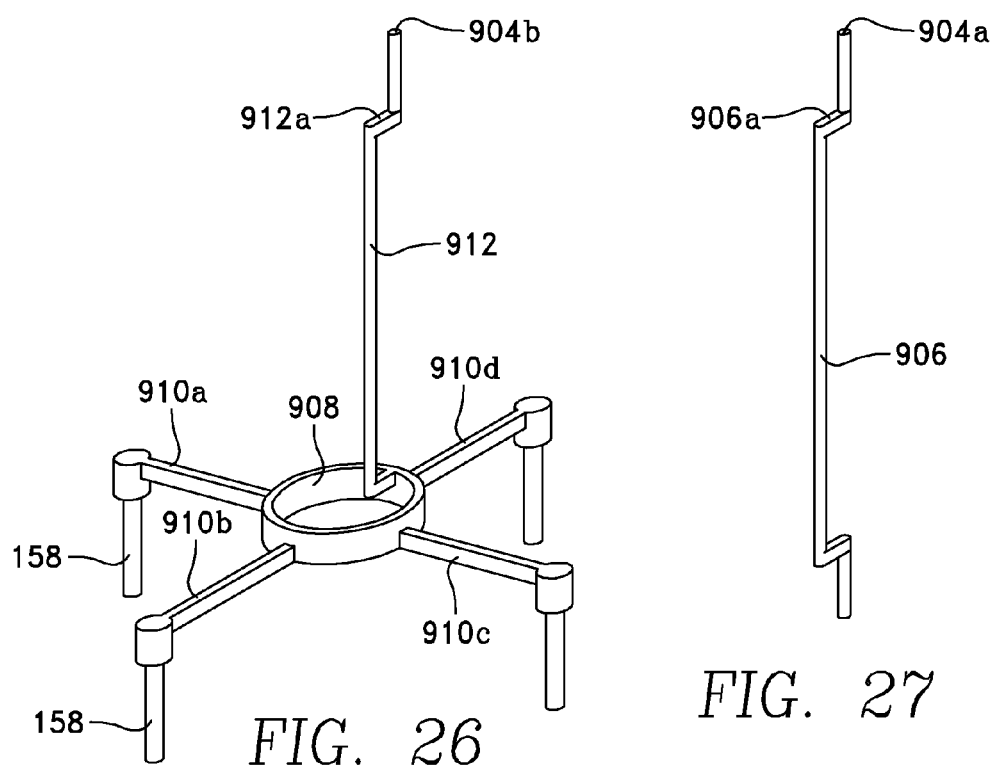
FIG. 26 depicts the middle coil RF feed of FIG. 22.
Figure 27:
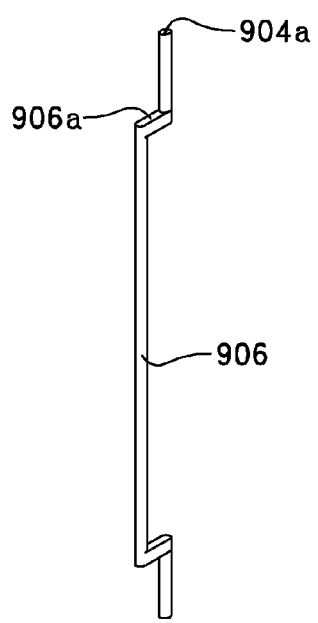
FIG. 27 depicts the inner coil RF feed of FIG. 22.
Figure 28:
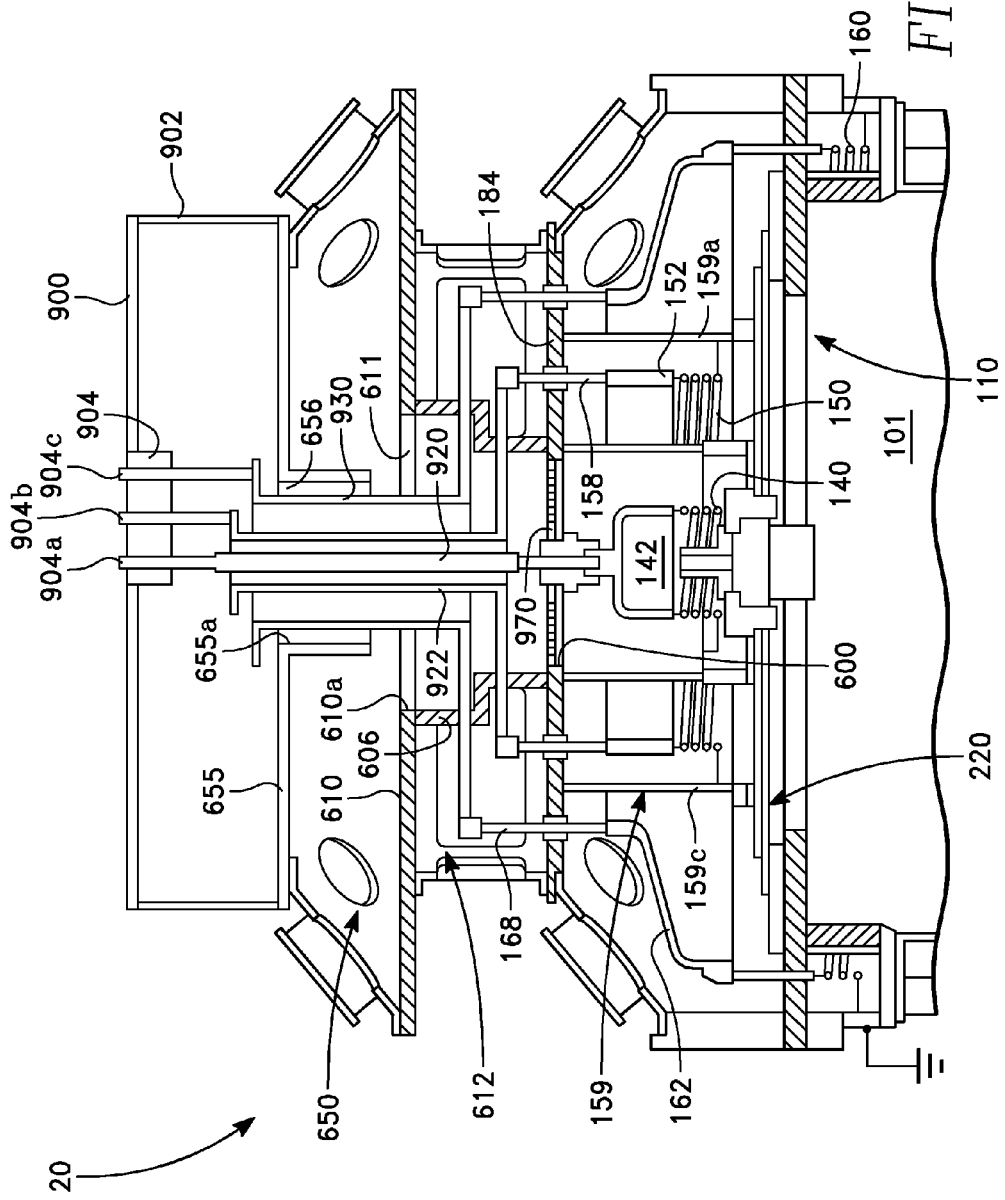
FIG. 28 is a cross-sectional elevational view of a further embodiment in which RF feeds to the coil antennas have coaxial symmetry.
Figure 29:
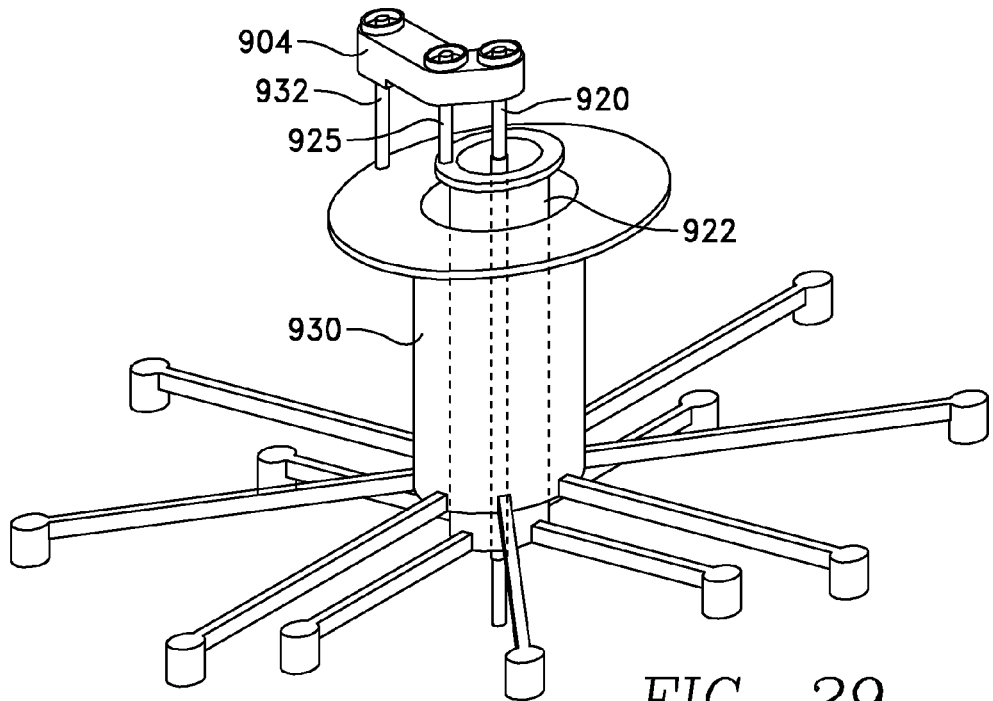
FIG. 29 depicts an assembly including a middle coil RF feed and an outer coil RF feed of FIG. 28.
Figure 30:
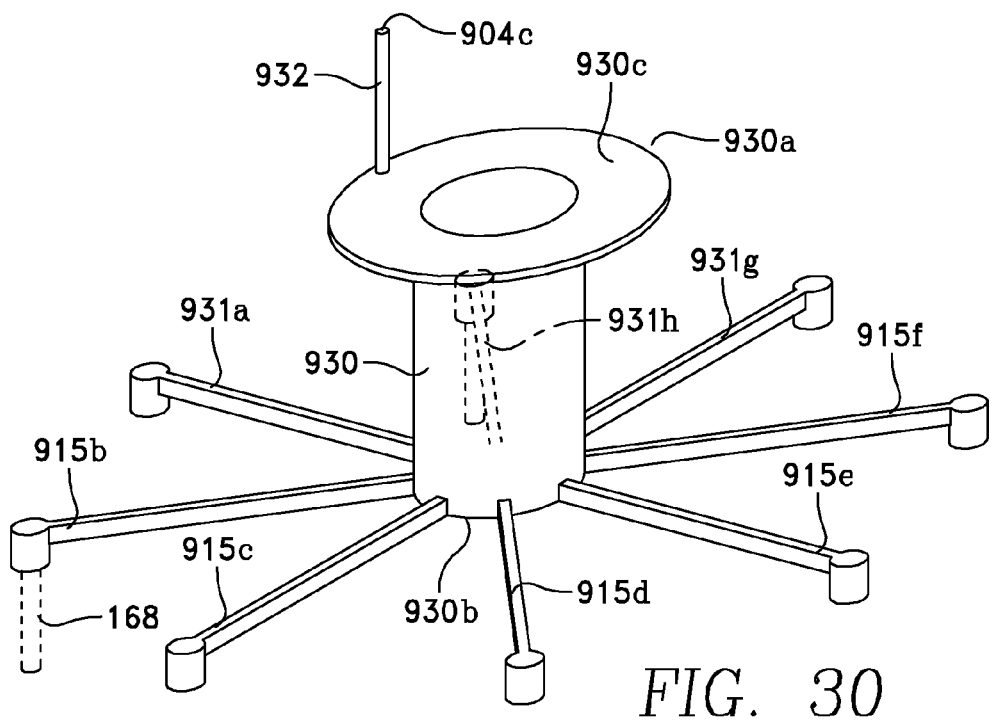
FIG. 30 depicts an assembly including an outer coil RF feed of FIG. 28.
Figure 31:
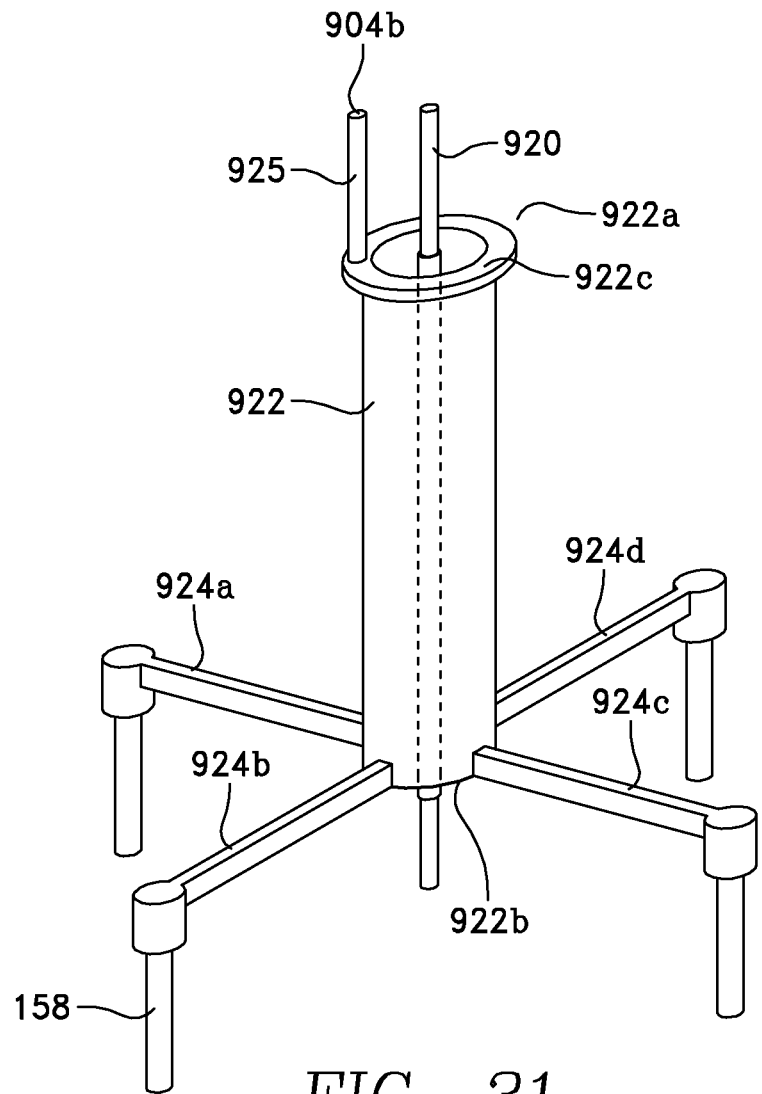
FIG. 31 depicts an assembly including a middle coil RF feed of FIG. 28.

In one embodiment, the edge of the top portion 914a of the outer distribution cylinder 914 lies adjacent a radial plane coinciding with section line 24A-24A of FIG. 24. The three RF connection rods 906, 912 and 916 extend axially and intersect the radial plane of the top edge of the outer distribution cylinder 914 at three points 907, 913 and 917 (FIG. 24A) respectively. In one embodiment, the three points of intersection 907, 913 and 917 are symmetrically arranged as the vertices of an equilateral triangle, providing a triangular symmetry within the outer distribution cylinder 914. In one embodiment, the RF connection rods 906, 912 and 916 have radial transition sections 906a, 912a and 916a, respectively, that locate the top ends of the rods 906, 912 and 916 in registration with respective ones of the RF power terminals 904a, 904b and 904c. The radial transition sections 906a, 912a and 916a are above the radial plane coinciding with the section line 24A-24A.

FIGS. 28-31 depict a modification of the embodiment of FIGS. 22-27, in which, in one embodiment, the RF feed structure has coaxial symmetry. A center RF connection rod 920 is connected between the RF power terminal 904a and the RF current distributor 142 for the inner coil antenna 140. In one embodiment, the center RF connection rod 920 is straight and coincides with the axis of symmetry of the inner coil antenna 140.

In the embodiment of FIGS. 28-31, RF power for the middle coil 150 is distributed to the four axial RF feed rods 158 by a middle RF distribution tube 922. The middle RF distribution tube 922 is hollow and cylindrical in one embodiment. The middle RF distribution tube 922 has a top portion 922a (FIG. 31) above the top plate 655 and a bottom portion 922b below the plenum plate 610. Four radial arms 924a-924d extend radially outwardly from the bottom portion 922b of the middle RF distribution tube 922 to the tops of the respective RF feed rods 158. In one embodiment, the top portion 922a of the middle RF distribution tube 922 has an annular flange 922c extending radially outwardly from the RF distribution tube 922. An axial middle RF connection rod 925 mounted on the annular flange 922c extends upwardly to the RF power terminal 904b. In one embodiment, the middle RF distribution tube 922 surrounds and is coaxial with the center RF connection rod 920.

In the embodiment of FIGS. 28-31, RF power for the outer coil 160 is distributed to the eight axial RF feed rods 168 by an outer distribution cylinder 930. In one embodiment, the outer distribution cylinder 930 is hollow and is coaxial with the axis of symmetry of the coil antennas 140, 150 and 160.

The outer distribution cylinder 930 has a top portion 930a (FIG. 30) above the top plate 655 and a bottom portion 930b below the plenum plate 610. Eight radial arms 931a-931h extend from the bottom portion 930b of the outer distribution cylinder 930 to respective ones of the eight axial RF feed rods 168. In one embodiment, the top portion 930a of the outer distribution cylinder 930 has an annular flange 930c lying in a radial plane and extending radially outwardly from the outer distribution cylinder 930. In one embodiment, the annular flange 930c is axially below the level of the annular flange 922c of the middle RF distribution tube 922.

An outer connection rod 932 extends upwardly from the annular flange 930*c* to the RF power terminal 904*c*. The outer distribution cylinder 930 surrounds and is coaxial with the middle RF distribution tube 922. The outer distribution cylinder 930 extends through openings 610*a*, 655*a* in the grounded plates 610 and 655 respectively. The diameters of the openings 610*a* and 655*a* are sufficient to provide respective gaps 611, 656 between the respective plates 610, 655 and the outer distribution cylinder 930. In one embodiment, the gaps 611 and 656 are sufficiently wide to prevent electrical discharge or breakdown at operating (e.g., atmospheric) pressure, given the RF voltage supplied at the RF power terminal 904*c*.

Figure 32:
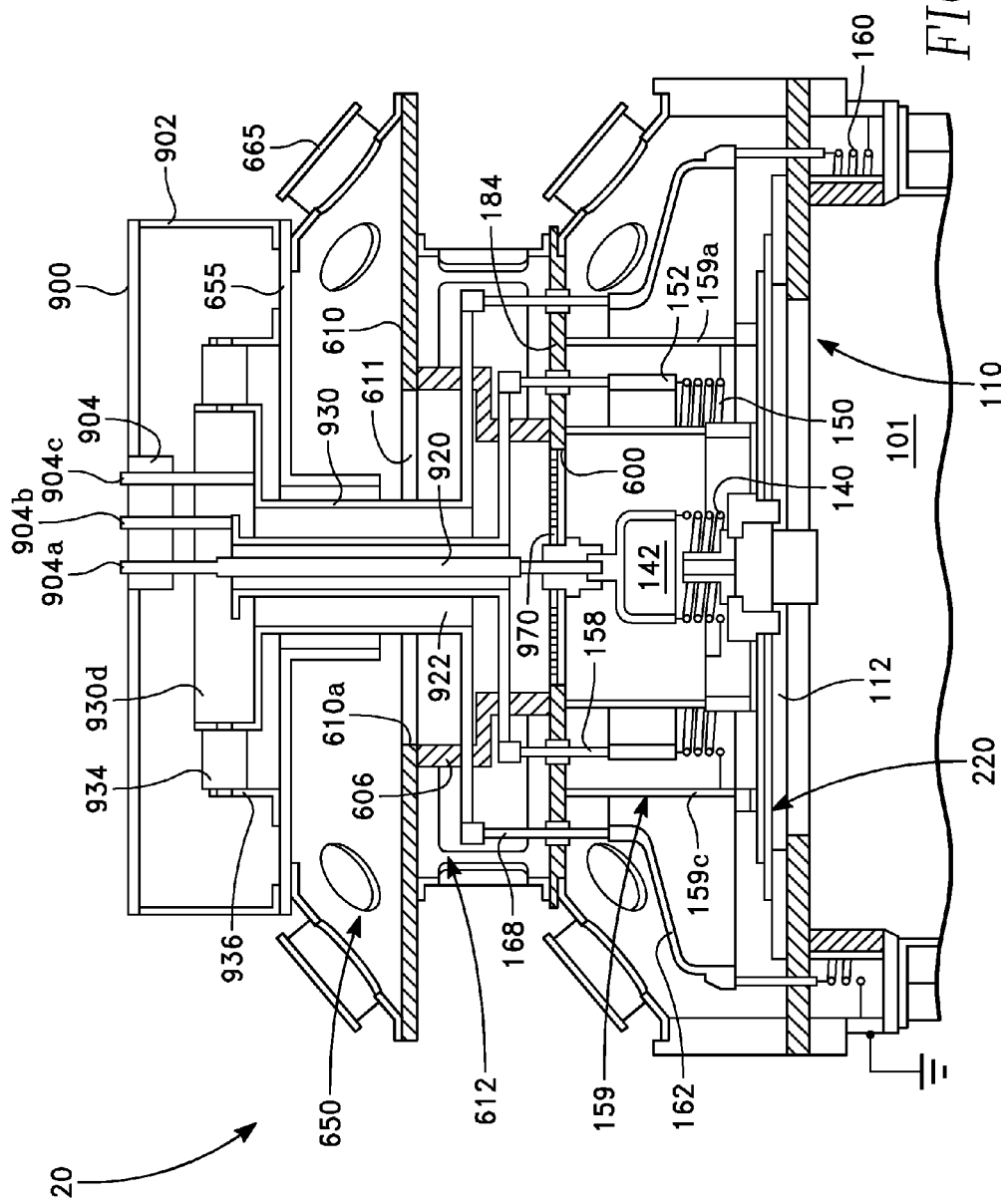
FIG. 32 is a cross-sectional elevational view of a further embodiment with coaxial RF feeds to the coil antennas having a symmetrical array of capacitors connected in parallel with the outer coil RF feed.
Figure 33:
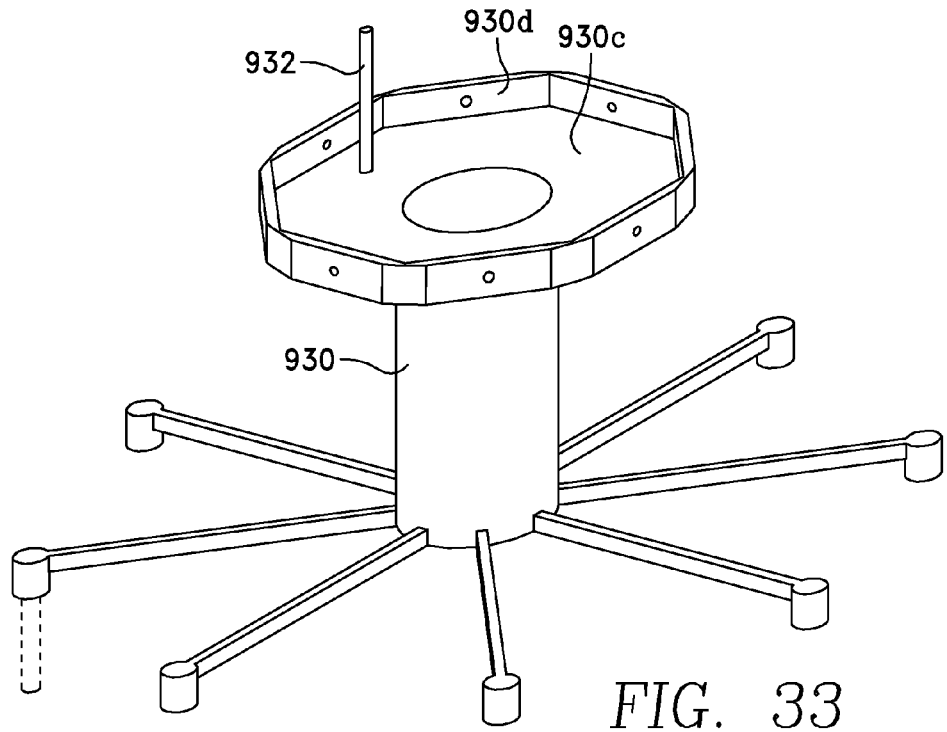
FIG. 33 depicts an assembly including an outer coil RF feed of FIG. 32.
Figure 34:
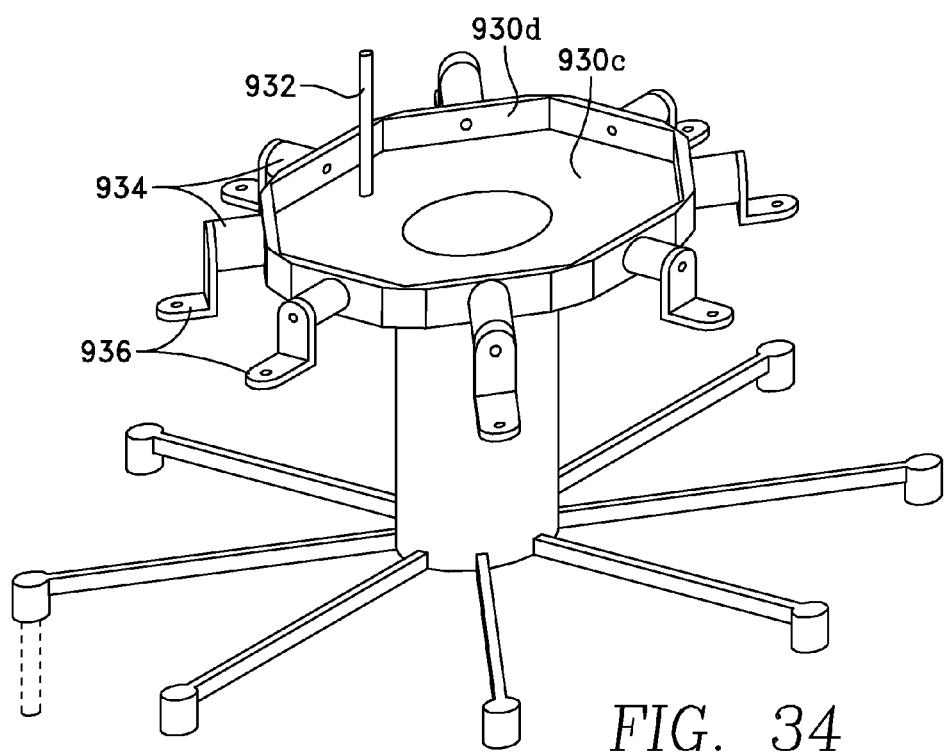
FIG. 34 depicts the assembly of FIG. 33 further depicting the array of capacitors of FIG. 32.

FIGS. 32-34 depict a modification of the embodiment of FIGS. 28-31 in which spaced-apart capacitors 934 are connected between the outer distribution cylinder 930 and the top plate 655. The capacitors 934 are connected in parallel and uniformly spaced in one embodiment and their capacitance is selected to provide resonance at the frequency of the RF power applied to the outer coil 160. The effect of such resonance is to enhance uniformity of RF power distribution in the RF feed structure including the outer distribution cylinder 930. In one embodiment, an axial lip 930*d* extends upwardly from the outer edge of the annular flange 930*c*, and is polygonal in shape, having plural flat faces on which respective ones of the capacitors 934 are mounted and connected to the axial lip 930*d*. A right angle bracket 936 is provided for connecting the outwardly facing end of each capacitor 934 to the top plate 655. In the illustrated embodiment, there are eight capacitors 934 and the axial lip 930*d* has eight faces, although any suitable number of capacitors and faces may be employed.

Figure 22:
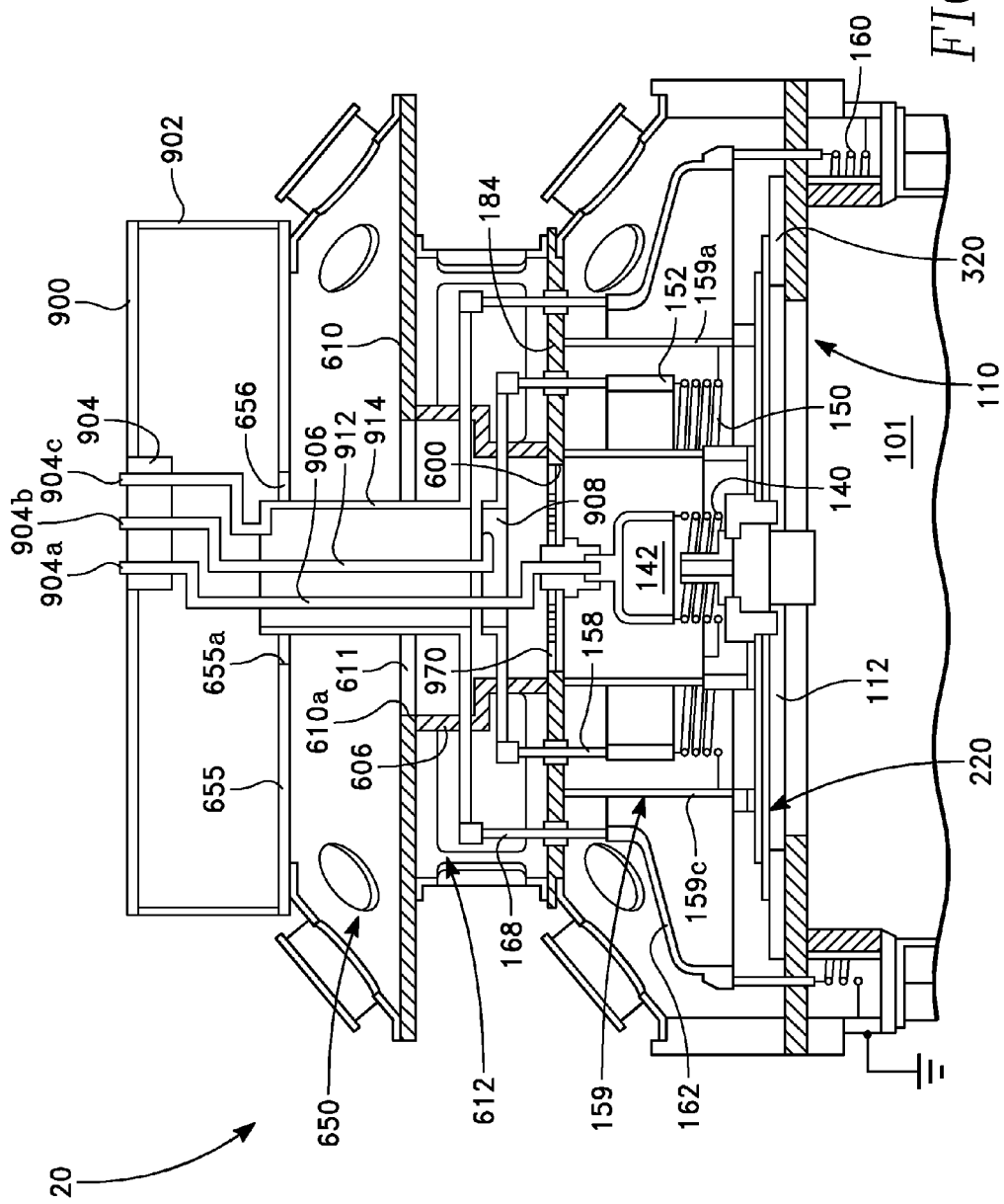
FIG. 22 is a cross-sectional elevational view of a further embodiment in which RF feeds to the coil antennas have triangular symmetry.
Figure 23:
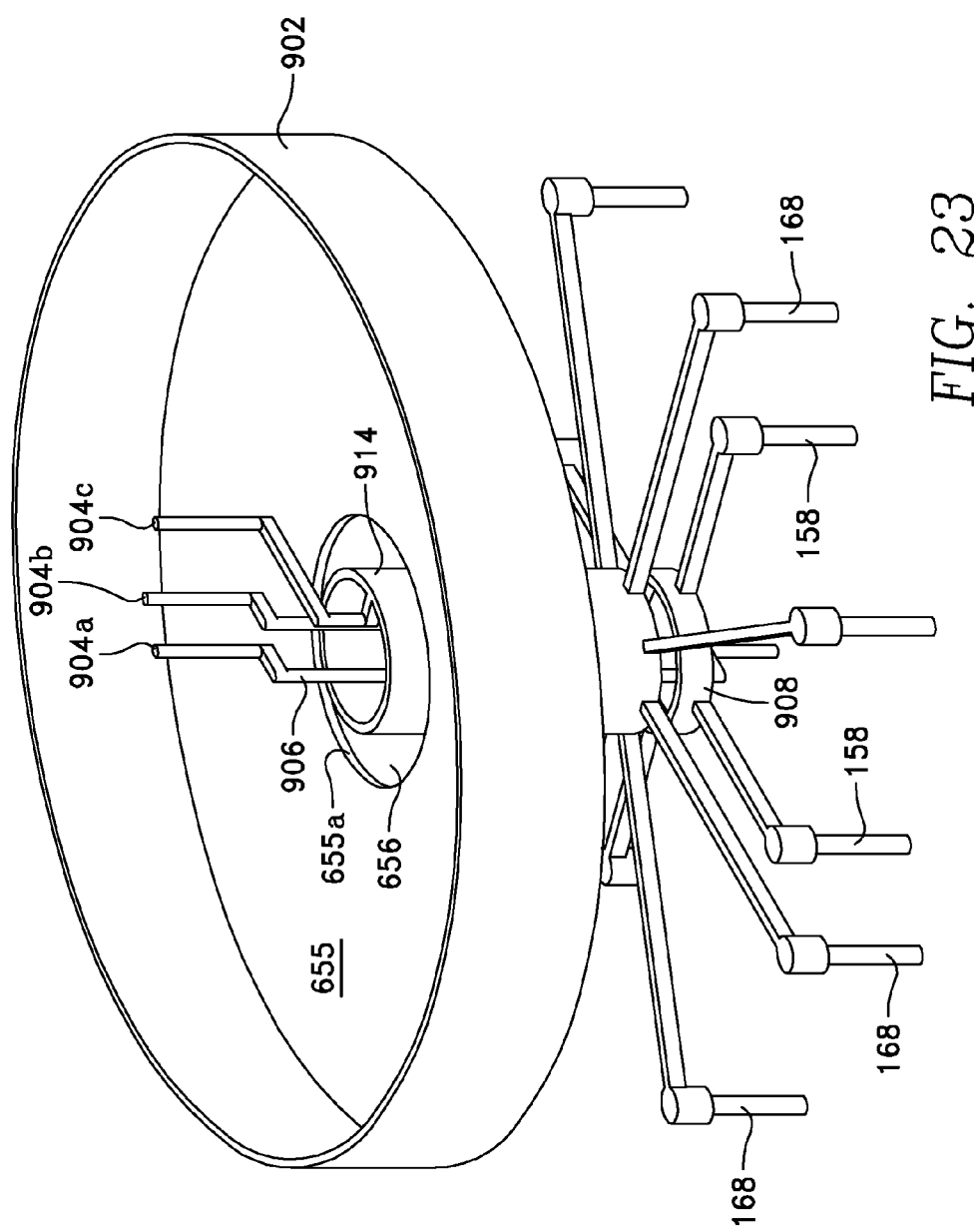
FIG. 23 depicts an assembly including an outer coil RF feed of FIG. 22.

The array of capacitors 934 of FIGS. 32-34 may also be incorporated into the embodiment of FIG. 22. In one implementation, the capacitors are connected between the outer distribution cylinder 914 of FIG. 22 and the top plate 655, for example.

Figure 35:
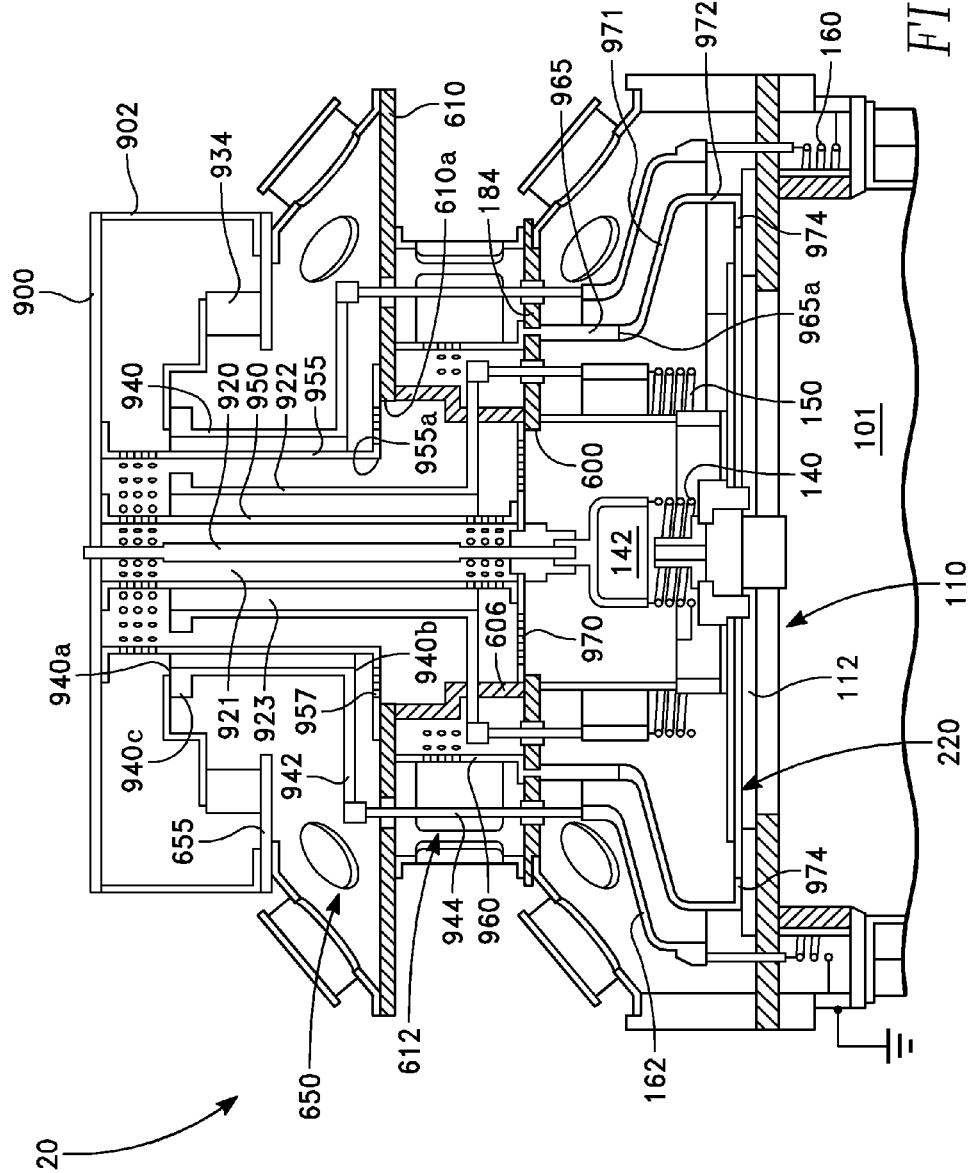
FIG. 35 is a cross-sectional elevational view of a further embodiment having coaxial shielding between the RF feeds.
Figure 36:
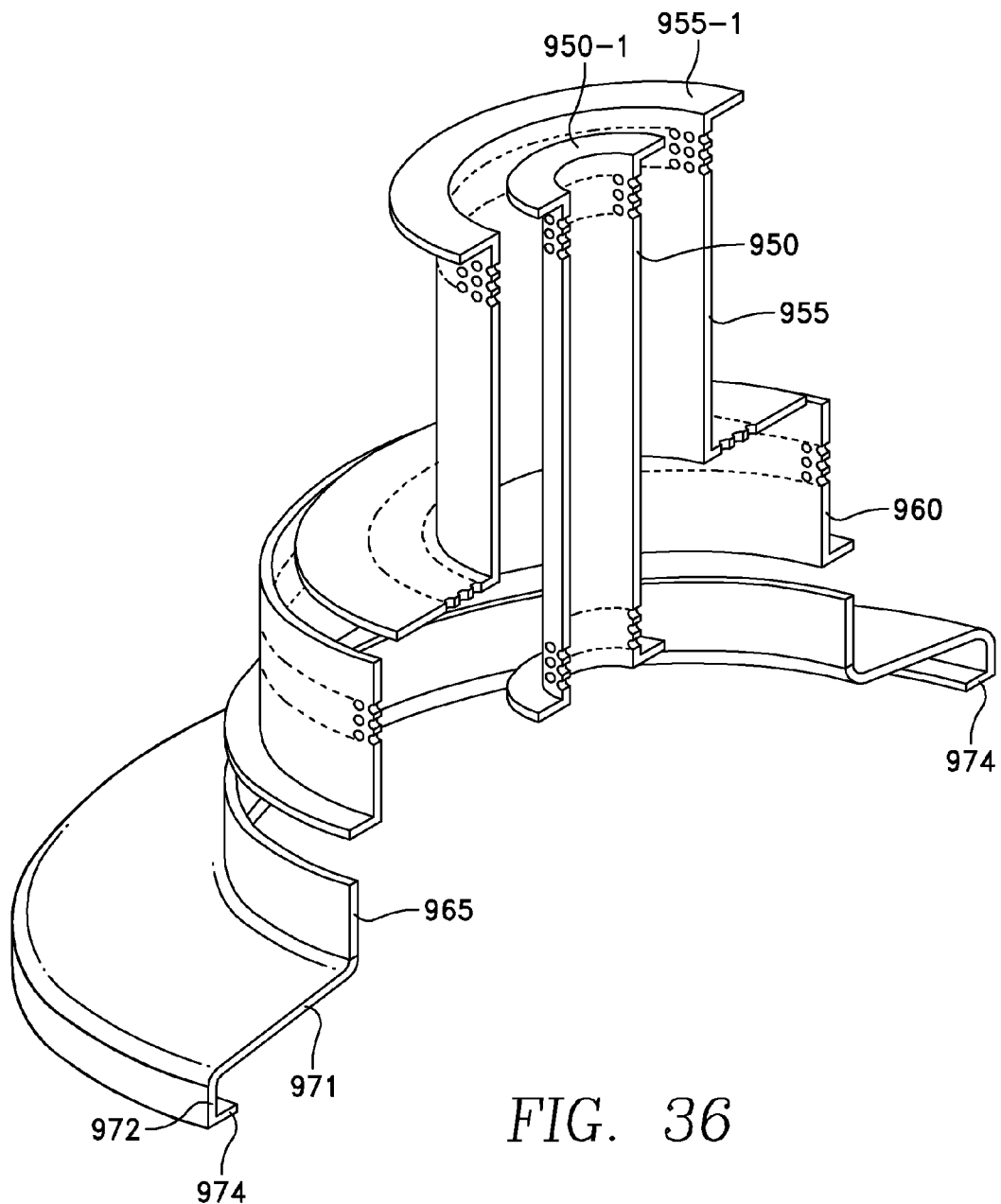
FIG. 36 is an orthographic projection of the coaxial shielding of FIG. 35.

FIGS. 35-36 depict a modification of the embodiment of FIGS. 32-34, having electromagnetic shielding between the RF feeds to the three coils 140, 150, 160. In one embodiment, this feature enhances their independent control. In FIGS. 35-36, the outer distribution cylinder 930 is replaced by a shortened outer distribution cylinder 940 that extends downwardly from its top end 940*a* by a short distance to its bottom end 940*b* and does not reach the plenum plate 610. A radial flange 940*c* extends outwardly from the top end 940*a* of the shortened outer distribution cylinder 940. A skirt 942 extends radially outwardly from the bottom end 940*b* of the shortened outer distribution cylinder 940. RF feed rods 944 extend axially through individual holes in the plenum plate 610 and through openings in the ground plate 184 without electrically contacting the plenum plate 610 or ground plate 184. The RF feed rods 944 are connected at their top ends to the periphery of the skirt 942 and are connected at their bottom ends to the top of the RF current distributor 162 for the outer coil 160.

An inner shield 950 surrounds the center RF connection rod 920 and lies within the hollow interior of the middle RF distribution tube 922. In one embodiment, the inner shield 950 is a hollow cylinder having a radially extending flange 950-1 at its top end. The inner shield 950 extends down to (and contacts) the conductive grill 970, where it is terminated. In one embodiment, the inner shield 950 electromagnetically shields the RF connection rod 920 and the middle RF distribution tube 922 from each other. In one embodiment, the inner shield 950, the RF connection rod 920 and the middle RF distribution tube 922 are coaxial. The inner shield 950 is separated from the RF connection rod 920 and from the middle RF distribution tube 922 by cylindrical gaps 921 and 923, respectively, that are sufficient to prevent electrical discharge or breakdown in the gaps 921 and 923.

An upper shield 955 is disposed between the middle RF distribution tube 922 and the shortened RF distribution cylinder 940 including a radial flange 955-1 at its top end. In one embodiment, the upper shield 955 is a hollow cylinder coaxial with the shortened RF distribution cylinder 940 and coaxial with the middle RF distribution tube 922, and surrounds the middle RF distribution tube 922. The upper shield 955 extends down to an opening 610*a* sin the plenum plate 610. A skirt 957 extends radially out from a bottom edge 955*a* of the upper shield 955 and has a sufficient radius to overlie an edge of the opening 610*a* in the plenum plate 610, so as to cover a separation gap between the plenum plate 610 and the upper shield 955.

A middle cylindrical shield 960 extends axially from the plenum plate 610 and towards the ground plate 184. In an embodiment, the middle cylindrical shield 960 is coaxial with the shields 950 and 955. A lower cylindrical shield 965 extends downwardly from the ground plate 184 to a bottom edge 965*a*. A bottom shield 971 including a hollow truncated cone-shaped section, extends downwardly from the bottom edge 965*a* of the lower cylindrical shield 965 to a cylindrical base 972. The cylindrical base 972 encircles a floor 974 of the bottom shield 971.

Advantageous effects of various ones of the embodiments of FIGS. 22-36 include symmetrical distribution of RF power to the coil antennas for enhanced plasma distribution symmetry. For example, the RF feed structure of FIG. 22 has triangular symmetry, as defined with reference to FIGS. 22 and 24A. Shielding of the coils from asymmetrical features reduces skew effects in plasma distribution. Such shielding is provided in the embodiments of FIGS. 22-36 by the ground plate 184, the plenum plate 610 and the top plate 655. Such shielding is further provided by the flanges 922*c* and 930*c* and the skirts 942 and 957, for example. The extra height afforded by the addition of the ceiling plate 900 above the top plate 655 and raising the RF power terminals to the ceiling plate 900 improves RF current distribution uniformity. It is believed that this added height increases the length of RF current travel through the RF feeds over which current distribution may equilibrate to increase uniformity. Shielding of the coil antenna feeds from one another enhances independent control of the coil antennas, for superior control of plasma density distribution.

Figure 37:
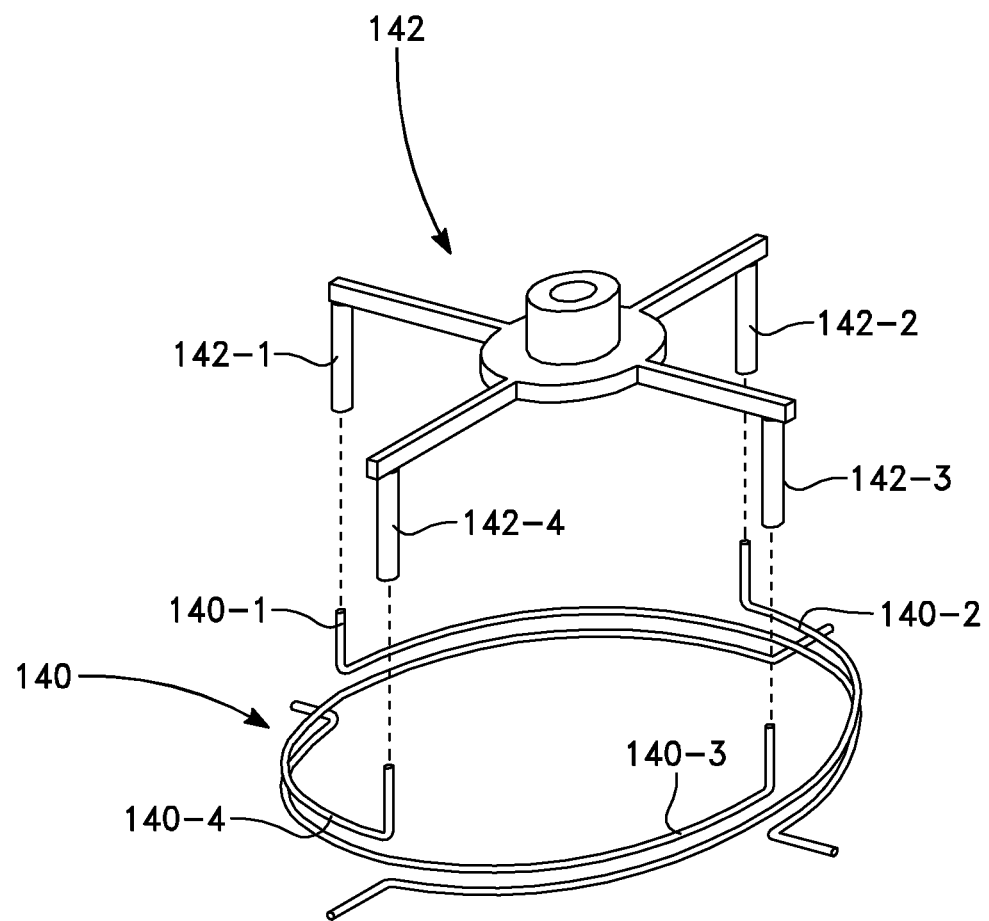
FIG. 37 depicts an embodiment of the RF current distributor having plural conductive legs contacting the inner coil antenna.

In one embodiment depicted in FIG. 37, the RF current distributor 142 of FIG. 1A, 22, 28, 32 or 35 may be formed as a spider with plural conductive legs 142-1, 142-2, 142-3 and 142-4 that extend downwardly to contact respective ones of the conductors 140-1, 140-2, 140-3 and 140-4 (shown in FIG. 2) of the inner coil antenna 140.

Figure 38:
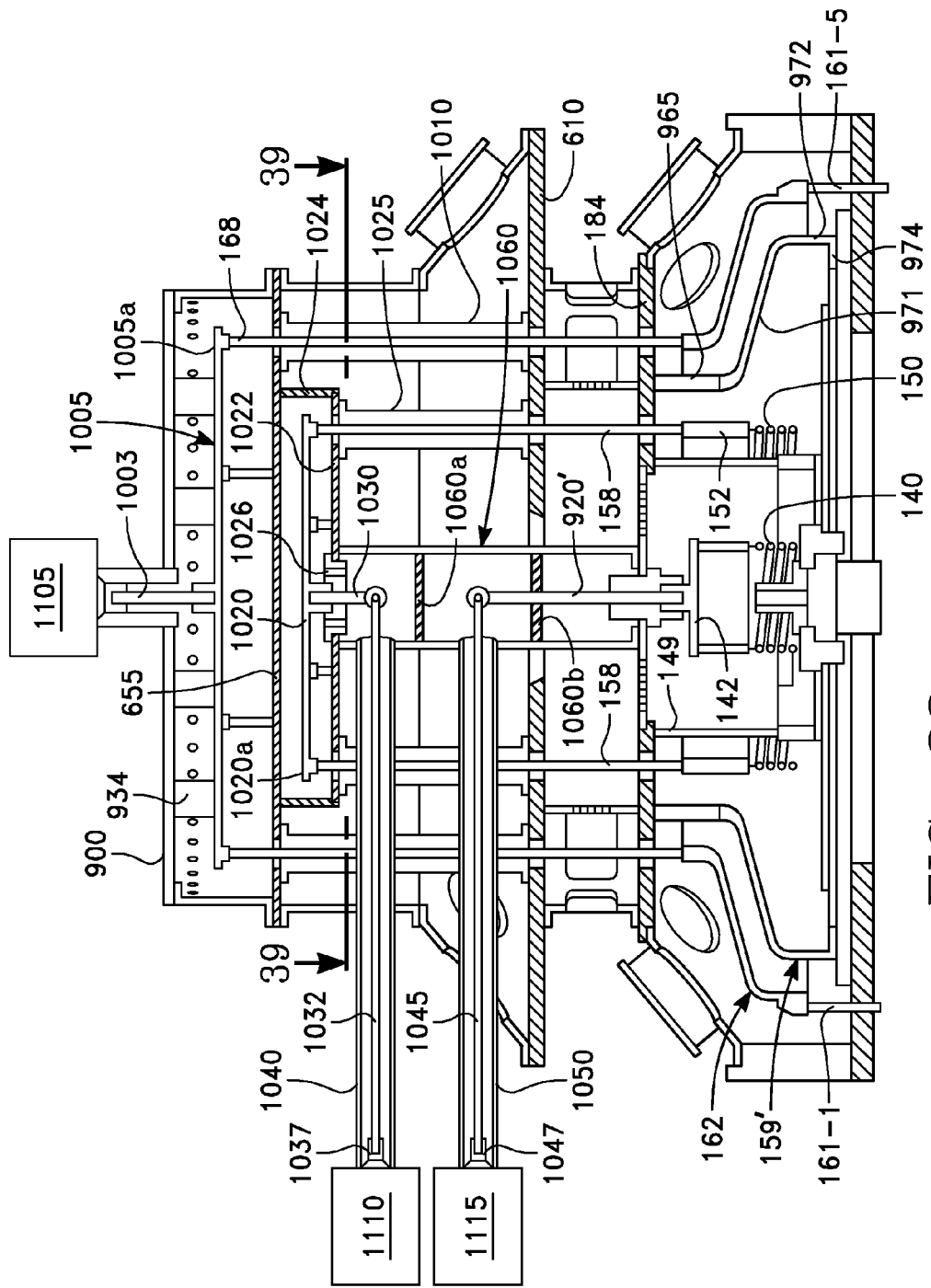
FIG. 38 is a cut-away elevational view of an embodiment having side RF feeds using radially extending conductors and one center RF feed using an axially extending conductor.
Figure 39:
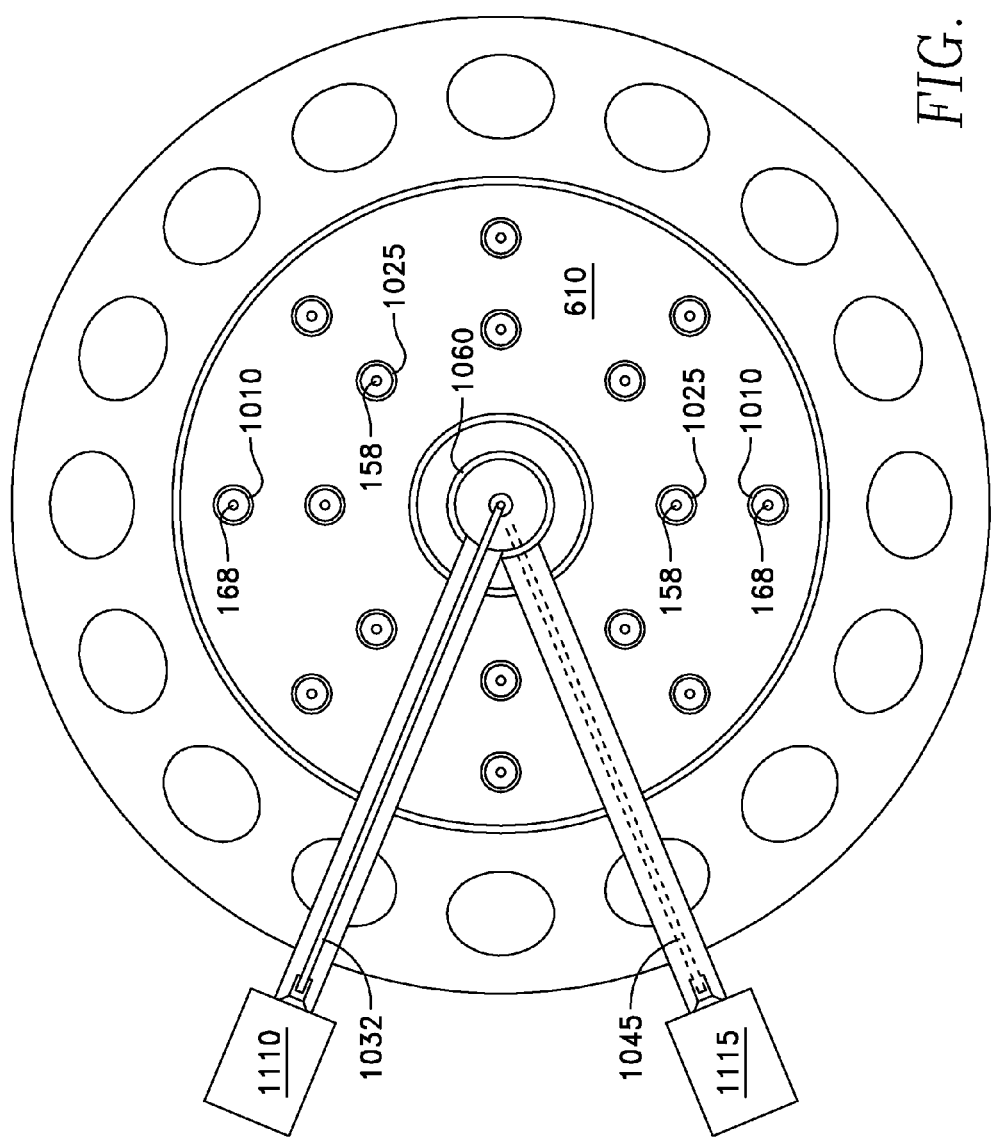
FIG. 39 is a cross-sectional view taken along lines 39-39 of FIG. 38.

FIGS. 38-39 depict a modification of the embodiment of FIG. 35, in which the outer coil antenna 160 (shown in FIG. 35) is fed RF power through a central path, while the inner coil antenna 140 and the middle coil antenna 150 are fed through different side paths.

The top of the RF current distributor 142 for the inner coil antenna 140 is connected to the bottom end of an axial conductor rod 920' that is coaxial with the center axis of the coil antenna 140. The top end of the axial conductor rod 920' is connected to one end of a radial cylindrical rod 1045. The opposite end of the radial cylindrical rod 1045 is connected to an RF power-receiving terminal 1047. A grounded hollow cylindrical shield 1050 surrounds the radial cylindrical rod 1045. In one embodiment, the hollow cylindrical shield 1050 and the radial cylindrical rod 1045 are coaxial with one another.

As described earlier with reference to FIG. 1A, the RF feed rods 158 provide RF power to the middle coil antenna 150 through the RF distributor 152. In the embodiment of FIGS. 38-39, the RF feed rods 158 are connected at their top ends to a conductive RF distribution plate 1020 at respective contact points lying within an outer zone 1020a of the conductive RF distribution plate 1020. The outer zone 1020a is an annular region having, in one embodiment, an inner diameter that is 85% of the diameter of the RF distribution plate 1020 and an outer diameter corresponding to the diameter of the RF distribution plate 1020. An axial conductor rod 1030 is connected at its top end to the center of the conductive RF distribution plate 1020. A radial conductive rod 1032 is connected between the bottom end of the axial conductor rod 1030 and an RF power-receiving terminal 1037. A hollow cylindrical shield 1040 surrounds the radial cylindrical rod 1032. In one embodiment, the hollow cylindrical shield 1040 and the radial cylindrical rod 1032 are coaxial with one another. Each one of the RF feed rods 158 is enveloped within a respective hollow cylindrical conductive shield 1025. In one embodiment, each hollow cylindrical conductive shield 1025 and the corresponding RF feed rod 158 are coaxial with one another. In one embodiment, each hollow cylindrical conductive shield 1025 is grounded by contact with the plenum plate 610. The conductive ground plate 184 and the plenum plate 610 have individual passages through which the axial RF feed rods 158 extend without contacting the conductive ground plate 184 and the plenum plate 610.

The axial conductor rods 920' and 1030 are enveloped in a hollow cylindrical conductive shield 1060. In one embodiment, the hollow cylindrical conductive shield 1060 and the axial conductor rods 920' and 1030 are coaxial. The cylindrical conductive shield 1060 is grounded by contact of its bottom edge with the conductive ground plate 184. A grounded cylindrical shield 1024 surrounds the RF distribution plate 1020, and a grounded planar shield 1022 underlies the RF distribution plate 1020. The grounded cylindrical shield 1024 and the grounded planar shield 1022, together with the top plate 655, enclose the conductive RF distribution plate 1020. The axial conductor rod 1030 extends through the grounded planar shield 1022, and an insulator 1026 isolates the axial conductor rod 1030 from the grounded planar shield 1022. A conductive shield 1060a within the hollow cylindrical conductive shield 1060 provides RF shielding between the axial conductor rods 1030 and 920' feeding the inner and middle coil antennas 140, 150 respectively. An insulating guide 1060b supports the axial conductor rod 920' and has air holes for air circulation and cooling.

As described earlier with reference to FIG. 1A, RF power is fed to the outer coil 160 through the axial RF feed rods 168 connected at their bottom ends to an RF current distributor 162 which is connected to the coil by the axial conductors 161-1 through 161-8. In the embodiment of FIG. 38, the top ends of the axial RF feed rods 168 are connected to a conductive RF distribution plate 1005 at respective contact points lying within an outer zone 1005a of the conductive RF distribution plate 1005. The outer zone 1005a is an annular region having, in one embodiment, an inner diameter that is 85% of the diameter of the RF distribution plate 1005 and an outer diameter corresponding to the diameter of the RF distribution plate 1005. Each axial feed rod 168 is enveloped in an individual hollow cylindrical conductive shield 1010 extending between the top plate 655 and the plenum plate 610. The conductive ground plate 184 and the plenum plate 610 have individual passages through which the axial RF feed rods 168 extend without contacting the conductive ground plate 184 and the plenum plate 610. In one embodiment, each hollow cylindrical conductive shield 1010 is grounded by contact with the top plate 655 and the plenum plate 610. A center RF power-receiving terminal 1003 is connected to the center of the conductive RF distribution plate 1005.

A symmetrical (circular) array of capacitors 934 may be provided, each capacitor connected between the conductive RF distribution plate 1005 and the ceiling plate 900. The capacitors 934 are chosen to provide resonance near the frequency of RF power applied to the outer coil antenna 160.

In the embodiment of FIG. 38, isolation to prevent or reduce mutual coupling among the inner, middle and outer coil antennas 140, 150 and 160 is provided by the inner ground shield 149 and a middle ground shield 159'. The middle ground shield 159' includes the following elements described above with reference to FIG. 35: the lower cylindrical shield 965, a bottom shield 971, a cylindrical base 972, and a floor 974 of the bottom shield 971. The inner ground shield 149 extends downwardly from the conductive ground plate 184 to a plane at or below the bottom of the inner coil antenna 140, so as to envelope the inner coil antenna 150. The bottom ends of the four wire conductors 140-1 through 140-4 of the inner coil antenna 140 are grounded to the inner ground shield 149. The bottom ends of the four wire conductors 150-1 through 150-4 of the middle coil antenna 150 are grounded by connection to the middle ground shield 159'. The middle ground shield 159' extends downwardly from the conductive ground plate 184 to a plane at or below the bottom of the middle coil antenna 150, so as to envelope the middle coil antenna 150.

The inner ground shield 149 provides isolation between the inner coil antenna 140 and the middle coil antenna 150. The volume occupied by the inner coil antenna 140 is enclosed by the conductive ground plate 184 and the inner ground shield 149, which prevents or reduces mutual coupling between the inner coil antenna 140 and the middle coil antenna 150. The middle ground shield 159' provides isolation between the middle coil antenna 150 and the outer coil antenna 160. The volume occupied by the middle coil antenna 150 is enclosed by the conductive ground plate 184 and the middle ground shield 159', which prevents or reduces mutual coupling between the outer coil antenna 160 and the middle coil antenna 150.

Isolation between the inner, middle and outer coil antennas 140, 150 and 160 is enhanced by the hollow cylindrical shields 1010, 1025, 1040, 1050 and 1060. Azimuthal asymmetries of the radial RF feed conductors 1032 and 1042 and their shields 1040 and 1050 are isolated from the coil antennas 140, 150 and 160 and from the processing zone below the dielectric window 112 by the plenum plate 610 and the conductive ground plate 184. As shown in FIG. 38, RF path conductors below the conductive ground plate 184 are symmetrically arranged with respect to the axis of symmetry of the chamber.

Each RF power-receiving terminal 1003, 1037 and 1047 is connected to the output of an RF power source. Generally, the RF power source includes an RF generator and an RF impedance match, the output being the RF impedance match output. For example, in FIG. 38, the RF power-receiving terminal 1003 is connected to the output of an RF impedance match 1105, the RF power-receiving terminal 1037 is connected to the output of an RF impedance match 1110, and the RF power-receiving terminal 1047 is connected to the output of an RF impedance match 1115.

Figure 40:
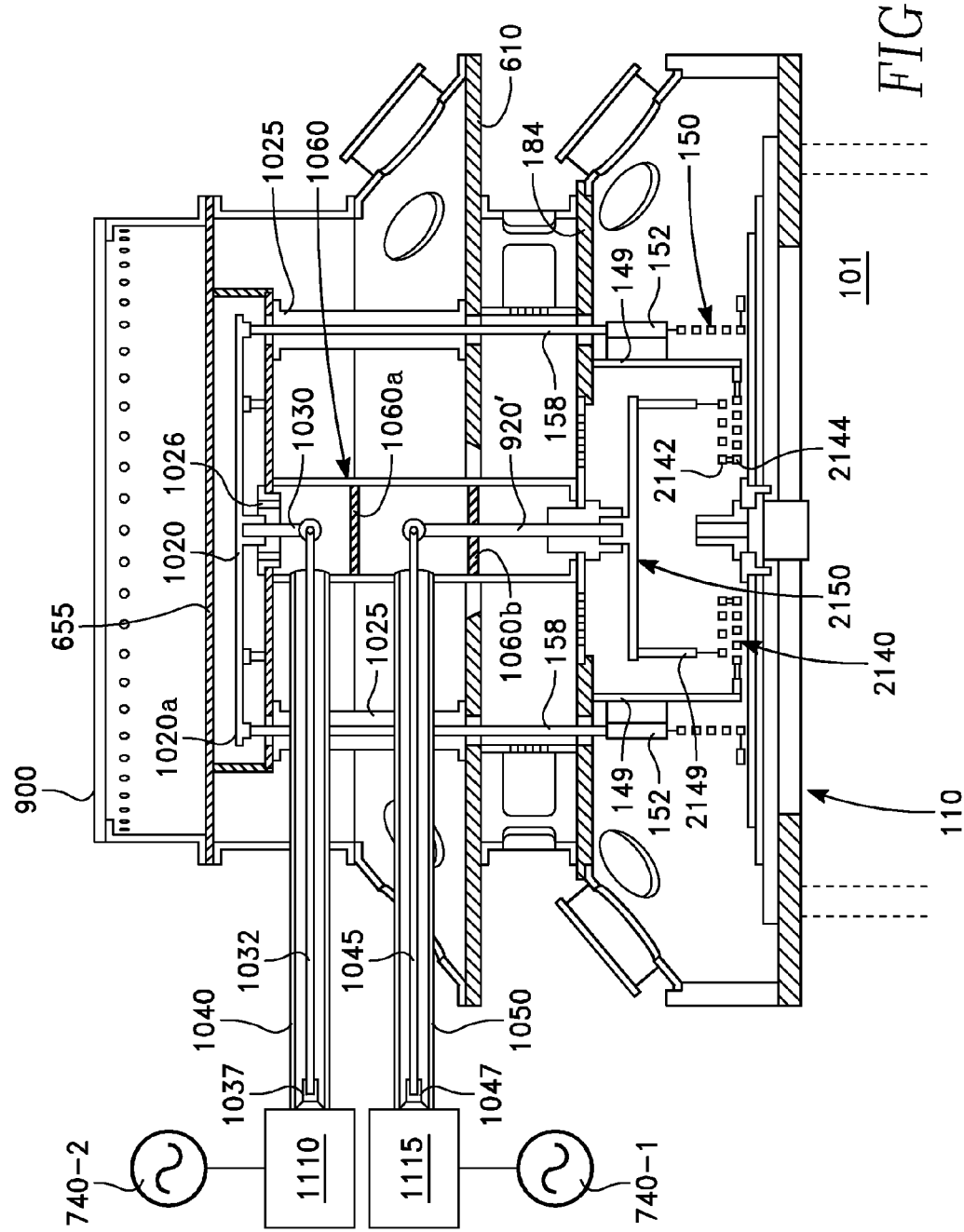
FIG. 40 illustrates a modification of the embodiment of FIG. 38, having inner and outer top coil antennas.

Plasma Source with Inner and Outer Top Antennas:

FIG. 40 illustrates a modification of the embodiment of FIG. 38, having inner and outer top coil antennas. In the embodiment of FIG. 40, the side coil antenna 160 of FIG. 38 is not present. In addition, any or all structural features dedicated to feeding RF power to the side coil antenna 160 of FIG. 38 are not present in the embodiment of FIG. 40.

The inner coil antenna 140 of FIG. 38, which is helical, is replaced in the embodiment of FIG. 40 by a spiral inner coil antenna 2140. As shown in FIG. 41, the spiral inner coil antenna 2140 has top and bottom layers 2142, 2144, respectively, of parallel spiral conductors. In the illustrated embodiment, the top and bottom layers 2142, 2144 lie in respective parallel planes.

In the illustrated embodiment of FIG. 41, the top layer 2142 consists of three parallel spiral conductors 2146-1, 2146-2, 2146-3 fed with RF power at their outer ends by respective conductive legs 2149 of an RF distributor 2150. The bottom layer 2144 of the spiral inner coil antenna 2140 consists of three parallel spiral conductors 2148-1, 2148-2, 2148-3. The inner ends of the three parallel spiral conductors 2146-1, 2146-2, 2146-3 of the top layer 2142 are connected through respective elements 2152-1, 2152-2, 2152-3 to respective inner ends of the parallel spiral conductors 2148-1, 2148-2, 2148-3 of the bottom layer 2144. A typical connection of one of the elements 2152-1 is illustrated in FIG. 42. The outer ends of the parallel spiral conductors 2148-1, 2148-2, 2148-3 of the bottom layer 2144 are connected to a grounded ring 2153 or to the shield 149.

In one embodiment, the elements 2152-1, 2152-2, 2152-3 are conductors, providing direct connection between the inner ends of the three parallel spiral conductors 2146-1, 2146-2, 2146-3 and the respective inner ends of the parallel spiral conductors 2148-1, 2148-2, 2148-3. In another embodiment, the elements 2152-1, 2152-2, 2152-3 are respective capacitors. The capacitance of each capacitor may be selected to promote resonance at the frequency of applied RF power (e.g., from the RF generator 740-1).

While the illustrated embodiment has three parallel spiral conductors in each layer, any other suitable number of spiral conductors may be employed. In the illustrated embodiment, the ends of the parallel spiral conductors 2146-1, 2146-2, 2146-3 are uniformly spaced for symmetry. Also, in the illustrated embodiment, the ends of the parallel spiral conductors 2148-1, 2148-2 and 2148-3 are uniformly spaced for symmetry. In the embodiment of FIG. 41, each individual conductor of the parallel spiral conductors 2146-1, 2146-2, 2146-3, 2148-1, 2148-2 and 2148-3 is depicted as subtending an arc distance of 270 degrees. However, they may subtend any other suitable arc distance, e.g., in a range between 45 degrees and 360 degrees, for example.

As depicted in FIG. 40, The RF distributor 2150 receives RF power through the RF impedance match 1115 from RF generator 740-1. RF generator 740-2 may be coupled to the impedance match 1110.

Figure 43:
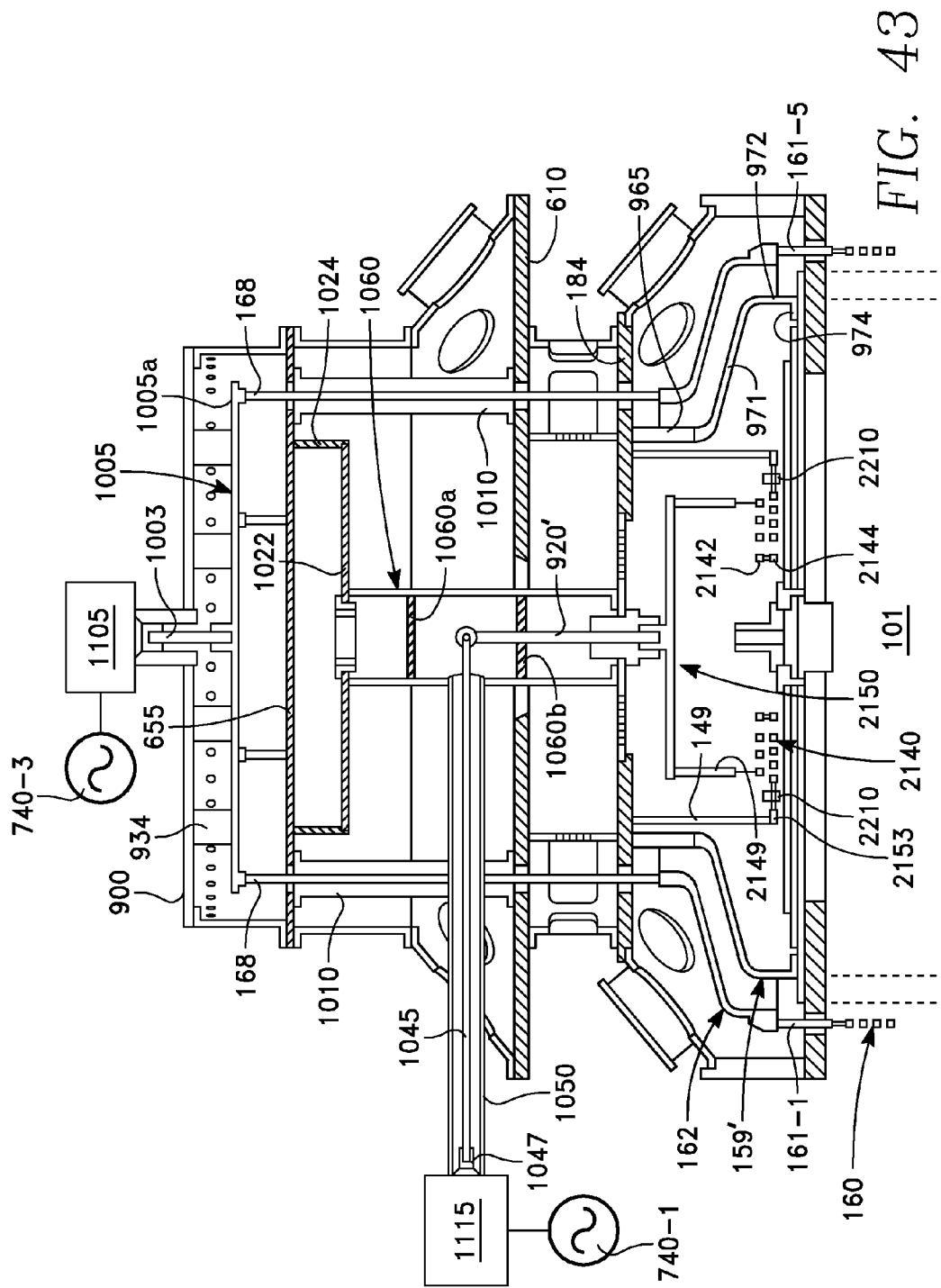
FIG. 43 illustrates a modification of the embodiment of FIG. 38, having a top coil antenna and a side coil antenna.

Plasma Source with Top and Side Antennas:

FIG. 43 illustrates a modification of the embodiment of FIG. 38, having a top coil antenna and a side coil antenna (corresponding to the side coil antenna 160 of FIG. 38). In the embodiment of FIG. 43, the middle coil antenna 150 of FIG. 38 is deleted or not present. In addition, any or all structural features dedicated to feeding RF power to the deleted coil antenna (e.g., the middle coil antenna 150 of FIG. 40) is deleted in the embodiment of FIG. 43. (Alternatively, the middle coil antenna 150 of FIG. 38 may be retained while the inner coil antenna 140 may be deleted.)

In the embodiment of FIG. 43, the inner coil antenna 140 of FIG. 38 is replaced by the spiral inner coil antenna 2140 described above with reference to FIGS. 41 and 42.

While the spiral inner coil antenna 2140 of FIG. 43 is depicted as being confined to an inner radial zone (away from the side coil antenna 160), in other embodiments the spiral inner coil antenna 2140 may extend across a wider zone, closer to the side coil antenna 160 (so as to overlie much or most of the disk-shaped dielectric window 112 of FIG. 1A).

Figure 43A:
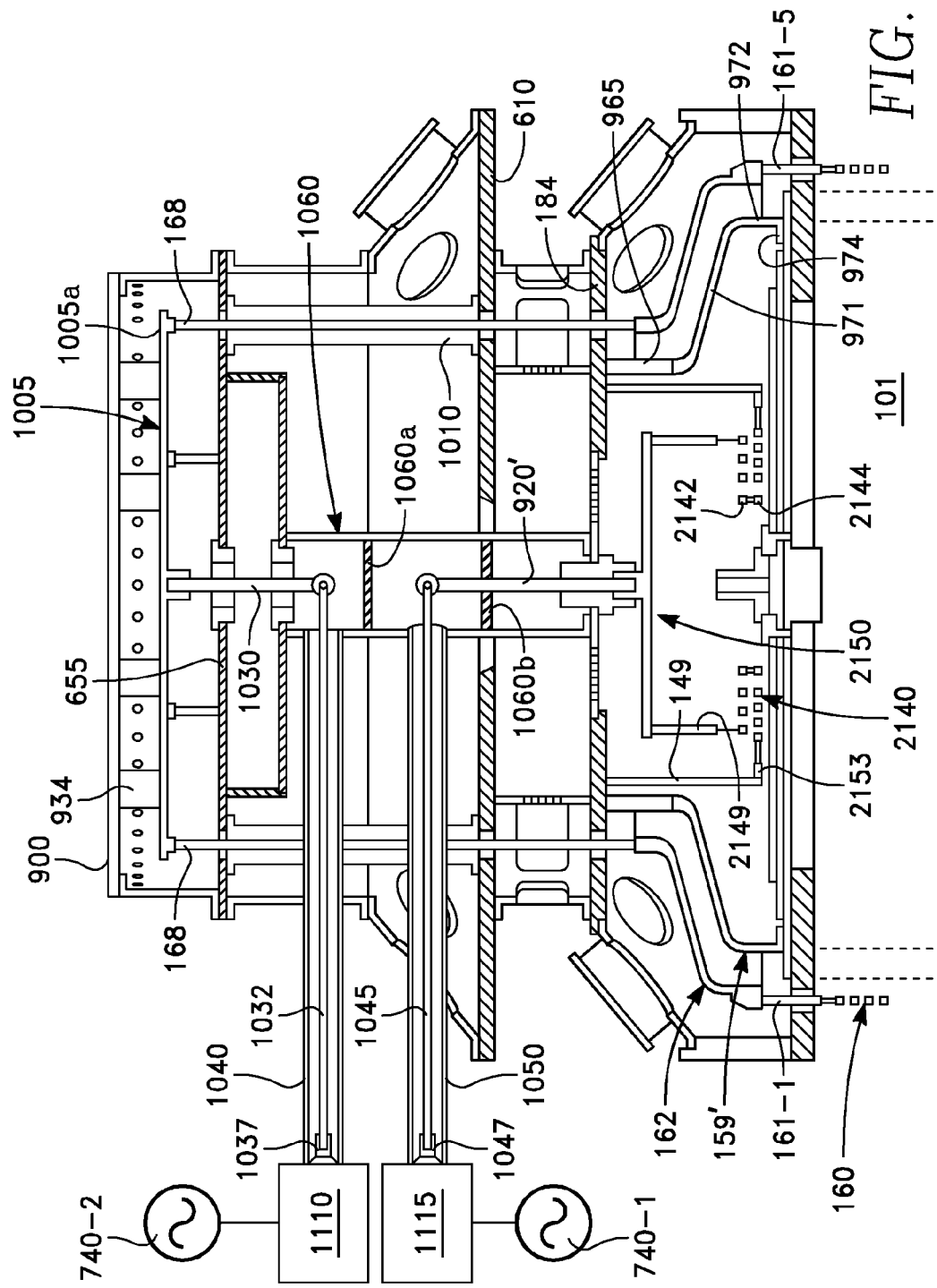
FIG. 43A depicts a modification of the embodiment of FIG. 43.

FIG. 43A depicts a modification of the embodiment of FIG. 43 in which RF power is delivered to the side coil antenna 160 through a radial conductive rod. In the illustrated embodiment of FIG. 43A, it is the radial conductive rod 1032 previously described with reference to FIG. 38 through which RF power is delivered to the side coil antenna 160. In FIG. 43A, the axial conductive rod 1030 extends up to (and connects to) the RF distribution plate 1005, which feeds the side coil antenna 160 in the manner previously described with reference to FIG. 38.

In one alternative embodiment corresponding to FIG. 40, 43 or 43A, all three coil antennas 2140, 150 and 160 are present.

Figure 45:
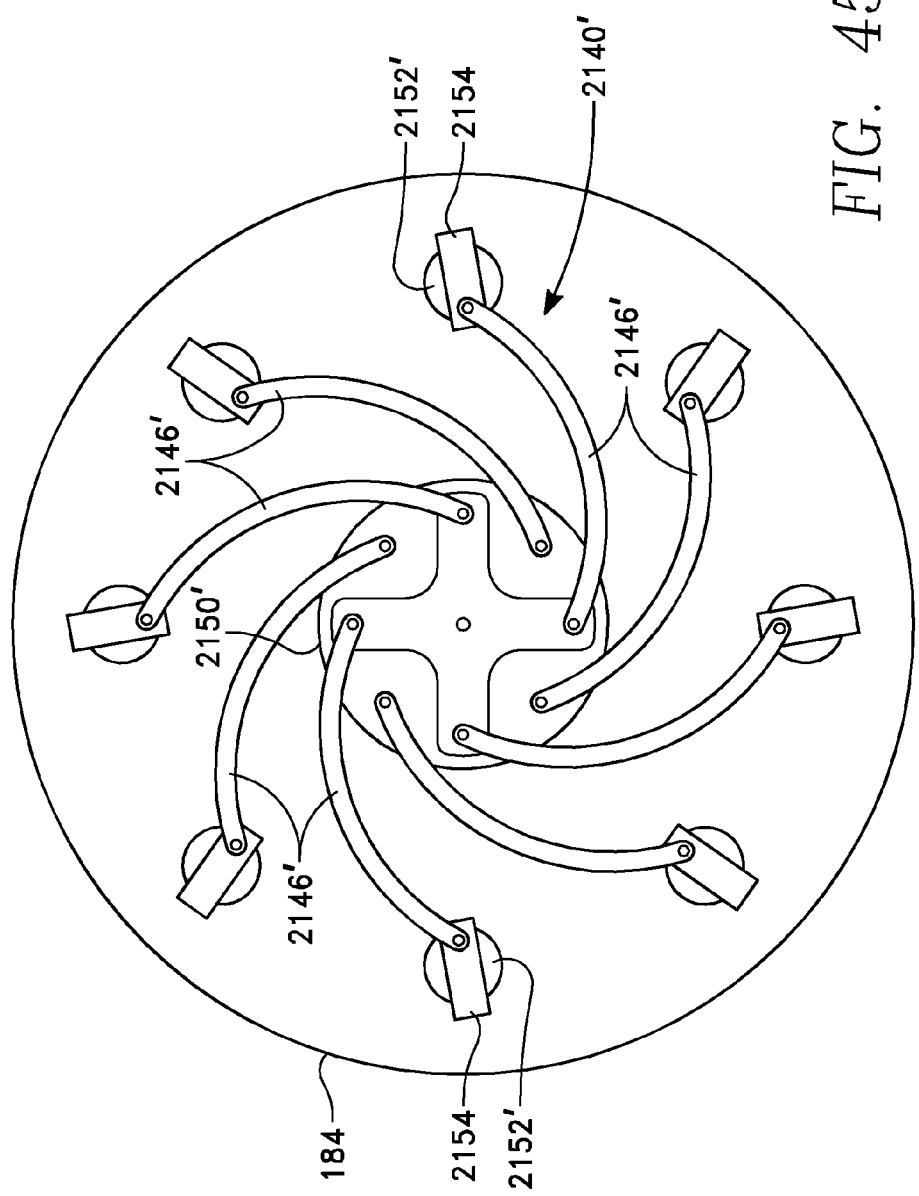
FIG. 45 is a bottom view corresponding to FIG. 44.

Plasma Source Having a Single-Layer Spiral Coil Antenna:

FIG. 44 illustrates a spiral coil antenna in accordance with a modification of the embodiment of FIG. 41, in which a single layer of parallel spiral conductors 2146' may be provided. FIG. 45 depicts a bottom view of the embodiment of FIG. 44. In the illustrated embodiment of FIGS. 44 and 45, there are eight spiral conductors 2146'. However, the number of spiral conductors 2146' may be any suitable number, from at least two to in excess of eight, for example. The spiral coil antenna of FIG. 44 may be used in place of the spiral coil antenna 2140 of FIGS. 40 and 41. In the embodiment of FIGS. 44 and 45, the spiral conductors 2146' are suspended at their outer ends from respective capacitor holding brackets 2154. The capacitor holding brackets 2154 are supported on a structural element such as, for example, the conductive ground plate 184 previously described with reference to FIG. 40. Each capacitor holding bracket 2154 holds a respective capacitor 2152' coupled (through the bracket 2154) between the outer end of the corresponding spiral conductor 2146' and the conductive ground plate 184. The inner end of each spiral conductor 2146' is suspended from the bottom end of a corresponding axial conductive leg 2149' held or fastened at its top end to a symmetrical RF power distributor 2150'. The RF power distributor 2150' is coupled to receive RF power from an RF impedance match (not shown in FIG. 44).

In one embodiment, the spiral inner coil antenna 2140' of FIGS. 44 and 45 may be confined to an inner radial zone (away from the side coil antenna 160. In other embodiments, the spiral inner coil antenna 2140' may extend across a wider zone, so as to overlie much or most of the disk-shaped dielectric window 112 of FIG. 1A, for example.

Referring again to FIG. 43, in one modification, user-controllable switches 2210 may be connected between the outer ends of the bottom layer 2144 of parallel spiral conductors and ground. By opening the switches 2210, the user can transform the inner coil 2140 from an inductively coupled RF source power applicator to a capacitively coupled source power applicator. Such a modification may be carried out in similar manner any of the foregoing embodiments.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
a window assembly;
first and second coil antennas adjacent said window assembly, said first coil antenna comprising a first layer of parallel spiral conductors, each of said parallel spiral conductors comprising first and second ends;
a first current distributor coupled to the first ends of the parallel spiral conductors of said first layer;
a conductive ground plate in a plane overlying said first current distributor; and
a first radial conductive feed rod lying in a plane above said conductive ground plate and having an inner end coupled to said first current distributor and an outer end comprising a first RF feed terminal;
wherein said first current distributor comprises:
a first conductive spider lying in a plane above said first and second coil antennas, and a plurality of axial posts connected between a peripheral annular zone of said first conductive spider and said first ends of first layer of parallel spiral conductors.

2. The plasma reactor of claim 1 wherein said first coil antenna further comprises:
a second layer of parallel spiral conductors, each of said parallel spiral conductors of said second layer comprising first and second ends, respective ones of said second ends of said first layer being coupled to the second ends of said second layer by direct connection.

3. The plasma reactor of claim 2 wherein said first ends of said second layer are coupled to an RF return potential.

4. A plasma reactor comprising:
a window assembly;
first and second coil antennas adjacent said window assembly, said first coil antenna comprising a first layer of parallel spiral conductors, each of said parallel spiral conductors comprising first and second ends;
a first current distributor coupled to the first ends of the parallel spiral conductors of said first layer;
a conductive ground plate in a plane overlying said first current distributor;
a first radial conductive feed rod lying in a plane above said conductive ground plate and having an inner end coupled to said first current distributor and an outer end comprising a first RF feed terminal;
a second current distributor coupled to said second coil antenna;
a conductive feed plate lying in a plane above said first current distributor, and a second RF feed terminal coupled to said conductive feed plate; and
a plurality of axial rods connected between a peripheral annular zone of said conductive feed plate and said second current distributor.

5. The plasma reactor of claim 4 further comprising:
a first axial center rod connected between said inner end of said first radial conductive feed rod and said first current distributor.

6. The plasma reactor of claim 5 further comprising an axial center shield surrounding said first axial center rod.

7. The plasma reactor of claim 6 further comprising a first radial cylindrical shield surrounding said first radial conductive feed rod.

8. The plasma reactor of claim 4 further comprising:
a second radial conductive feed rod lying in a plane above said conductive ground plate and having an inner end coupled to said conductive feed plate and an outer end coupled to said second RF feed terminal.

9. The plasma reactor of claim 8 further comprising:
a first axial center rod connected between said inner end of said first radial conductive feed rod and said first current distributor; and
a second axial center rod connected between said inner end of said second radial conductive feed rod and said conductive feed plate.

10. The plasma reactor of claim 9 further comprising an axial center shield surrounding said first and second axial center rods.

11. The plasma reactor of claim 10 further comprising a first radial cylindrical shield surrounding said first radial conductive feed rod and a second radial cylindrical shield surrounding said second radial conductive feed rod.

12. The plasma reactor of claim 4 further comprising a first plurality of axial cylindrical shields surrounding respective ones of said plurality of axial rods.

13. The plasma reactor of claim 12 wherein said first plurality of axial cylindrical shields are grounded to said conductive ground plate.

14. The plasma reactor of claim 13 further comprising an inner coil shield surrounding said second coil antenna and lying between said first and second coil antennas.

15. The plasma reactor of claim 14 wherein said inner coil shield is grounded and wherein said first and second coil antennas comprise ground return ends connected to said inner coil shield.

* * * * *